(12) United States Patent
Uchida et al.

(10) Patent No.: US 12,211,875 B2
(45) Date of Patent: Jan. 28, 2025

(54) IMAGING ELEMENT HAVING P-TYPE AND N-TYPE SOLID PHASE DIFFUSION LAYERS FORMED IN A SIDE WALL OF AN INTERPIXEL LIGHT SHIELDING WALL

(71) Applicant: SONY SEMICONDUCTOR SOLUTIONS CORPORATION, Kanagawa (JP)

(72) Inventors: Tetsuya Uchida, Kanagawa (JP); Tomoyuki Hirano, Kanagawa (JP); Ryoji Suzuki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/962,262

(22) Filed: Oct. 7, 2022

(65) Prior Publication Data

US 2023/0033933 A1   Feb. 2, 2023

Related U.S. Application Data

(62) Division of application No. 16/956,163, filed as application No. PCT/JP2019/003554 on Feb. 1, 2019, now abandoned.

(30) Foreign Application Priority Data

Feb. 16, 2018   (JP) .................. 2018-025661

(51) Int. Cl.
*H01L 27/146*    (2006.01)
(52) U.S. Cl.
CPC .... *H01L 27/1463* (2013.01); *H01L 27/14621* (2013.01); *H01L 27/14623* (2013.01)
(58) Field of Classification Search
CPC ......... H01L 27/14603; H01L 27/14614; H01L 27/14621; H01L 27/14623; H01L 27/1463;

(Continued)

(56) References Cited

U.S. PATENT DOCUMENTS

2013/0070131 A1   3/2013   Ohkubo et al.
2014/0131779 A1   5/2014   Takeda et al.
(Continued)

FOREIGN PATENT DOCUMENTS

CN    102446935 A    5/2012
CN    103000644 A    3/2013
(Continued)

OTHER PUBLICATIONS

International Search Report and Written Opinion for International (PCT) Patent Application No. PCT/JP2019/003554, dated Apr. 16, 2019, 8 pages.
(Continued)

*Primary Examiner* — Nelson Garces
(74) *Attorney, Agent, or Firm* — Sheridan Ross PC

(57) ABSTRACT

The present technology relates to an imaging element that can increase the degree of freedom of element arrangement. A photoelectric conversion unit, a through trench penetrating a semiconductor substrate in a depth direction and formed between pixels each including the photoelectric conversion unit, and a PN junction region in a side wall of the trench are included, and the through trench has an opening portion, and a P-type region is formed in the opening portion. A photoelectric conversion unit, a holding unit, a through trench formed between the photoelectric conversion unit and the holding unit, and a PN junction region in a side wall of the through trench are included, and the through trench has an opening portion and a readout gate for reading the charge from the photoelectric conversion unit is formed in the opening portion. The present technology can be applied to, for example, an imaging element.

20 Claims, 42 Drawing Sheets

(58) Field of Classification Search
CPC ........... H01L 27/1464; H01L 27/14641; H01L 27/14643; H01L 21/761; H01L 21/76224; H04N 25/70
See application file for complete search history.

(56) References Cited

U.S. PATENT DOCUMENTS

| | | |
|---|---|---|
| 2014/0327051 A1 | 11/2014 | Ahn et al. |
| 2015/0091122 A1 | 4/2015 | Okazaki et al. |
| 2015/0187826 A1 | 7/2015 | Suzuki et al. |
| 2015/0228684 A1 | 8/2015 | Yamashita |
| 2015/0243700 A1 | 8/2015 | Morooka |
| 2016/0043130 A1 | 2/2016 | Ohguro |
| 2016/0056198 A1 | 2/2016 | Lee et al. |
| 2016/0056199 A1 | 2/2016 | Kim et al. |
| 2018/0102392 A1* | 4/2018 | Hwang ............... H01L 27/1461 |
| 2018/0182806 A1 | 6/2018 | Jin et al. |
| 2021/0082974 A1 | 3/2021 | Uchida et al. |

FOREIGN PATENT DOCUMENTS

| | | |
|---|---|---|
| CN | 103117289 A | 5/2013 |
| CN | 104303305 A | 1/2015 |
| CN | 104425535 A | 3/2015 |
| JP | 2013-065688 | 4/2013 |
| JP | 2013-243324 | 12/2013 |
| JP | 2014-096490 | 5/2014 |
| JP | 2015-153772 | 8/2015 |
| JP | 2015-162603 | 9/2015 |
| JP | 2016-039315 | 3/2016 |
| JP | 2016-162917 | 9/2016 |
| KR | 20120036263 A | 4/2012 |
| KR | 20160056858 A | 5/2016 |
| WO | WO 2014/021115 | 2/2014 |

OTHER PUBLICATIONS

Official Action for U.S. Appl. No. 16/956,163, dated Dec. 29, 2021, 7 pages.

Official Action for U.S. Appl. No. 16/956,163, dated Mar. 23, 2022, 10 pages.

Official Action for U.S. Appl. No. 16/956,163, dated Jul. 8, 2022, 11 pages.

* cited by examiner

IMAGING ELEMENT HAVING P-TYPE AND N-TYPE SOLID PHASE DIFFUSION LAYERS FORMED IN A SIDE WALL OF AN INTERPIXEL LIGHT SHIELDING WALL

CROSS REFERENCE TO RELATED APPLICATIONS

This application is a divisional of U.S. patent application Ser. No. 16/956,163 filed 19 Jun. 2020, which is a national stage application under 35 U.S.C. 371 and claims the benefit of PCT Application No. PCT/JP2019/003554 having an international filing date of 1 Feb. 2019, which designated the United States, which PCT application claimed the benefit of Japanese Patent Application No. 2018-025661 filed 16 Feb. 2018, the entire disclosures of each of which are incorporated herein by reference.

TECHNICAL FIELD

The present technology relates to an imaging element, and in particular, relates to an imaging element having a P-type solid phase diffusion layer and an N-type solid phase diffusion layer formed in a side wall of an inter pixel light shielding wall formed between pixels to form a strong electric field region and hold charges in the strong electric field region, thereby improving a saturation charge amount Qs of each pixel, and reduces the number of contacts, thereby increasing the degree of freedom of arrangement of the element.

BACKGROUND ART

Conventionally, a technology of forming a P-type diffusion layer and an N-type diffusion layer in a side wall of a trench formed between pixels to form a strong electric field region and holding charges in the strong electric field region with a view to improve the saturation charge amount Qs of each pixel of a solid-state imaging device is known (for example, see Patent Document 1).

CITATION LIST

Patent Document

Patent Document 1: Japanese Patent Application Laid-Open No. 2015-162603

SUMMARY OF THE INVENTION

Problems to be Solved by the Invention

However, in the structure disclosed in Patent Document 1, there is a possibility that the pinning of a silicon (Si) substrate on a light incident side is weakened, a generated charge flows into a photodiode and a Dark characteristic deteriorates, and for example, a white point occurs and a dark current is generated.

Furthermore, when pixels are completely isolated by a trench, a well contact for supplying a ground potential to the pixels needs to be formed. Furthermore, when the trench is formed between the pixels, an element such as a pixel transistor cannot be placed between the pixels, and there is a restriction on arrangement of the element.

The present technology has been made in view of such a situation and enables suppression of deterioration of the Dark characteristics and an increase in the degree of freedom of arrangement of an element.

Solutions to Problems

A first imaging element according to one aspect of the present technology includes a photoelectric conversion unit configured to perform photoelectric conversion, a through trench penetrating a semiconductor substrate in a depth direction and formed between pixels each including the photoelectric conversion unit, and a PN junction region configured by a P-type region and an N-type region in a side wall of the through trench, in which the through trench partially has an opening portion, and the P-type region is formed in the opening portion.

A second imaging element according to one aspect of the present technology includes a photoelectric conversion unit configured to perform photoelectric conversion, a holding unit configured to hold a charge transferred from the photoelectric conversion unit, a through trench penetrating a conductor substrate in a depth direction and formed between the photoelectric conversion unit and the holding unit, and a PN junction region configured by a P-type region and an N-type region in a side wall of the through trench, in which the through trench partially has an opening portion, and a readout gate for reading the charge from the photoelectric conversion unit is formed in the opening portion.

In the first imaging element according to one aspect of the present technology, the photoelectric conversion unit configured to perform photoelectric conversion, the through trench penetrating a semiconductor substrate in a depth direction and formed between pixels each including the photoelectric conversion unit, and the PN junction region configured by a P-type region and an N-type region in a side wall of the through trench are provided The through trench partially has the opening portion, and the P-type region is formed in the opening portion.

In the second imaging element according to one aspect of the present technology, the photoelectric conversion unit configured to perform photoelectric conversion, the holding unit configured to hold a charge transferred from the photoelectric conversion unit, the through trench penetrating a conductor substrate in a depth direction and formed between the photoelectric conversion unit and the holding unit, and the PN junction region configured by a P-type region and an N-type region in a side wall of the through trench are included. The through trench partially has the opening portion, and the readout gate for reading the charge from the photoelectric conversion unit is formed in the opening portion.

Effects of the Invention

According to one aspect of the present technology, deterioration of the Dark characteristics can be suppressed and the degree of freedom of arrangement of an element can be increased.

Note that effects described here are not necessarily limited, and any of effects described in the present disclosure may be exhibited.

MODE FOR CARRYING OUT THE INVENTION

Hereinafter, modes for implementing the present technology (hereinafter referred to as embodiments) will be described.

Since the present technology can be applied to an imaging device, a case where the present technology is applied to an imaging device will be described here as an example. Note that, here, description will be given by taking an imaging device as an example but the present technology is not limited to application to an imaging device and can be applied to various electronic devices using an imaging device as an image capturing unit (photoelectric conversion unit), such as an imaging device like as a digital still camera or a video camera, a portable terminal device having an imaging function like a mobile phone, a copying machine using an imaging device as an image reading unit, or the like. Note that a module-type configuration mounted on an electronic device, that is, a camera module may be adopted as an imaging device.

Figure 1:
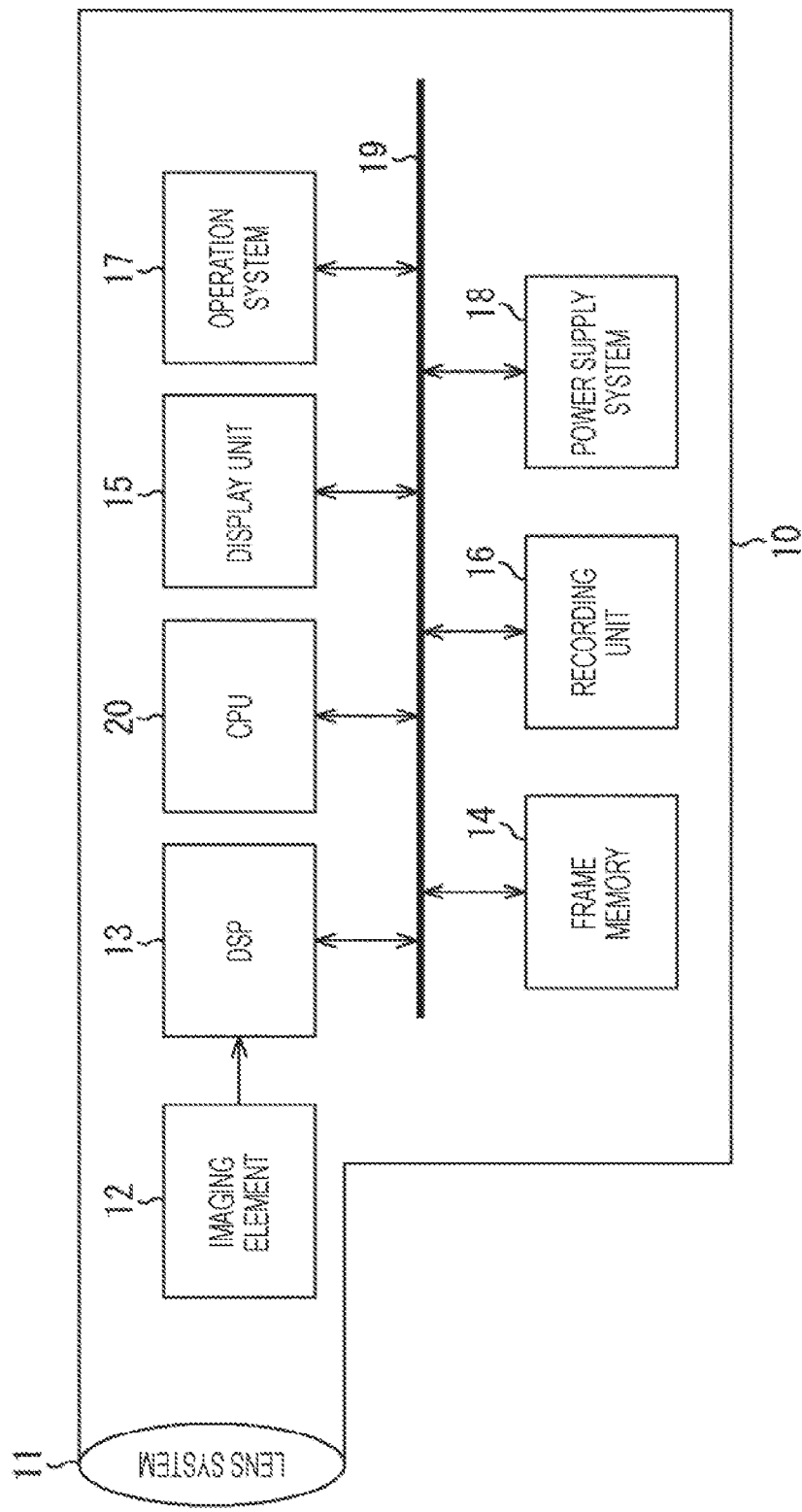
FIG. 1 is a diagram illustrating a configuration example of an imaging device.

FIG. 1 is a block diagram illustrating a configuration example of an imaging device that is an example of an electronic device according to the present disclosure. As illustrated in FIG. 1, an imaging device 10 includes an optical system including a lens group 11 or the like, an imaging element 12, a DSP circuit 13 that is a camera signal processing unit, a frame memory 14, a display unit 15, a recording unit 16, an operation system 17, a power supply system 18, and the like.

Then, the DSP circuit 13, the frame memory 14, the display unit 15, the recording unit 16, the operation system 17, and the power supply system 18 are mutually connected via a bus line 19. A CPU 20 controls each unit in the imaging device 10.

The lens group 11 takes in incident light (image light) from an object and forms an image on an imaging surface of the imaging element 12. The imaging element 12 converts a light amount of the incident light formed on the imaging surface by the lens group 11 into an electrical signal in pixel units and outputs the electrical signal as a pixel signal. As the imaging element 12, an imaging element (image sensor) including pixels described below can be used.

The display unit 15 includes a panel-type display unit such as a liquid crystal display unit or an organic electro luminescence (EL) display unit, and displays a moving image or a still image imaged by the imaging element 12. The recording unit 16 records a moving image or a still image imaged by the imaging element 12 on a recording medium such as a video tape or a digital versatile disk (DVD).

The operation system 17 issues operation commands for various functions possessed by the present imaging device under an operation by a user. The power supply system 18 appropriately supplies various power sources that serve as operating power sources of the DSP circuit 13, the frame memory 14, the display unit 15, the recording unit 16, and the operation system 17 to these supply targets.

<Configuration of Imaging Element>

Figure 2:
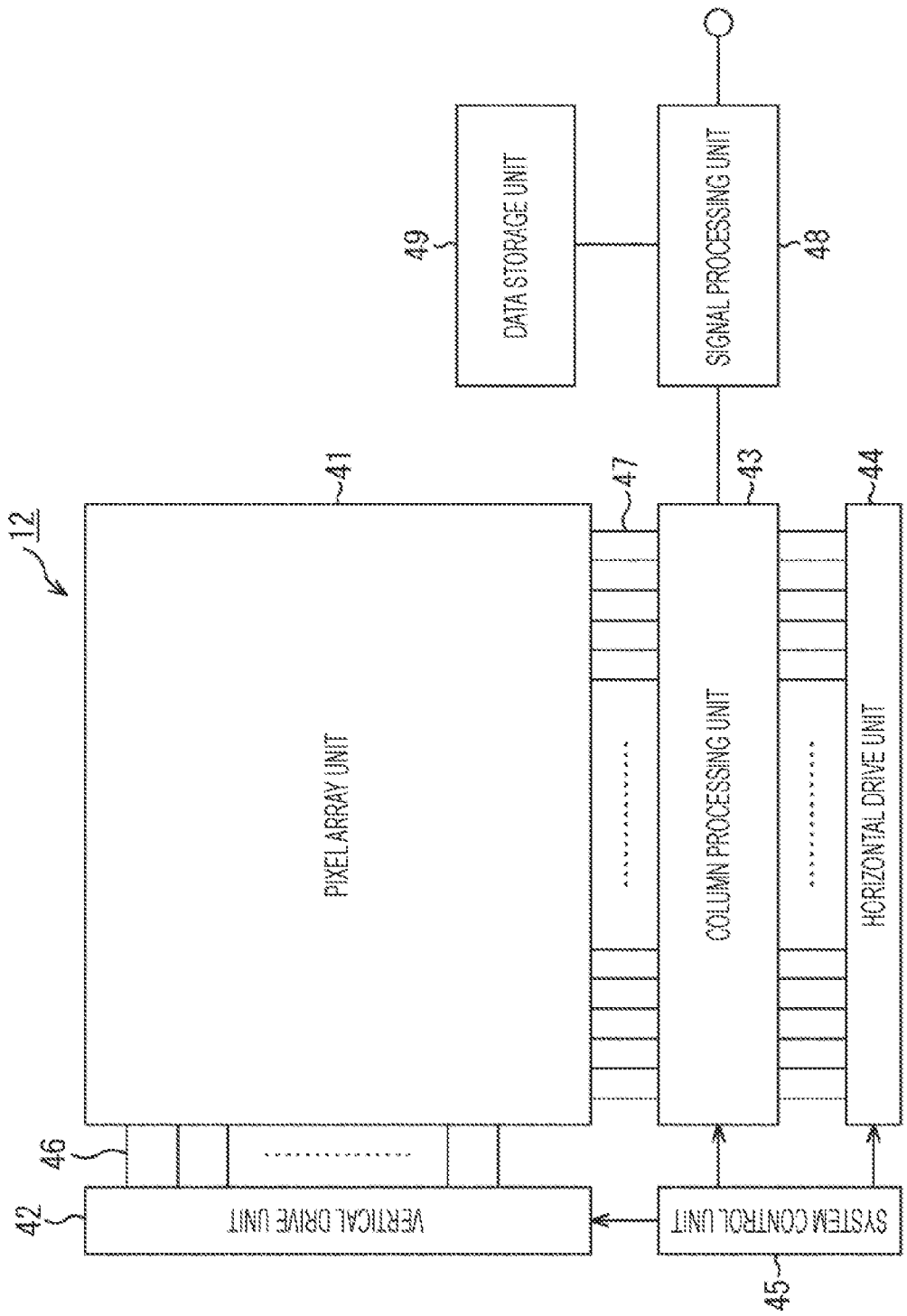
FIG. 2 is a diagram illustrating a configuration example of an imaging element.

FIG. 2 is a block diagram illustrating a configuration example of the imaging element 12. The imaging element 12 can be a complementary metal oxide semiconductor (CMOS) image sensor.

The imaging element 12 includes a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) (not illustrated).

In the pixel array unit 41, unit pixels (for example, the pixels 50 in FIG. 3) each including a photoelectric conversion element that generates a photocharge having a charge amount corresponding to an incident light amount and accumulates the generated photocharge therein are two-dimensionally arranged in a matrix manner. Note that, hereinafter, the photocharge having the charge amount corresponding to the light incident amount may be simply described as "charge", and the unit pixel may be simply described as "pixel".

In the pixel array unit 41, a pixel drive line 46 is further formed for each row in a right-left direction in FIG. 2 (a pixel array direction of a pixel row) and a vertical signal line 47 is formed for each column in an up-down direction in FIG. 2 (a pixel array direction of a pixel column) with respect to the pixel array in the matrix manner. One end of the pixel drive line 46 is connected to an output end corresponding to each row of the vertical drive unit 42.

The imaging element 12 further includes a signal processing unit 48 and a data storage unit 49. Processing by the signal processing unit 48 and the data storage unit 49 may be processing by an external signal processing unit, for example, a digital signal processor (DSP) provided on a separate substrate from the imaging element 12 or by software, or the signal processing unit 48 and the data storage unit 49 may be mounted on the same substrate as the imaging element 12.

The vertical drive unit 42 is a pixel drive unit configured by a shift register, an address decoder, and the like, and drives all of pixels of the pixel array unit 41 at the same time or drives the pixels on a row basis or the like. Although illustration of a specific configuration is omitted, the vertical drive unit 42 has a configuration including a readout scanning system and a sweepout scanning system, or batch sweeping and batch transfer.

The readout scanning system sequentially selects and scans the unit pixels of the pixel array unit 41 on a row basis in order to read signals from the unit pixels. In the case of row drive (rolling shutter operation), as for sweeping, sweepout scanning is performed for a readout row for which readout scanning will be performed by the readout scanning system ahead of the readout scanning by the time of a shutter speed. Furthermore, in the case of global exposure (global shutter operation), the batch sweeping is performed ahead of the batch transfer by the time of a shutter speed.

By the sweeping, unnecessary charges are swept out (reset) from the photoelectric conversion elements of the unit pixels of the readout row. Then, a so-called electronic shutter operation is performed by the sweeping out (resetting) of the unnecessary charges. Here, the electronic shutter operation refers to an operation of discarding photocharges of the photoelectric conversion element and starting new exposure (starting accumulation of photocharges).

The signal read by the readout operation by the readout scanning system corresponds to the amount of light incident on or after an immediately preceding readout operation or the electronic shutter operation. In the case of row drive, a period from readout timing by the immediately preceding readout operation or from sweepout timing by the electronic shutter operation to readout timing by the current readout operation is an accumulation period (exposure period) of the photocharges in the unit pixel. In the case of global exposure, a period from the batch sweeping to the batch transfer is an accumulation period (exposure period).

The pixel signal output from each unit pixel in the pixel row selectively scanned by the vertical drive unit 42 is supplied to the column processing unit 43 through each of the vertical signal lines 47. The column processing unit 43 performs, for each pixel column of the pixel array unit 41, predetermined signal processing for the pixel signal output from each unit pixel in the selected row through the vertical signal line 47, and temporarily stores the pixel signal after the signal processing.

Specifically, the column processing unit 43 performs at least noise removal processing, for example, correlated double sampling (CDS) processing as the signal processing. The correlated double sampling by the column processing unit 43 removes fixed pattern noises peculiar to pixels such as reset noise and variation in threshold value of an amplification transistor. Note that the column processing unit 43 can have an analog-digital (AD) conversion function, for example, in addition to the noise removal processing, and can output a signal level as a digital signal.

The horizontal drive unit 44 is configured by a shift register, an address decoder, and the like, and sequentially selects a unit circuit corresponding to the pixel column of the column processing unit 43. By the selective scanning by the horizontal drive unit 44, pixel signals processed by the column processing unit 43 are sequentially output to the signal processing unit 48.

The system control unit 45 is configured by a timing generator that generates various timing signals, and the like, and drives and controls the vertical drive unit 42, the column processing unit 43, the horizontal drive unit 44, and the like, on the basis of the various timing signals generated by the timing generator.

The signal processing unit 48 has at least an addition processing function and performs various types of signal processing such as addition processing for the pixel signal output from the column processing unit 43. The data storage unit 49 temporarily stores data necessary for the signal processing in the signal processing unit 48.

<Structure of Unit Pixel>

Next, a specific structure of the unit pixels 50 arranged in a matrix manner in the pixel array unit 41 will be described. According to the pixel 50 to be described below, the possibility that the pinning of a silicon (Si) substrate (an Si substrate 70 in FIG. 3) on the light incident side is weakened, a generated charge flows into a photodiode (a PD 71 in FIG. 3) and a Dark characteristic deteriorates, and for example, a white point occurs and a dark current is generated can be reduced. Furthermore, the number of well contacts can be reduced, and the area in which elements such as transistors are arranged can be made large by the area of the reduced well contacts. In this respect, deterioration of the Dark characteristic and the like can be prevented.

Configuration Example of Pixel in First Embodiment

Figure 3:
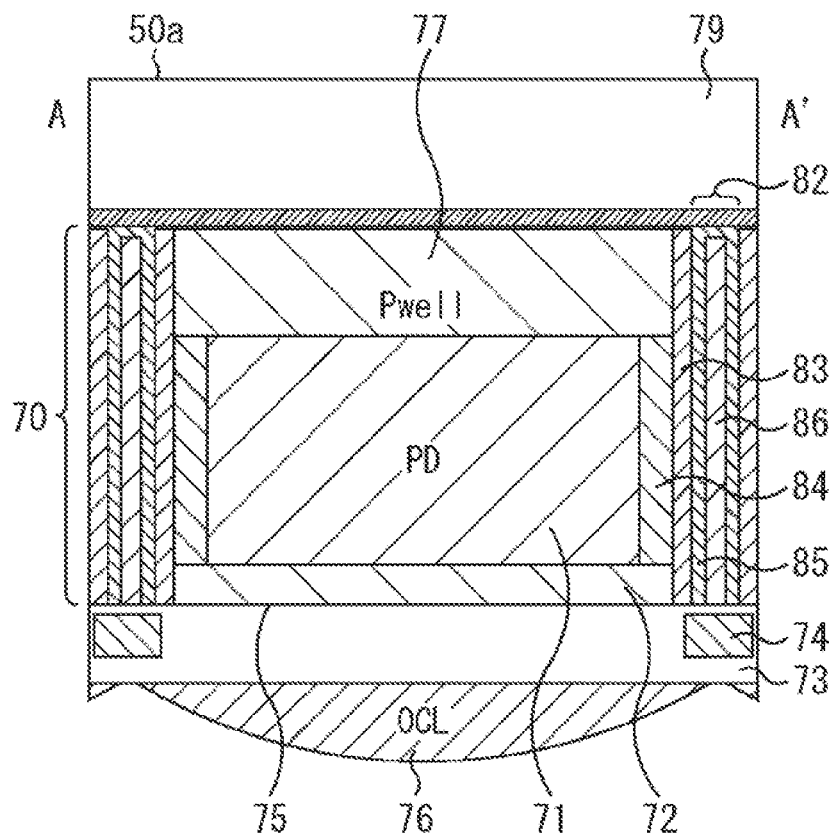
FIG. 3 is a vertical cross-sectional view of a first embodiment of a pixel to which the present technology is applied.
Figure 4:
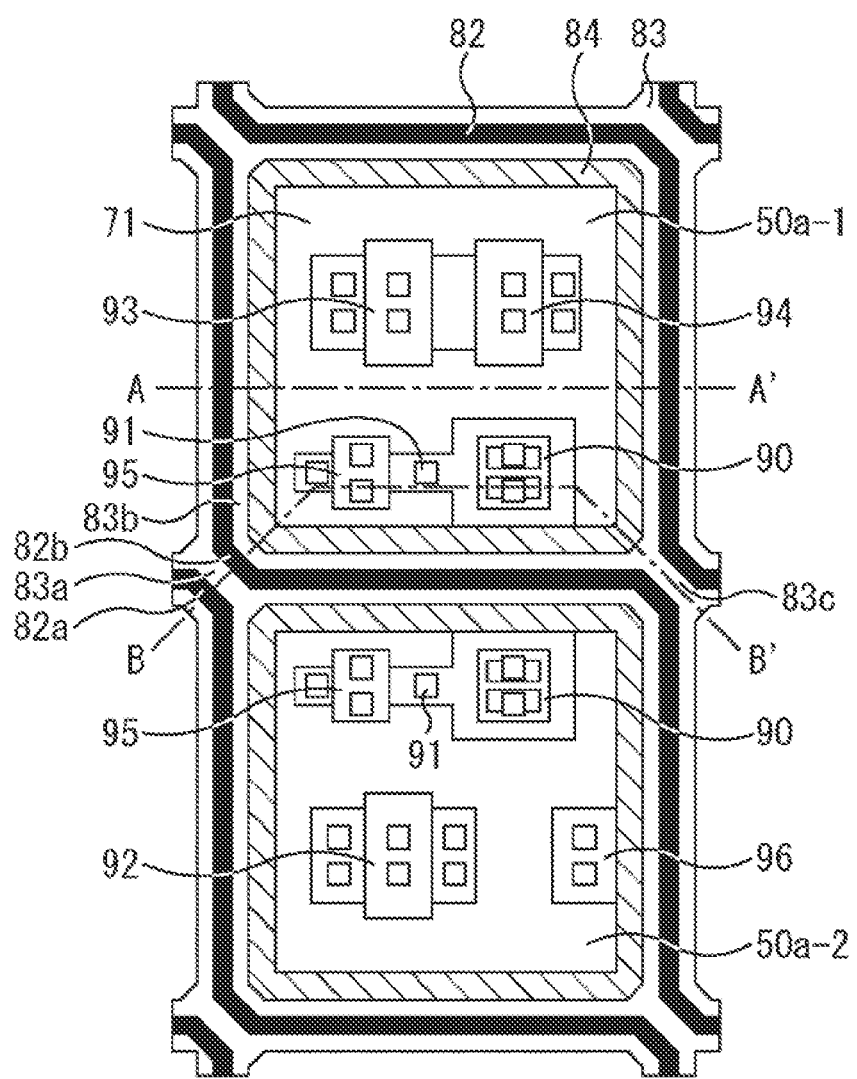
FIG. 4 is a plan view of a front side of the first embodiment of the pixel to which the present technology is applied.

FIG. 3 is a vertical cross-sectional view of a pixel 50a in the first embodiment of the pixel 50 to which the present technology is applied, and FIG. 4 is a plan view of a front side of the pixel 50a. Note that FIG. 3 corresponds to the position of line segment A-A' in FIG. 4.

The pixel 50 below will be described taking the case of a back-illuminated type as an example. However, the present technology can be applied to a front-illuminated type.

The pixel 50a illustrated in FIG. 3 includes a photodiode (PD) 71 that is a photoelectric conversion element of each pixel formed inside an Si substrate 70. A P-type region 72 is formed on a light incident side (a lower side and a back side in FIG. 3) of the PD 71, and a flattened film 73 is formed in a further lower layer of the P-type region 72. A boundary between the P-type region 72 and the flattened film 73 is a back surface Si interface 75.

A light shielding film 74 is formed in the flattened film 73. The light shielding film 74 is provided to prevent leakage of light into an adjacent pixel and is formed between the PD 71 and an adjacent PD 71. The light shielding film 74 is formed using, for example, a metal material such as tungsten (W).

An on-chip lens (OCL) 76 for collecting incident light to the PD 71 is formed on the flattened film 73 and on the back side of the Si substrate 70. The OCL 76 can be formed using an inorganic material. For example, SiN, SiO, or SiOxNy (note that 0<x≤1 and 0<y≤1) can be used.

Although not illustrated in FIG. 3, a configuration in which a transparent plate such as a cover glass or a resin is adhered on the OCL 76 may be adopted. Furthermore, although not illustrated in FIG. 3, a configuration in which a color filter layer is formed between the OCL 76 and the flattened film 73 may be adopted. Furthermore, the color filter layer has a plurality of color filters provided for each pixel, and the colors of the color filters can be arranged according to a Bayer array, for example.

An active region (Pwell) 77 is formed on an opposite side (an upper side and a front side in FIG. 3) of the light incident side of the PD 71. The active region 77 has a region where an element isolation region (hereinafter referred to as shallow trench Isolation (STI)) for isolating a pixel transistor and the like is formed. A wiring layer 79 is formed on the front side (upper side in FIG. 3) of the Si substrate 70 and on the active region 77, and a plurality of transistors is formed in the wiring layer 79.

A trench is formed between the pixels 50a. This trench is referred to as deep trench isolation (DTI). This DTI 82 is formed in a shape penetrating the Si substrate 70 in a depth direction (a vertical direction in FIG. 3 and a direction from the front side to the back side) between adjacent pixels 50a. The trench between the pixels 50a is penetrating but there is also a trench formed between the pixels 50a in a non-through manner. Therefore, here, the trench formed in a through manner is described as a through DTI and the trench formed in a non-through manner is described as a non-through DTI. Furthermore, in the case where the through DTI and the non-through DTI are not distinguished, they are simply called DTI(s).

The through DTI 82 also functions as a light shielding wall between pixels so that unnecessary light does not leak into an adjacent pixel 50a.

A P-type solid phase diffusion layer 83 and an N-type solid phase diffusion layer 84 are formed between the PD 71 and the through DTI 82 in order from the through DTI 82 side toward the PD 71. The P-type solid phase diffusion layer 83 is formed along the through DTI 82 to come in contact with the back surface Si interface 75 of the Si substrate 70. The N-type solid phase diffusion layer 84 is formed along the through DTI 82 to come in contact with the P-type region 72 of the Si substrate 70.

Note that the solid phase diffusion layer refers to a layer obtained by forming a P-type layer and an N-type layer by impurity doping by a manufacturing method to be described below. However, in the present technology, the manufacturing method is not limited to the method by solid phase diffusion, and the P-type layer and the N-type layer generated by another manufacturing method such as ion implantation may be provided between the through DTI 82 and the PD 71. Furthermore, the PD 71 in the present embodiment is configured by an N-type region. Photoelectric conversion is performed in part of or in the entire region of the N-type region.

While the P-type solid phase diffusion layer 83 is formed to come in contact with the back surface Si interface 75, the N-type solid phase diffusion layer 84 is not in contact with the back surface Si interface 75, and a gap is provided between the N-type solid phase diffusion layer 84 and the back surface Si interface 75.

With such a configuration, a PN junction region of the P-type solid phase diffusion layer 83 and the N-type solid phase diffusion layer 84 forms a strong electric field region, and holds the charge generated in the PD 71. According to the configuration, the P-type solid phase diffusion layer 83 and the N-type solid phase diffusion layer 84 formed along the through DTI 82 forms the strong electric field region and can hold the charge generated in the PD 71.

If the N-type solid phase diffusion layer 84 is formed along the through DTI 82 to come in contact with the back surface Si interface 75 of the Si substrate 70, the pinning of the charge is weakened in a portion where the back surface Si interface 75 of the Si substrate 70 on the light incident surface side and the N-type solid phase diffusion layer 84 are in contact with each other. Therefore, there is a possibility that the generated charge flows into the PD 71, the Dark characteristic deteriorates, and for example, a white point occurs and a dark current is generated.

However, in the pixel 50a illustrated in FIG. 3, the N-type solid phase diffusion layer 84 is not in contact with the back surface Si interface 75 of the Si substrate 70, and is formed along the through DTI 82 to come in contact with the P-type region 72 of the Si substrate 70. With such a configuration, weakening of the pinning of the charge can be prevented, and flowing of the charge into the PD 71 and deterioration of the Dark characteristic can be prevented.

Furthermore, in the pixel 50a illustrated in FIG. 3, a side wall film containing SiO2 is formed on an inner wall of the through DTI 82, and a filler 86 containing polysilicon is embedded inside the side wall film.

The pixel 50a according to the first embodiment has the configuration in which the P-type region 72 is provided on the back side, and the PD 71 and the N-type solid phase diffusion layer 84 are not present near the back surface Si interface 75. With the configuration, weakening of the pinning near the back surface Si interface 75 does not occur. Therefore, flowing of the generated charge into the PD 71 and deterioration of the Dark characteristic can be suppressed.

Note that, in the through DTI 82, SiN may be adopted instead of SiO2 adopted for the side wall film 85. Furthermore, doping polysilicon may be used instead of the polysilicon adopted for the filler 86. In the case of adding the doping polysilicon or in the case of performing doping with N-type impurities or P-type impurities after adding the polysilicon, the pinning of the side wall of the through DTI 82 can be enhanced by applying a negative bias. Therefore, the Dark characteristic can be further improved.

Figure 5:
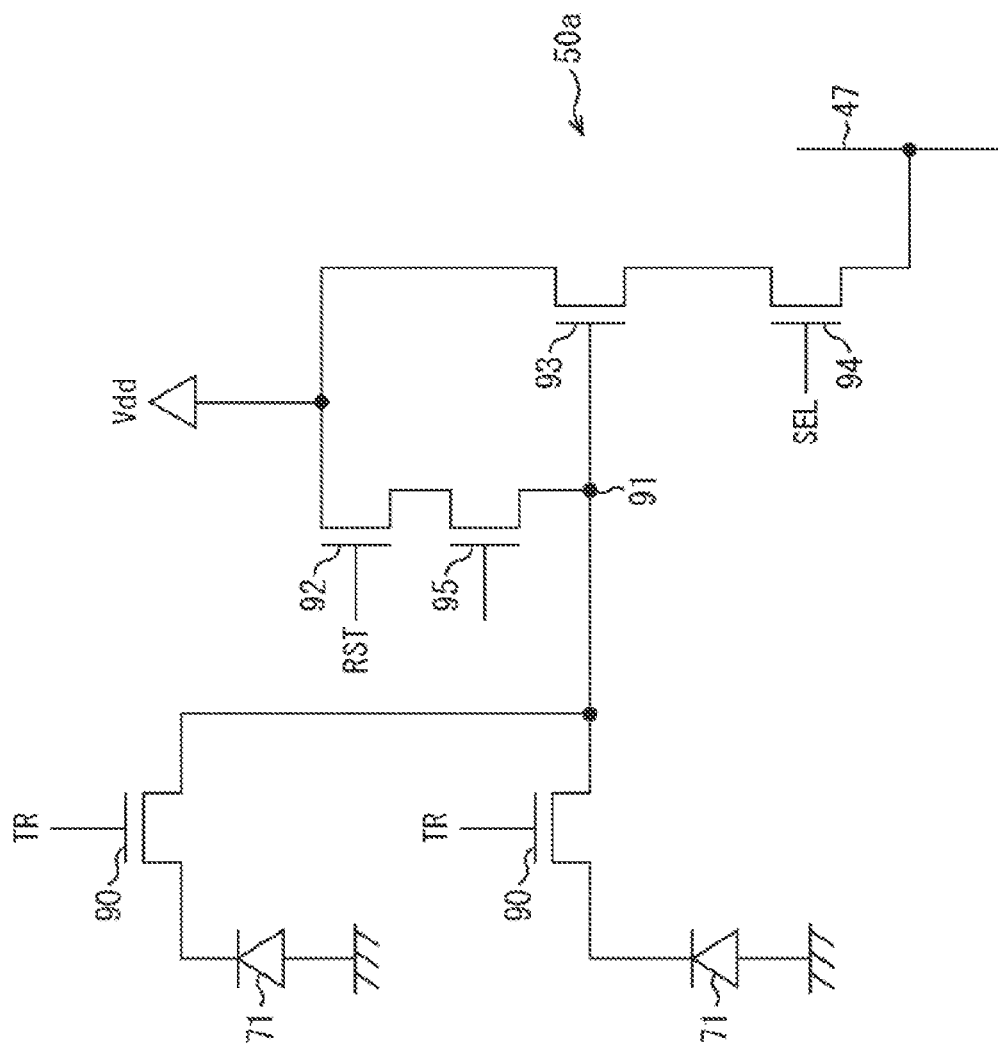
FIG. 5 is a circuit diagram of a pixel.

Arrangement of transistors formed in the pixel 50a will be described with reference to FIG. 4. FIG. 4 is a plan view of vertically arranged two pixels 50a viewed from the front side (the upper side in FIG. 3) among pixels arranged in the pixel array unit 41 (FIG. 2). FIG. 5 is a circuit diagram for describing the connection relationship among the transistors illustrated in FIG. 4.

In FIG. 4, one square represents one pixel 50a. As illustrated in FIG. 4, the N-type solid phase diffusion layer 84 is formed to surround the pixel 50a (the PD 71 included in the pixel 50a). Furthermore, the P-type solid phase diffusion layer 83 is formed outside the N-type solid phase diffusion layer 84, and the pixel 50a is also formed to be surrounded by the P-type solid phase diffusion layer 83.

Moreover, the through DTI 82 is formed outside the P-type solid phase diffusion layer 83, and the pixel 50a is also formed to be surrounded by the through DTI 82. Note that, in the plan view illustrated in FIG. 4, the through DTI 82 is illustrated by a thick black line.

Figure 6:
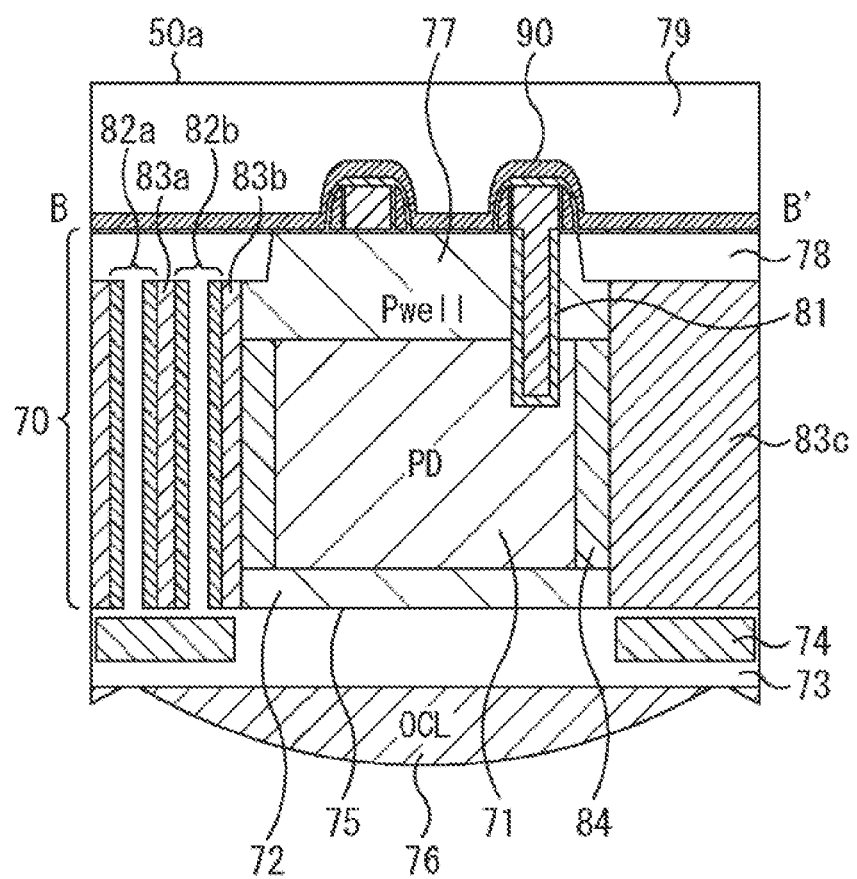
FIG. 6 is a vertical cross-sectional view of the configuration of the pixel of the first embodiment.

The through DTI 82 does not completely surround the pixel 50a and is formed to partially have an opening portion. In the case of focusing on a pixel 50a-1 in FIG. 4, the opening portions of the through DTI 82 are provided in an upper left corner and a lower right corner of the pixel 50a-1. The P-type solid phase diffusion layer 83 is formed in the opening portion. A vertical cross-sectional view of the pixel 50a including the opening portion is illustrated in FIG. 6, and the opening portion will be described below.

On the front side of the pixel 50a-1, a transfer transistor 90, a floating diffusion (FD) 91, an amplification transistor 93, a selection transistor 94, and a conversion efficiency switching transistor 95 are formed. On the front side of a pixel 50a-2, a transfer transistor 90, a FD 91, a reset transistor 92, a conversion efficiency switching transistor 95, and a GND contact region 96 are formed.

The reset transistor 92 and the amplification transistor 93 are configured to be shared by the pixel 50a-1 and the pixel 50b-1. Furthermore, the FD 91 of the pixel 50a-1 and the FD 91 of the pixel 50a-2 are electrically connected by the wiring layer 79 through an FD contact.

Furthermore, the GND contact region 96 is not formed in the pixel 50a-1 and is formed only in the pixel 50a-2. As will be described below with reference to FIG. 7, since the opening portions are provided in the through DTI 82, the pixels 50a adjacent in an oblique direction are in a connected state at the opening portions. The GND contact region 96 is only required to be formed in at least one pixel 50a of the pixels 50a adjacent in the oblique direction, thereby making ground voltages of the pixels 50a adjacent in the oblique direction constantly uniform.

The PD 71 generates and accumulates a charge (signal charge) according to a received light amount. The PD 71 has an anode terminal grounded and a cathode terminal connected to the FD 91 via the transfer transistor 90.

When turned on by a transfer signal TR, the transfer transistor 90 reads the charge generated in the PD 71 and transfers the read charge to the FD 91.

The FD 91 holds the charge read from the PD 71. When turned on by a reset signal RST, the reset transistor 92 resets a potential of the FD 91 as the charge accumulated in the FD 91 is discharged to a drain (constant voltage source Vdd). The conversion efficiency switching transistor 95 is configured to be electrically coupled with the FD 91 to expand a floating diffusion region of the FD 91 and increase the capacitance of the FD 91, thereby reducing the conversion efficiency, when turned on.

The amplification transistor 93 outputs a pixel signal according to the potential of the FD 91. That is, the amplification transistor 93 constitutes a source follower circuit with a load MOS (not illustrated) as a constant current source connected via a vertical signal line 33. The pixel signal indicating a level according to the charge accumulated in the FD 91 is output from the amplification transistor 93 to the column processing unit 43 (FIG. 2) through the selection transistor 94 and the vertical signal line 47.

The selection transistor 94 is turned on when the pixel 31 is selected by a selection signal SEL, and outputs the pixel signal of the pixel 31 to the column processing unit 43 via the vertical signal line 33. The signal lines for transmitting the transfer signal TR, the selection signal SEL, and the reset signal RST correspond to the pixel drive lines 46 in FIG. 2.

The pixel 50a can be configured as described above, but the configuration is not limited thereto, and another configuration can be adopted.

FIG. 6 is a vertical cross-sectional view of the pixel 50a, corresponding to the position of line segment B-B' in FIG. 4. Description of the same portions as those of the pixel 50a illustrated in FIG. 3 is omitted.

The active region (Pwell) 77 is formed on the opposite side (the upper side and the front side in FIG. 6) of the light incident side of the PD 71 of the pixel 50a illustrated in FIG. 6. In the active region 77, an element isolation region (hereinafter referred to as shallow trench Isolation (STI)) 78 for isolating a pixel transistor and the like is formed. The STI 78 is formed on the left side and the right side in FIG. 6.

The wiring layer 79 is formed on the front side (upper side in FIG. 6) of the Si substrate 70 and on the active region 77, and the plurality of transistors is formed in the wiring layer 79. FIG. 3 illustrates an example in which the transfer transistor 90 is formed. The transfer transistor (gate) 90 is formed using a vertical transistor. That is, in the transfer transistor (gate) 90, a vertical transistor trench 81 is opened, and a transfer gate (TG) 90 for reading the charge from the PD 71 is formed in the opening.

Note that, for the transistors such as the transfer transistor 90, contacts for being connected with the wiring in the wiring layer 79 are formed. However, these contacts are not illustrated in FIG. 6. In other cross-sectional views, the contacts will be described without illustration.

The point B side in FIG. 4 corresponds to the left side in FIG. 6, and the point B' side in FIG. 4 corresponds to the right side in FIG. 6. Description will be given in order from the point B toward the point B'. Referring to FIGS. 4 and 6, a through DTI 82a, a P-type solid phase diffusion layer 83a, a through DTI 82b, and a P-type solid phase diffusion layer 83b are arranged in this order in the case of moving from the point B to the point B'.

In this region, the P-type solid phase diffusion layer 83a is formed between the through DTI 82a and the through DTI 82b. Further, the portion between the through DTI 82a and the through DTI 82b corresponds to the above-described opening portion of the through DTI 82. Thus, the P-type solid phase diffusion layer 83 is formed in the opening portion of the through DTI 82.

Meanwhile, referring to FIG. 4, the point B' side goes along the P-type solid phase diffusion layer 83 formed in the opening portion of the through DTI 82. Therefore, as illustrated in FIG. 6, a P-type solid phase diffusion layer 83c is formed below the STI 78.

As described above, the P-type solid phase diffusion layer 83 is formed in the opening portion of the through DTI 82, and the pixel 50a is connected with the adjacent pixel 50a via the P-type solid phase diffusion layer 83. Therefore, the adjacent pixel 50a can be made in an electrically conductive state. The configuration in which the GND contact region 96 is not arranged in each pixel due to the adjacent pixel 50a being electrically conductive will be described with reference to FIG. 7.

Figure 7:
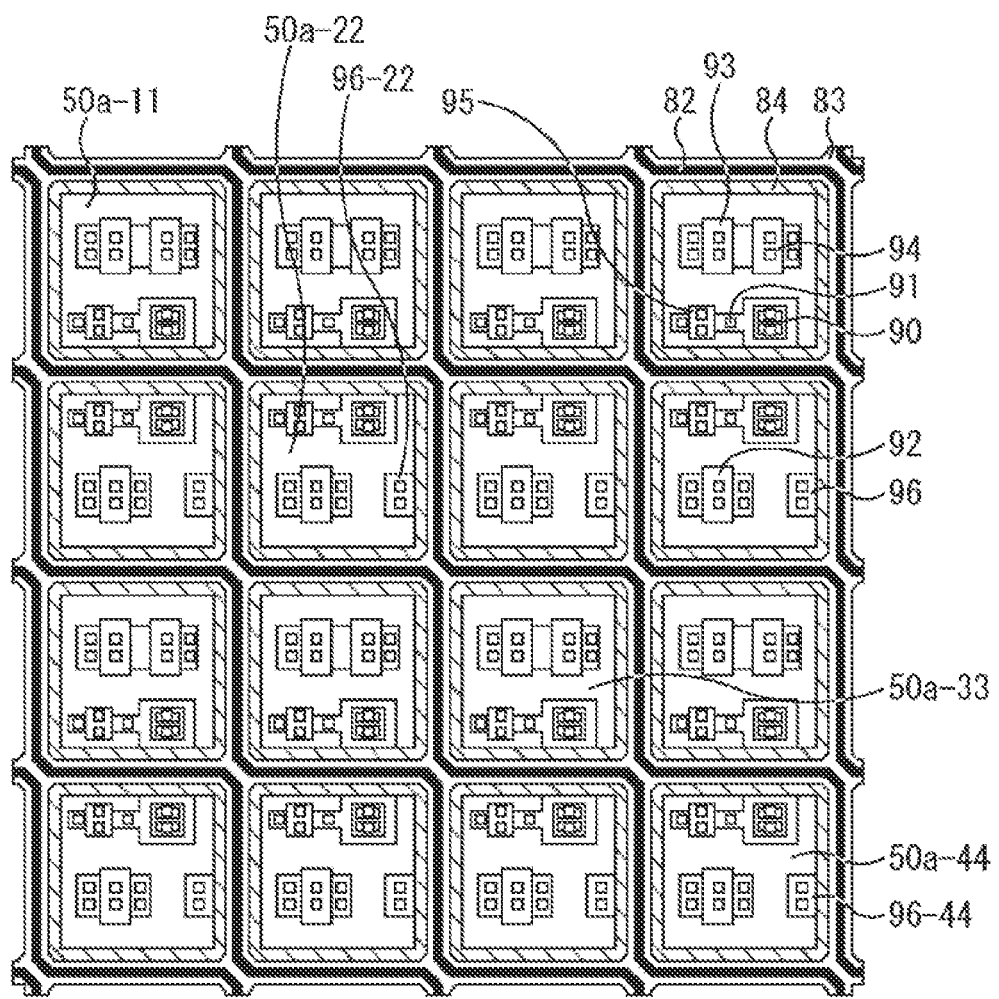
FIG. 7 is a diagram for describing sharing of a contact region.

FIG. 7 illustrates 4×4 sixteen pixels 50a arranged in the pixel array unit 41. In FIG. 7, the pixel 50a arranged in the first row and first column is defined as a pixel 50a-11, the pixel 50a arranged in the second row and second column is defined as a pixel 50a-22, the pixel 50a arranged in the third row and third column is defined as a pixel 50a-33, and the pixel 50a arranged in the fourth row and fourth column is defined as a pixel 50a-44.

These pixels 50a-11, 50a-22, 50a-33, and 50a-44 are the pixels 50a arranged in one line in the oblique direction, as illustrated in FIG. 7. The pixels 50a arranged in one line in the oblique direction are electrically conductive at the opening portion of the through DTI 82. For example, the pixel 50a-11 and the pixel 50a-22 are electrically conductive with each other at the lower right opening portion of the through DTI 82 formed in the pixel 50a-11 and at the upper left opening portion of the through DTI 82 formed in the pixel 50a-22.

Similarly, the pixel 50a-22 and the pixel 50a-33 are electrically conductive with each other at the lower right opening portion of the through DTI 82 formed in the pixel 50a-22 and at the upper left opening portion of the through DTI 82 formed in the pixel 50a-33. Moreover, similarly, the pixel 50a-33 and the pixel 50a-44 are electrically conductive with each other at the lower right opening portion of the through DTI 82 formed in the pixel 50a-33 and at the upper left opening portion of the through DTI 82 formed in the pixel 50a-44.

As described above, since the pixels 50a adjacent in the oblique direction are electrically conductive at the opening portions provided at two corners among the four corners of each of the pixels 50a, the GND contact region 96 for fixing the potential of the Pwell region 77 needs not be provided in each pixel 50a.

Note that, here, description will be continued taking the case where the opening portions are provided at two corners among the four corners of the pixel 50a as an example. However, the opening portion may be provided at one corner among the four corners. In the case where the opening portion is provided at one corner, pixels across the opening portion can be in the electrically conductive state.

In FIG. 7, a GND contact region 96-22 is formed in the pixel 50a-22 but no GND contact region 96 is formed in the pixel 50a-11 of the electrically conductive pixel 50a-11 and pixel 50a-22. In this case, the pixel 50a-11 and the pixel 50a-22 are configured to share the GND contact region 96-22, and the Pwell potential of the pixel 50a-11 is fixed by the GND contact region 96-22 in the pixel 50a-22.

Furthermore, similarly, in FIG. 7, a GND contact region 96-44 is formed in the pixel 50a-44 but no GND contact region 96 is formed in the pixel 50a-33, of the electrically conductive pixel 50a-33 and pixel 50a-44. In this case, the pixel 50a-33 and the pixel 50a-44 are configured to share the GND contact region 96-44, and the Pwell potential of the pixel 50a-33 is fixed by the GND contact region 96-22 in the pixel 50a-44.

In the example illustrated in FIG. 7, the configuration in which two pixels share the GND contact region 96 is adopted. However, a configuration in which four pixels 50a share the GND contact region 96 or a configuration in which eight pixels 50a share the GND contact region 96 can be adopted.

Moreover, a configuration in which the GND contact region 96 is formed in one pixel 50a among the pixels 50a arranged in the oblique direction, in other words, in one pixel 50a among the electrically conductive pixels 50a, can be adopted. In such a case, a configuration in which the GND contact region 96 is formed in the pixel 50a arranged in a predetermined line such as an uppermost line or a lowermost line among pixel lines of the pixel array unit 41 can be adopted.

As described above, the pixels 50a according to the first embodiment have the configuration in which the vertically arrayed pixels 50a share the reset transistor 92, the amplification transistor 93, and the selection transistor 94, as described with reference to FIG. 4, and the obliquely arrayed pixels 50a share the GND contact region 96, as described with reference to FIG. 7.

With the configuration provided with the opening portions of the through DTI 82, there is a possibility of reduction of blooming suppression ability. However, for the opening portions of the through DTI 82, the P-type region is secured in the P-type solid phase diffusion layer 83. Therefore, weakening of isolation between adjacent pixels can be minimized.

Figure 8:
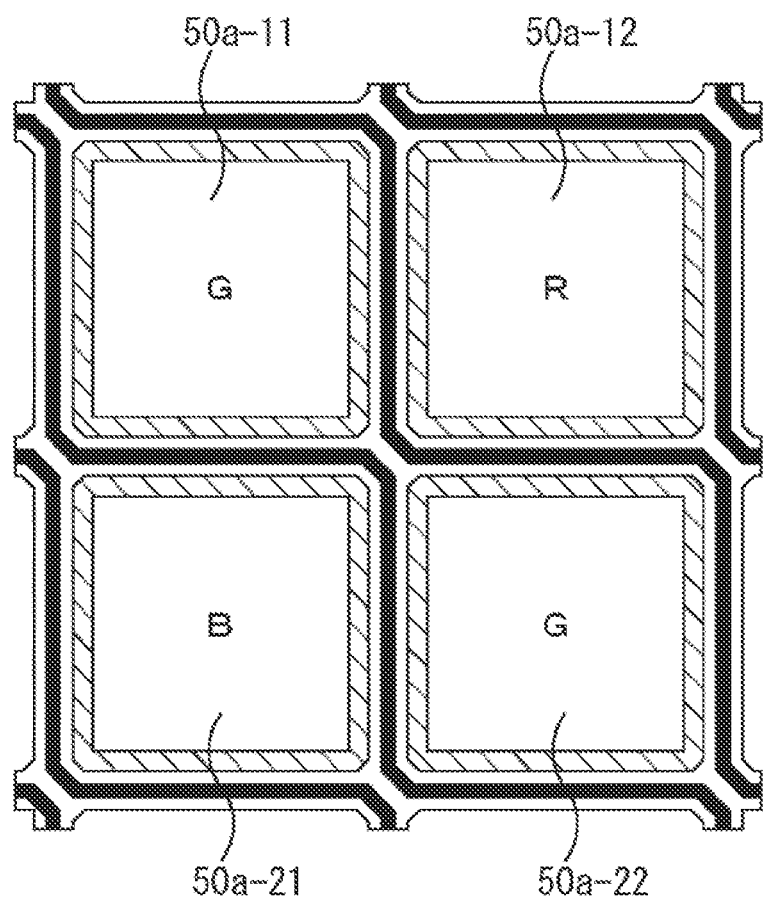
FIG. 8 is a diagram illustrating suppression of blooming.

Furthermore, as illustrated in FIG. 8, in the case of the Bayer array, G pixels that are likely to cause blooming are conductive, and a G pixel and an R pixel, and a G pixel and a B pixel are not conductive. Referring to FIG. 8, the pixel 50a-11 arranged in the upper left in FIG. 8 is a G pixel with a green color filter. A pixel 50a-12 arranged in the upper right in FIG. 8 is an R pixel with a red color filter.

A pixel 50a-21 arranged in the lower left in FIG. 8 is a B pixel with a blue color filter. A pixel 50a-22 arranged in the lower right in FIG. 8 is a G pixel with a green color filter.

The pixel 50a-11 and the pixel 50a-22 are electrically conductive by the opening portion of the through DTI 82. That is, the G pixels are electrically conductive. In contrast, the pixel 50a-11 and the pixel 50a-12 are isolated by the through DTI 82. That is, the G pixel and the R pixel are not electrically conductive.

Furthermore, the pixel 50a-11 and the pixel 50a-21 are isolated by the through DTI 82. That is, the G pixel and the B pixel are not electrically conductive. Similarly, in the pixel 50a-22 (G pixel), the R pixel and the B pixel are isolated by the through DTI 82 and thus are not electrically conductive.

Therefore, since leakage of the charge from the G pixel to the R pixel or the B pixel and occurrence of blooming are prevented, reduction in suppression ability for blooming can be prevented even in the configuration provided with the opening portion of the through DTI 82, and the reduction can be suppressed even if the suppression ability is reduced.

Since the pixel 50a has a region not isolated by the through DTI 82, in the opening portion of the through DTI 82, there is a possibility that light entering the region becomes a cause of color mixture. To suppress occurrence of such color mixture, the configuration of the pixel 50a as illustrated in FIGS. 9 and 10 can be adopted.

Figure 9:
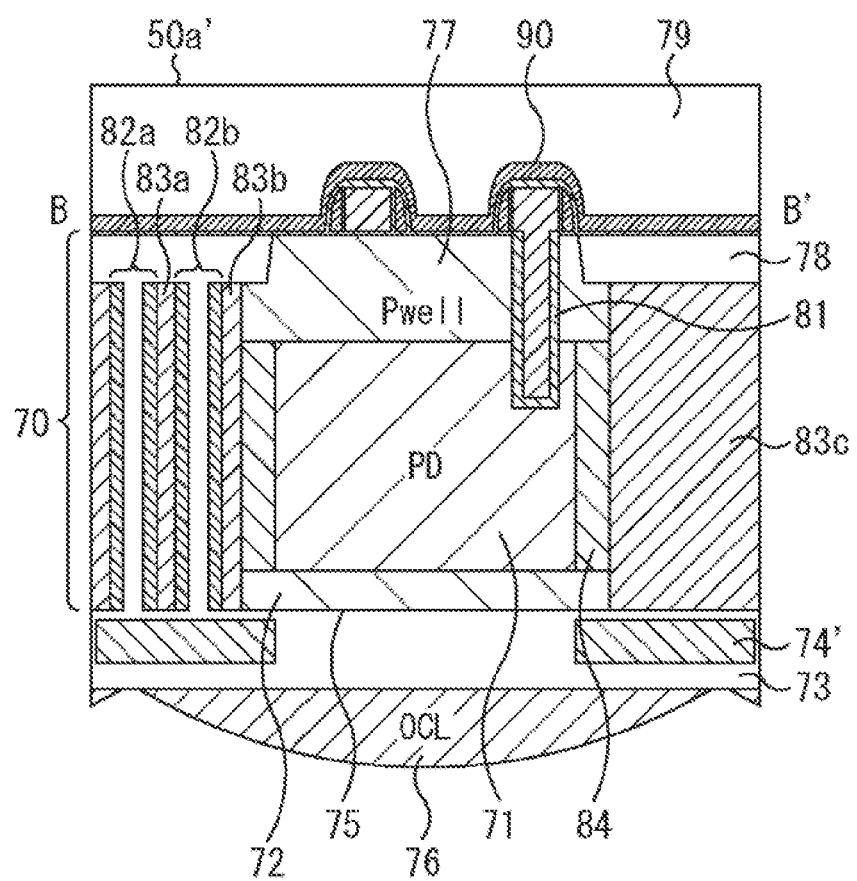
FIG. 9 is a vertical cross-sectional view of another configuration of the pixel of the first embodiment.
Figure 10:
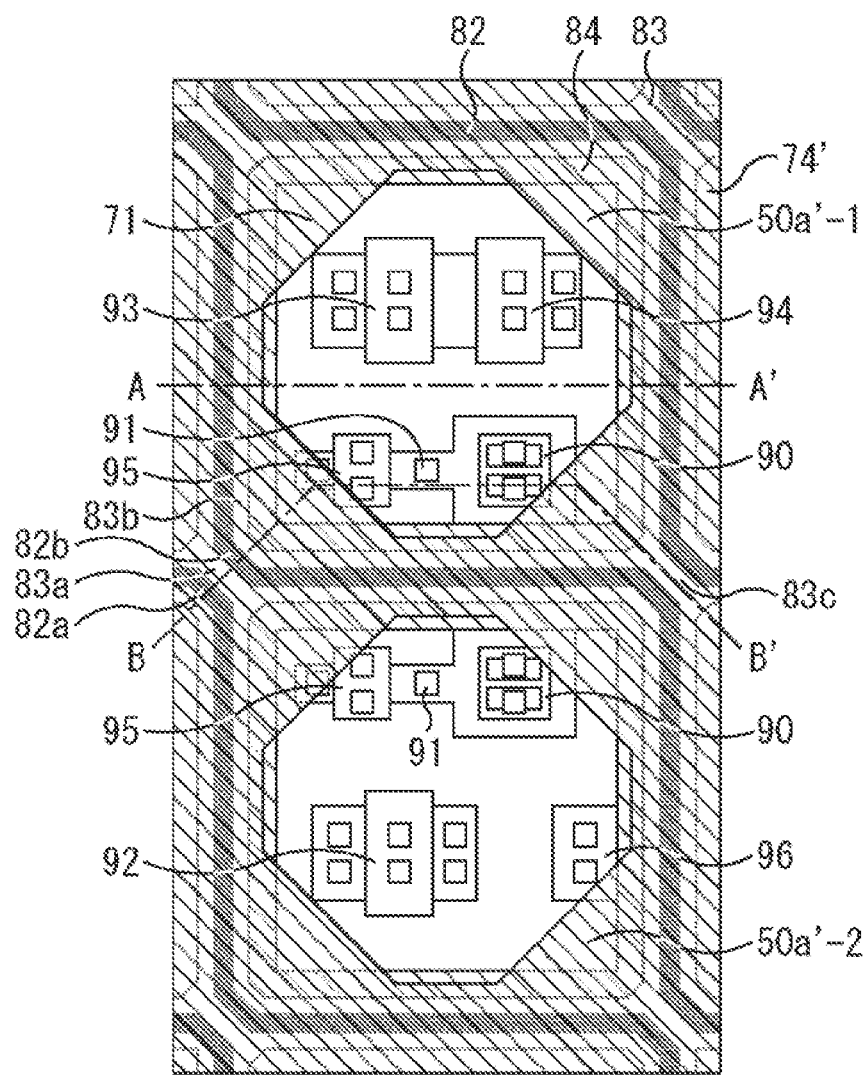
FIG. 10 is a plan view of another configuration of the pixel of the first embodiment.

FIGS. 9 and 10 are diagrams illustrating another configuration of the pixel 50a. FIG. 9 is a vertical cross-sectional view of the pixel 50a, and FIG. 10 is a front-side plan view of the pixel 50a. FIG. 10 corresponds to the position of line segment B-B' in FIG. 9.

A pixel 50a' illustrated in FIG. 9 (described with a dash to be distinguished from the pixel 50a illustrated in FIG. 6)

is different in that the light shielding film 74 of the pixel 50*a* illustrated in FIG. 6 is formed large, and is similar in other configurations.

In the pixel 50*a*', a light shielding film 74' is formed large. As illustrated in FIG. 9, the light shielding film 74' is formed to extend to below the N-type solid phase diffusion layer 84. In the plan view, the light shielding film 74' at the opening portions of the through DTI 82 is formed larger than the portion other than the opening portions of the through DTI 82, as illustrated in FIG. 10.

As illustrated in FIG. 10, the light shielding film 74' is formed along the through DTI 82 up to the position not overlapping with the N-type solid phase diffusion layer 84, in the portion other than the opening portion of the through DTI 82, and the light shielding film 74' is formed to completely cover the opening portions and cover the N-type solid phase diffusion layer 84 up to the position partially overlapping with the PD 71, in the opening portions of the through DTI 82 (the four corner portions of the pixel 50*a*').

The light shielding film 74 formed at the opening portion of the through DTI 82 is formed to cover the opening portion of the through DTI 82, whereby entry of the light into the opening portion of the through DTI 82 can be prevented, and color mixing by the light through the opening portion of the through DTI 82 can be suppressed.

<Method of Manufacturing DTI 82 and Periphery of DTI 82>

Figure 11:
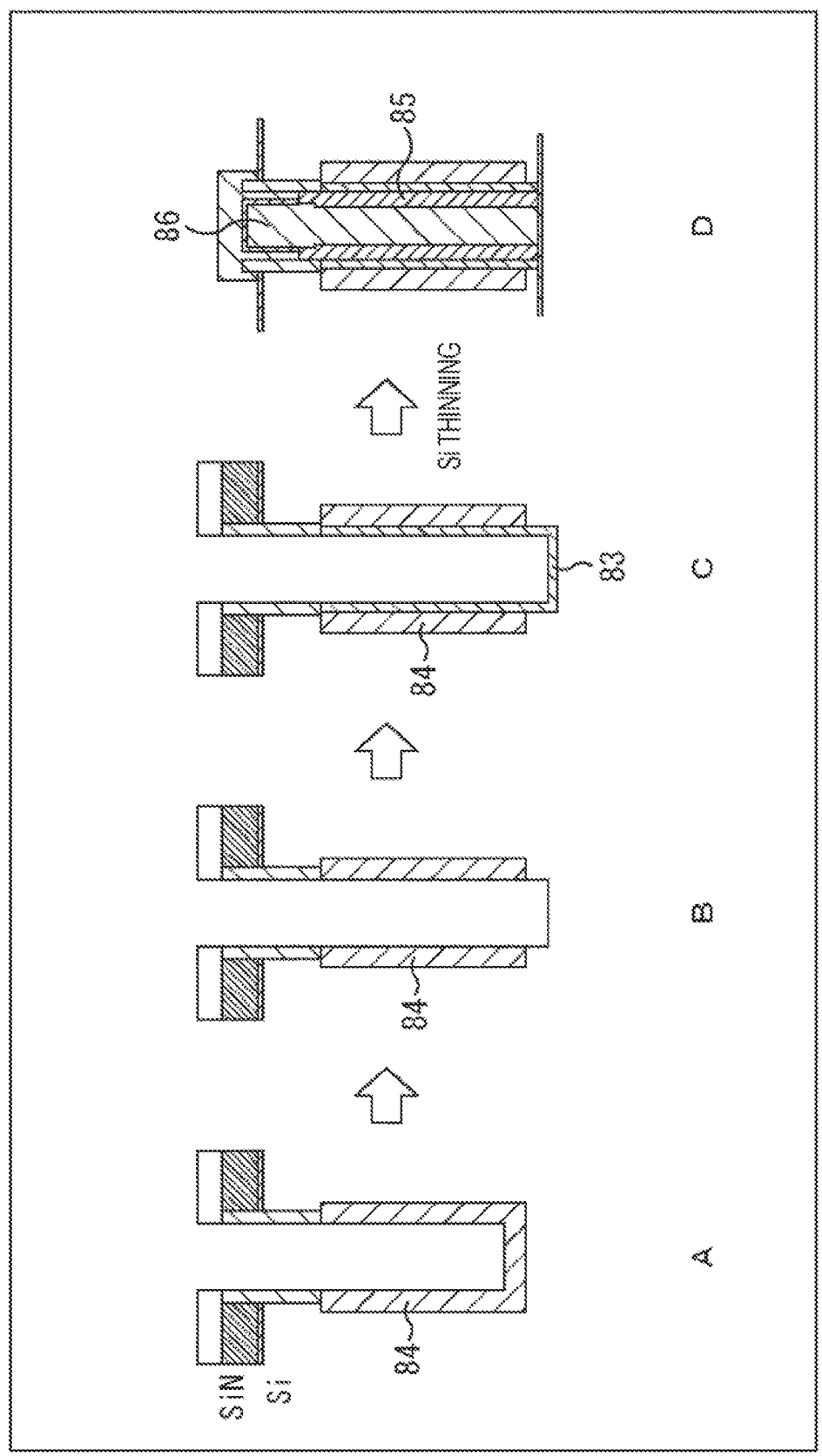
FIG. 11 is a diagram for describing formation of a solid phase diffusion layer.

FIG. 11 is a diagram for describing a method of manufacturing the through DTI 82 and a periphery of the through DTI 82.

As illustrated in A in FIG. 11, in opening the through DTI 82 in the Si substrate 70, the Si substrate 70 other than the position where the through DTI 82 is to be formed is covered with a hard mask using SiN and SiO2, and the portion not covered with the hard mask is dry-etched to open a groove in the vertical direction up to a predetermined depth in the Si substrate 70.

Next, an SiO2 film containing phosphorus (P) that is an N-type impurity is formed inside the opened groove and thermal treatment is performed, so that a portion from the SiO2 film to the Si substrate 70 side is doped with the phosphorus (P) (hereinafter referred to as solid phase diffusion).

Next, as illustrated in B in FIG. 11, the SiO2 film containing P formed inside the opened groove is removed and then the thermal treatment is performed again, and the phosphorus (P) is diffused up to the inside of the Si substrate 70, so that the N-type solid phase diffusion layer 84 self-aligned in the current groove shape is formed. Thereafter, a bottom portion of the groove is etched by dry etching, thereby being extended in the depth direction.

Next, as illustrated in C in FIG. 11, a SiO2 film containing boron (B) that is a P-type impurity is formed inside the extended groove and then the thermal treatment is performed, and the boron (B) is solid-phase diffused from the SiO2 film to the Si substrate 70 side, so that the P-type solid phase diffusion layer 83 self-aligned in the extended groove shape is formed.

Thereafter, the SiO2 film containing boron (B) formed on an inner wall of the groove is removed.

Next, as illustrated in D in FIG. 11, a side wall film 85 containing SiO2 is formed on an inner wall of the opened groove, and polysilicon is added to form the through DTI 82. After that, the pixel transistors and the wiring are formed. Thereafter, the Si substrate 70 is thinned from the back side. At the time of thinning, the bottom portion of the through DTI 82 is simultaneously thinned including the P-type solid phase diffusion layer 83. This thinning is performed up to a depth not reaching the N-type solid phase diffusion layer 84.

Through the above steps, the strong electric field region including the N-type solid phase diffusion layer 84 not in contact with the back surface Si interface 75 and the P-type solid phase diffusion layer 83 in contact with the back surface Si interface 75 can be formed adjacent to the PD 71.

Furthermore, the P-type solid phase diffusion layer 83 formed in the opening portion of the through DTI 82 is also formed through such steps. That is, the P-type solid phase diffusion layer 83 is formed in the opening portion of the through DTI 82 by the step illustrated in C in FIG. 11.

Referring to FIG. 4 again, the P-type solid phase diffusion layer 83*a* is formed by solid phase diffusion at the through DTI 82*a*, and the P-type solid phase diffusion layer 83*a* is formed by solid phase diffusion at the through DTI 82*b*. Therefore, the P-type solid phase diffusion layer 83*a* formed between the through DTI 82*a* and the through DTI 82*b* is formed by the P-type solid phase diffusion layer 83*a* formed at the through DTI 82*a* and the P-type solid phase diffusion layer 83*a* formed at the through DTI 82*b*.

As described above, the P-type solid phase diffusion layer 83 provided in the opening portion of the through DTI 82 is formed in the step of performing solid phase diffusion in the through DTI 82. Therefore, the P-type solid phase diffusion layer 83 provided in the opening portion of the through DTI 82 can be formed without adding new processing for forming the P-type solid phase diffusion layer 83 provided in the opening portion of the through DTI 82, that is, without increasing the number of steps.

Configuration Example of Pixel in Second Embodiment

Figure 12:
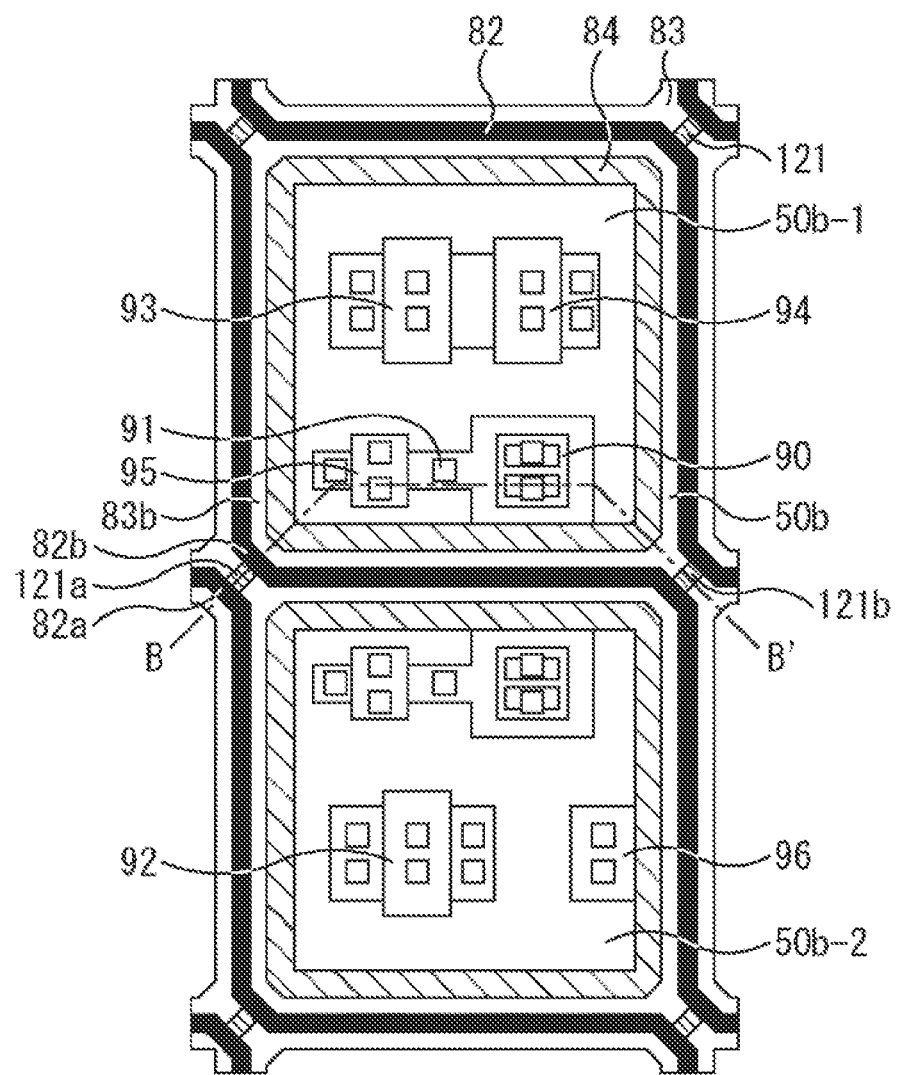
FIG. 12 is a plan view of a configuration of a pixel of a second embodiment.
Figure 13:
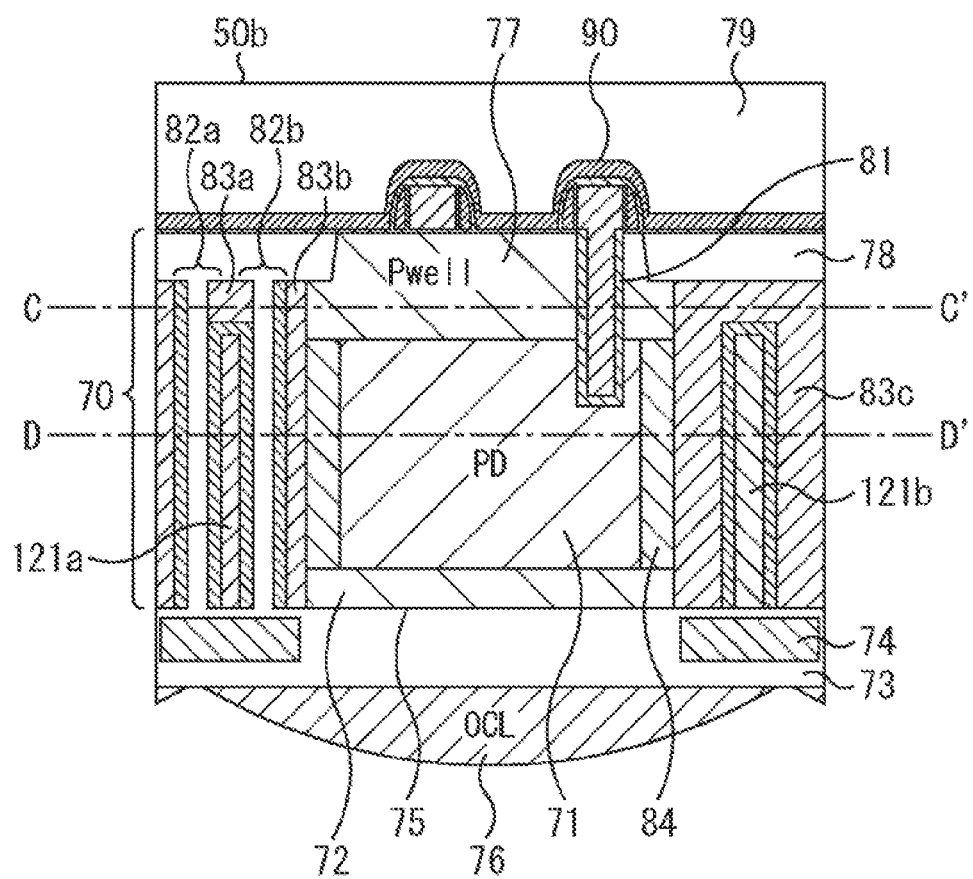
FIG. 13 is a vertical cross-sectional view of the configuration of the pixel of the second embodiment.

FIG. 12 is a plan view of a front side of a pixel 50*b* in a second embodiment of the pixel 50 to which the present technology is applied, and FIG. 13 is a vertical cross-sectional view of the pixel 50*b*. FIG. 13 corresponds to the position of line segment B-B' in FIG. 12.

The second embodiment is different from the first embodiment in that a non-through DTI (hereinafter described as non-through DTI) is formed in an opening portion of a through DTI 82 and is similar to the first embodiment in other configurations. The similar portions are denoted by the same reference numerals and description is appropriately omitted. In the following description of the pixel 50, the same portion as the pixel 50*a* in the first embodiment is denoted by the same reference numeral, and description is appropriately omitted.

FIG. 12 illustrates a case where the pixel 50*b* has a two-pixel sharing configuration in which vertically arranged pixel 50*b*-1 and pixel 50*b*-2 share a reset transistor 92, an amplification transistor 93, and a selection transistor 94, as in the pixel 50*a* illustrated in FIG. 4.

By forming the non-through DTI in the opening portion of the through DTI 82, blooming suppression ability can be increased as compared with the pixel 50*a* in the first embodiment.

Referring to the plan view of the front side of the pixel 50*b* illustrated in FIG. 12, a non-through DTI 121 is formed in the opening portion of the through DTI 82. The non-through DTI 121 is formed to isolate the pixels 50*b* at the opening portion of the through DTI 82. Therefore, in the configuration of the pixel 50*b*, the PD 71 has a structure surrounded by the through DTI 82 and the non-through DTI 121.

A plan view corresponding to the position of line segment C-C' in the vertical cross-sectional view of the pixel 50*b* in FIG. 13 is as illustrated in FIG. 4. A through DTI 63*a*, a P-type solid phase diffusion layer 83*a*, and a through DTI 82*b* are arranged on the point C side and on a side close to a wiring layer 79 of the pixel 50*b*.

That is, the portion between the through DTI 82*a* and the through DTI 82*b* is an opening portion of the through DTI 82, and the P-type solid phase diffusion layer 83*a* is formed in the opening portion. Furthermore, in the plan view corresponding to the position of line segment C-C', a P-type solid phase diffusion layer 83*c* is arranged on the point C' side and on a side close to the wiring layer 79 of the pixel 50*b*.

A plan view corresponding to the position of line segment D-D' in the vertical cross-sectional view of the pixel 50*b* in FIG. 13 is as illustrated in FIG. 12. The through DTI 63*a*, a non-through trench 121*a*, and the through DTI 82*b* are arranged on the point D side and on a side distant from the wiring layer 79 of the pixel 50*b*.

That is, the portion between the through DTI 82*a* and the through DTI 82*b* is an opening portion of the through DTI 82, and the non-through DTI 121*a* is formed in the opening portion. Furthermore, in the plan view corresponding to the position of line segment D-D', a non-through DTI 121*b* surrounded by the P-type solid phase diffusion layer 83*c* is arranged on the point D' side and on a side distant from the wiring layer 79 of the pixel 50*b*.

Thus, the non-through DTI 121 is formed at the opening portion of the through DTI 82. Therefore, the pixel 50*b* is in an electrically conductive state with an adjacent pixel 50*b* by the P-type solid phase diffusion layer 83 at the opening portion of the through DTI 82 on the side close to the wiring layer 79, whereas the pixel 50*b* is in an isolated state from the adjacent pixel 50*b* by the non-through DTI 121 on the side distant from the wiring layer 79, in other words, at the position of a side surface of the PD 71.

Therefore, even if the opening portion of the through DTI 82 is formed and the portion electrically conductive with the adjacent pixel 50*b* is provided, the effect of blooming can be reduced.

As described above, the P-type solid phase diffusion layer 83 and the non-through DTI 121 are formed in the opening portion of the through DTI 82, and the pixel 50*b* is connected with the adjacent pixel 50*b* via the P-type solid phase diffusion layer 83. Therefore, the adjacent pixel 50*b* can be in the electrically conductive state. Since the adjacent pixel 50*b* is electrically conductive, a GND contact region 96 may not be arranged in each pixel even in the second embodiment, as in the first embodiment. This will be described with reference to FIG. 14.

Figure 14:
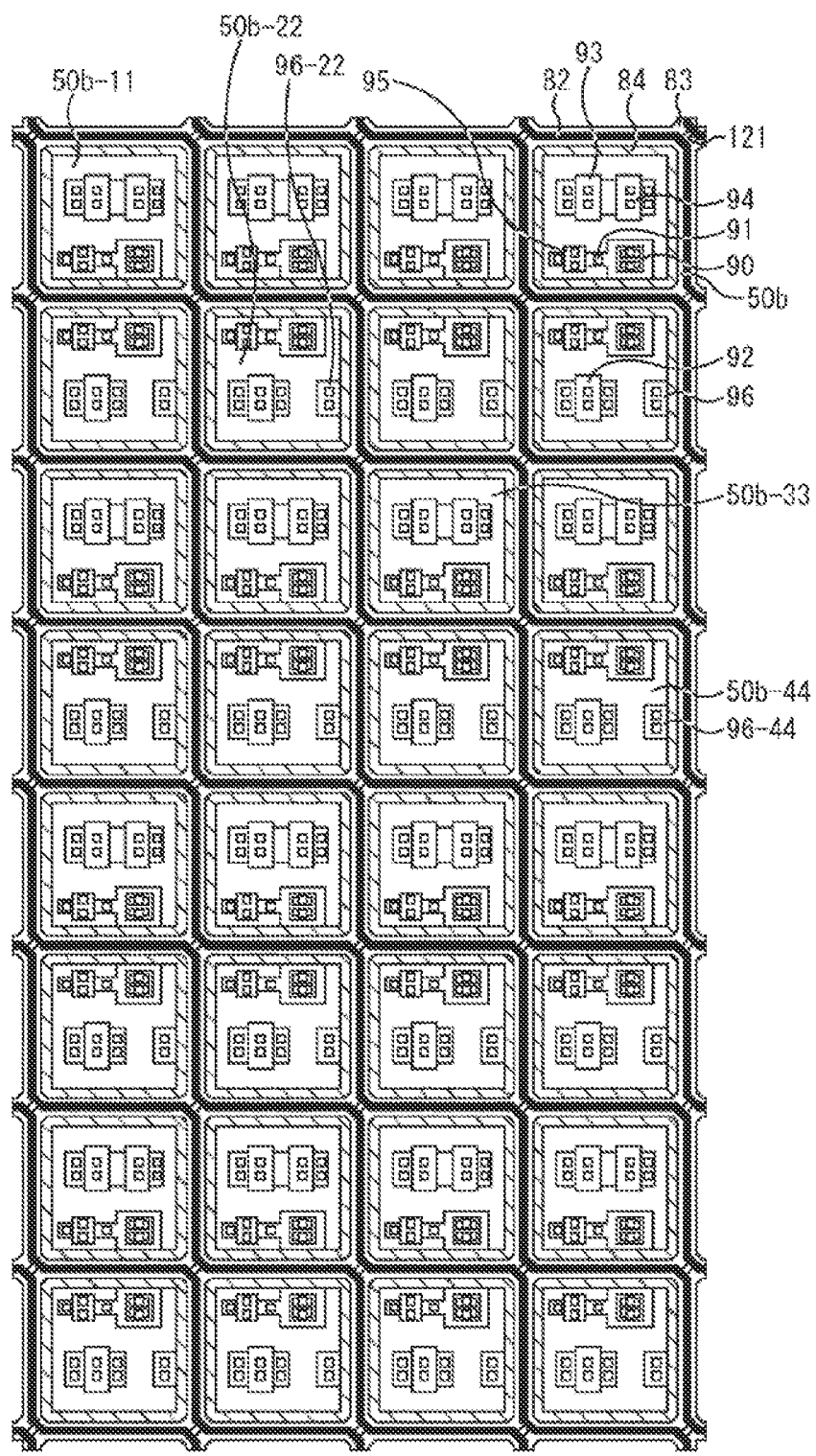
FIG. 14 is a diagram for describing sharing of a contact region.

FIG. 14 illustrates 4×8 thirty-two pixels 50*b* arranged in a pixel array unit 41. In FIG. 14, the pixel 50*b* arranged in the first row and first column is defined as a pixel 50*b*-11, the pixel 50*b* arranged in the second row and second column is defined as a pixel 50*b*-22, the pixel 50*b* arranged in the third row and third column is defined as a pixel 50*b*-33, and the pixel 50*b* arranged in the fourth row and fourth column is defined as a pixel 50*b*-44.

These pixels 50*b*-11, 50*b*-22, 50*b*-33, and 50*b*-44 are the pixels 50*b* arranged in one line in an oblique direction, as illustrated in FIG. 14. Furthermore, the pixels 50*b* arrayed in one line in the oblique direction are electrically conductive by the P-type solid phase diffusion layer 83 formed in the opening portions of the through DTI 82 but are isolated by the non-through DTI 121.

For example, the pixel 50*b*-11 and the pixel 50*b*-22 are electrically conductive by the P-type solid phase diffusion layer 83 formed in the lower right opening portion of the through DTI 82 in the pixel 50*b*-11 and in the upper left opening portion of the through DTI 82 in the pixel 50*b*-22, but are isolated by the non-through DTI 121.

Similarly, the pixel 50*b*-22 and the pixel 50*b*-33 are electrically conductive by the P-type solid phase diffusion layer 83 formed in the lower right opening portion of the through DTI 82 in the pixel 50*b*-22 and in the upper left opening portion of the through DTI 82 in the pixel 50*b*-33, but are isolated by the non-through DTI 121.

Moreover, similarly, the pixel 50*b*-33 and the pixel 50*b*-44 are electrically conductive by the P-type solid phase diffusion layer 83 formed in the lower right opening portion of the through DTI 82 in the pixel 50*b*-33 and in the upper left opening portion of the through DTI 82 in the pixel 50*b*-44, but are isolated by the non-through DTI 121.

As described above, since the pixels 50*b* adjacent in the oblique direction are electrically conductive, the GND contact region 96 for fixing a potential of a Pwell region 77 needs not be provided in each pixel 50*b*. In FIG. 14, a GND contact region 96-22 is formed in the pixel 50*b*-22 but no GND contact region 96 is formed in the pixel 50*b*-11, of the electrically conductive pixel 50*b*-11 and pixel 50*b*-22. In this case, the pixel 50*b*-11 and the pixel 50*b*-22 are configured to share the GND contact region 96-22, and the Pwell potential of the pixel 50*b*-11 is fixed by the GND contact region 96-22 in the pixel 50*b*-22.

Furthermore, similarly, in FIG. 14, a GND contact region 96-44 is formed in the pixel 50*b*-44 but no GND contact region 96 is formed in the pixel 50*b*-33, of the electrically conductive pixel 50*b*-33 and pixel 50*b*-44. In this case, the pixel 50*b*-33 and the pixel 50*b*-44 are configured to share the GND contact region 96-44, and the Pwell potential of the pixel 50*b*-33 is fixed by the GND contact region 96-22 in the pixel 50*b*-44.

Figure 15:
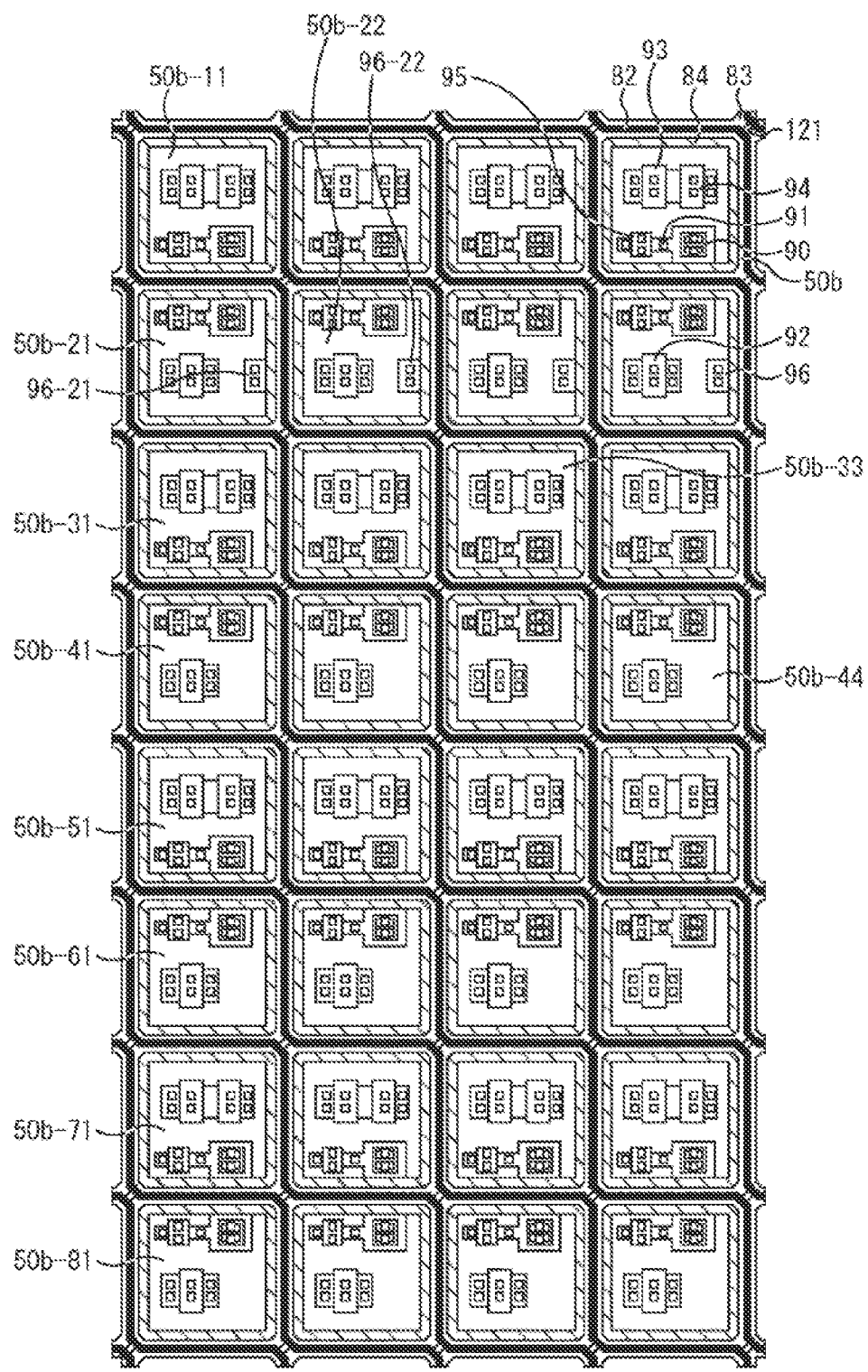
FIG. 15 is a diagram for describing sharing of a contact region.

In the example illustrated in FIG. 14, the configuration in which two pixels share the GND contact region 96 is adopted. However, as illustrated in FIG. 15, a configuration in which eight pixels 50*b* share the GND contact region 96 may be adopted. The configuration illustrated in FIG. 15 is a configuration example in which eight pixels 50*b* share one GND contact region 96.

Referring to FIG. 15, the GND contact region 96-22 is formed only in the pixel 50*b*-22 among the pixel 50*b*-11, the pixel 50*b*-22, the pixel 50*b*-33, and the pixel 50*b*-44 arrayed in one line in the oblique direction. Although not illustrated, a pixel 50*b*-55, a pixel 50*b*-66, a pixel 50*b*-77, and a pixel 50*b*-88 are also formed in an obliquely downward direction of the pixel 50*b*-44, and the GND contact region 96-22 is formed only in the pixel 50*b*-22 among the eight pixels 50*b*.

Here, focusing on the pixel 50*b*-11, a pixel 50*b*-21, a pixel 50*b*-31, a pixel 50*b*-41, a pixel 50*b*-51, a pixel 50*b*-61, a pixel 50*b*-71, and a pixel 50*b*-81 arrayed in the vertical direction in FIG. 15. The GND contact region 96 is formed only in the pixel 50*b*-21 among the eight pixels 50*b* of the pixel 50*b*-11 to the pixel 50*b*-81.

In other words, the GND contact region 96 is not in the pixels 50*b* respectively arranged in the first row where the pixel 50*b*-11 is arranged, the third row where the pixel 50*b*-31 is arranged, the fourth row where the pixel 50*b*-41 is arranged, the fifth row where the pixel 50*b*-51 is arranged, the sixth row where the pixel 50*b*-61 is arranged, the seventh row where the pixel 50*b*-71 is arranged, and the eighth row where the pixel 50*b*-81 is arranged, but the GND contact region 96 is formed only in the pixel 50*b* arranged in the second row where the pixel 50*b*-21 is arranged. In still other words, the GND contact regions 96 are formed in every eight rows.

Therefore, as described above, when viewing the pixels 50b arranged in one line in the oblique direction, the GND contact region 96 is formed in one pixel 50b among the eight pixels 50b arranged in the oblique direction, and the GND contact region 96 is shared by the eight pixels 50b.

A configuration in which the GND contact region 96 is shared by four pixels 50b or shared by a number of pixels equal to or larger than eight pixels 50b can be adopted even in the second embodiment, as in the first embodiment. Furthermore, a configuration in which the GND contact region 96 is formed in one pixel 50b among the pixels 50b arranged in the oblique direction, in other words, in one pixel 50b among the electrically conductive pixels 50b, can be adopted.

In such a case, a configuration in which the GND contact region 96 is formed in the pixel 50b arranged in a predetermined line such as an uppermost line or a lowermost line among pixel lines of the pixel array unit 41 can be adopted.

As described above, the pixels 50b according to the second embodiment have the configuration in which the vertically arrayed two pixels 50b share the reset transistor 92, the amplification transistor 93, and the selection transistor 94, as described with reference to FIG. 12, and the obliquely arrayed pixels 50b share the GND contact region 96, as described with reference to FIGS. 14 and 15.

The pixels 50b described with reference to FIGS. 14 and 15 are described taking the case where the vertically arranged two pixels 50b share the transistors has been described as an example. However, the number of pixels that share the transistors is not limited to two, and may be four or eight.

Figure 16:
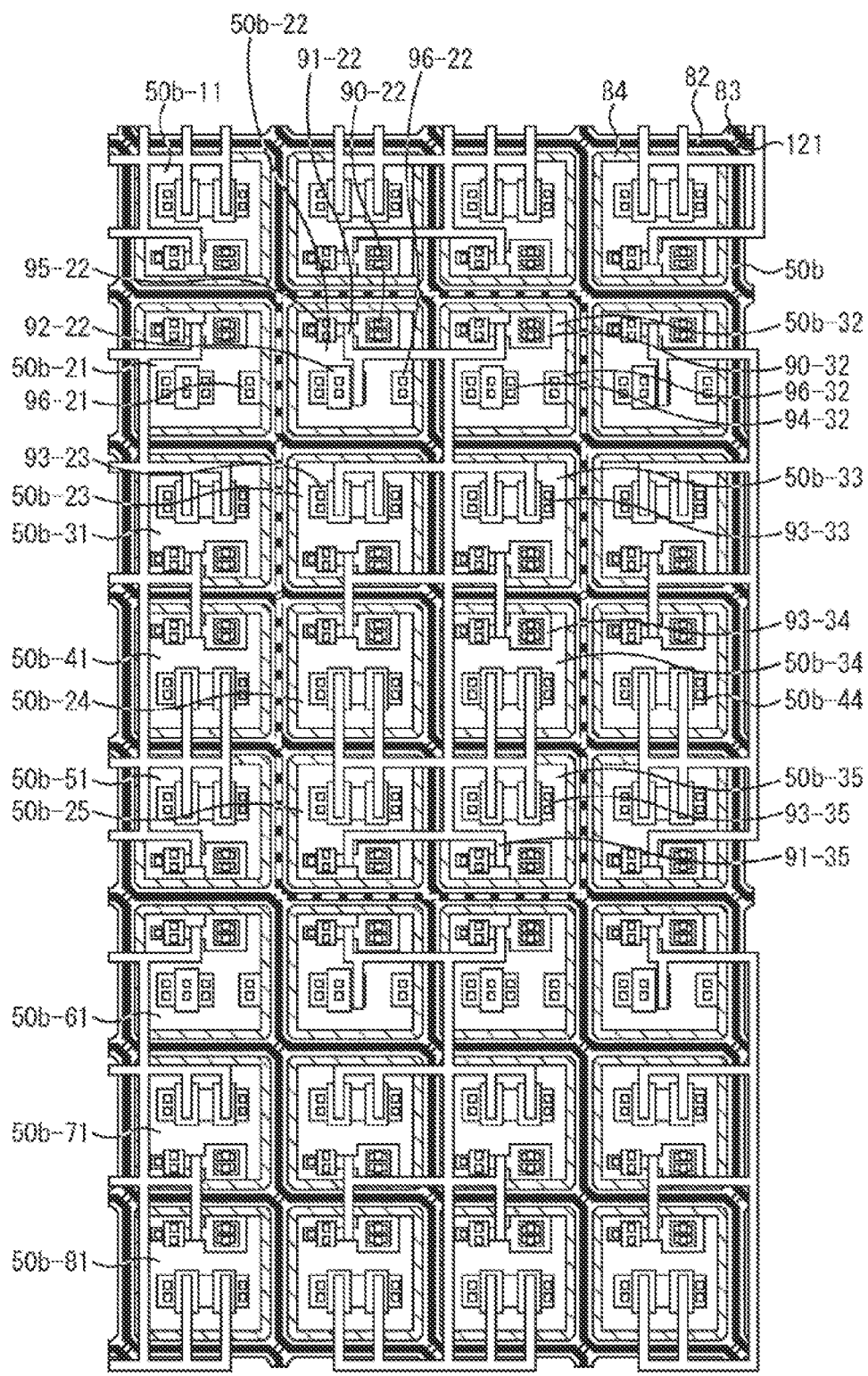
FIG. 16 is a diagram for describing sharing of a contact region.

FIG. 16 illustrates a configuration of a case where 2×4 eight pixels share the reset transistor 92, the amplification transistor 93, and the selection transistor 94. FIG. 16 illustrates 4×8 thirty-two pixels 50b arranged in the pixel array unit 41, as in FIG. 14.

The pixels in FIG. 16 illustrates an eight-pixel sharing case. For example, a total of eight pixels of four pixels including the pixel 50b-22, a pixel 50b-23, a pixel 50b-24, and a pixel 50b-25 arranged in the vertical direction and four pixels including a pixel 50b-32, the pixel 50b-33, a pixel 50b-34, and a pixel 50b-35 arranged on the right side make one sharing unit.

A reset transistor 92-22 is arranged in the pixel 50b-22, and a selection transistor 94-32 is arranged in the pixel 50b-32. The reset transistor 92-22 and the selection transistor 94-32 are transistors shared by eight pixels. The amplification transistor 93 is provided for each pixel 50b.

An amplification transistor 93-22 is arranged in the pixel 50b-22, an amplification transistor 93-23 is arranged in the pixel 50b-23, an amplification transistor 93-24 is arranged in the pixel 50b-24, and an amplification transistor 93-25 is arranged in the pixel 50b-25. Similarly, an amplification transistor 93-32 is arranged in the pixel 50b-32, an amplification transistor 93-33 is arranged in the pixel 50b-33, an amplification transistor 93-34 is arranged in the pixel 50b-34, and an amplification transistor 93-35 is arranged in the pixel 50b-35.

These eight amplification transistors 93-22 to 93-35 are connected by wiring and function as one amplification transistor 93. Therefore, the amplification transistor 93 can be formed large, a gate area becomes large, and random noise can be reduced.

Furthermore, similarly to the amplification transistor 93, an FD 91 is arranged in each pixel 50b in the one sharing unit, and the FDs 91 in the one sharing unit are connected by wiring. Furthermore, the transfer transistor 90 is also arranged in each pixel 50b in the one sharing unit.

Furthermore, the GND contact region 96 is shared by the pixels 50b arranged in the oblique direction. This point is similar to the case described with reference to FIGS. 14 and 15. The pixels 50b arranged in the oblique direction by the opening portion of the through DTI 82 are in the electrically conductive state and thus can be configured to share the GND contact region 96.

As described above, the present technology can be applied to the case where the transistors are shared by a plurality of pixels. Furthermore, with the configuration of sharing the transistors and the GND contact region 96, the region where elements are arranged can be made large, and an effect of suppressing random noise and the like can be obtained.

Referring again to the pixel 50b illustrated in FIG. 13, an example in which the P-type solid phase diffusion layer 83 is formed on the wiring layer 79 side of the non-through DTI 121 in the pixel 50b in FIG. 13 has been described. However, as illustrated in FIG. 17, a configuration in which the P-type solid phase diffusion layer 83 is formed near a middle of a pixel 50b' in an up-down direction in FIG. 17 may be adopted.

Figure 17:
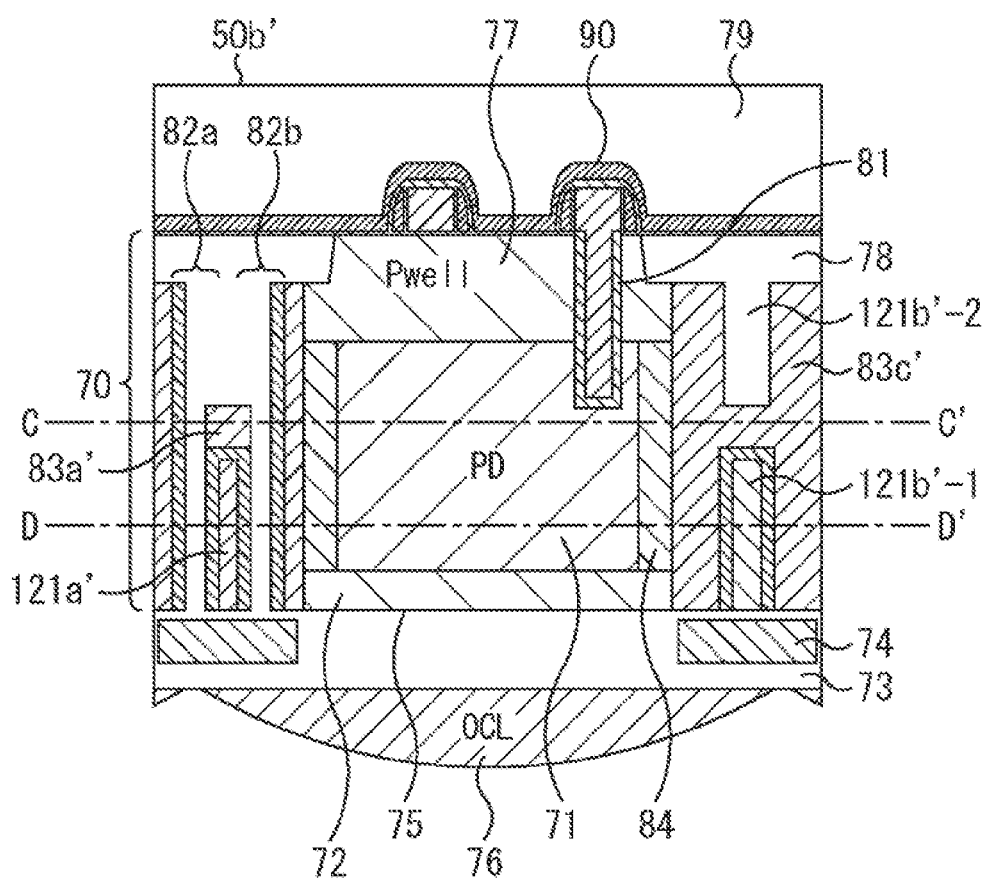
FIG. 17 is a vertical cross-sectional view of another configuration of the pixel of the second embodiment.

Referring to FIG. 17, a non-through DTI 121a' formed between the through DTI 82a and the through DTI 82b (in the opening portion of the through DTI 82) on the left side in FIG. 17 is formed up to a position lower than the middle position in a height direction of the pixel 50b', and a P-type solid phase diffusion layer 83a' is formed thereon. Therefore, the P-type solid phase diffusion layer 83a' is formed in a substantially central portion of an Si substrate 70.

A non-through DTI 12b'-1 and a non-through DTI 12b'-2 are formed on the right side in FIG. 17. A P-type solid phase diffusion layer 83c' is formed between the non-through DTI 12b'-1 and the non-through DTI 12b'-2. The P-type solid phase diffusion layer 83c' is formed in a substantially central portion of the Si substrate 70. In other words, the P-type solid phase diffusion layer 83c' is formed in a region sandwiched by the two DTIs of the non-through DTI 12b'-1 and the non-through DTI 12b'-2. The non-through DTI 12b'-1 and the non-through DTI 12b'-2 are formed by digging the Si substrate 70 from the back side and the front side, respectively.

As illustrated in FIG. 17, in the case where the P-type solid phase diffusion layer 83 is formed in the central portion of the Si substrate 70, of the opening portion of the through DTI 82, the through DTI 82a, the P-type solid phase diffusion layer 83a', and the through DTI 82b are arranged on the point C side and on the side close to the wiring layer 79 of the pixel 50b' when viewed in cross section (in plan view at the position of line segment C-C' in FIG. 17) near the center of the Si substrate 70. That is, the portion between the through DTI 82a and the through DTI 82b is an opening portion of the through DTI 82, and the P-type solid phase diffusion layer 83a' is formed in the opening portion.

In a case where the position corresponding to the position of line segment D-D' in the vertical cross-sectional view of the pixel 50b' in FIG. 17 is viewed in plan view, the through DTI 82a, the non-through trench 121a', and the through DTI 82b are arranged on the point D side and on the side distant from the wiring layer 79 of the pixel 50b'. That is, the portion between the through DTI 82a and the through DTI 82b is an opening portion of the through DTI 82, and the non-through DTI 121a' is formed in the opening portion. Furthermore, in the plane corresponding to the position of line segment D-D', the non-through DTI 121b'-1 surrounded by the P-type solid phase diffusion layer 83c' is arranged on the point D' side and on the side distant from the wiring layer 79 of the pixel 50b'.

Even in the case of the pixel 50b' illustrated in FIG. 17, the non-through DTI 121' is formed in the opening portion of the through DTI 82, as in the pixel 50b illustrated in FIG. 13. Therefore, the pixel 50b' is in an electrically conductive state with an adjacent pixel 50b' by the P-type solid phase diffusion layer 83' at the opening portion of the through DTI 82 on the side close to the wiring layer 79, whereas the pixel 50b' is in an isolated state from the adjacent pixel 50b' by the non-through DTI 121' on the side distant from the wiring layer 79, in other words, at the position of the side surface of the PD 71.

Therefore, even if the opening portion of the through DTI 82 is formed and the portion electrically conductive with the adjacent pixel 50b is provided, the effect of blooming can be reduced.

Configuration Example of Pixel in Third Embodiment

Figure 18:
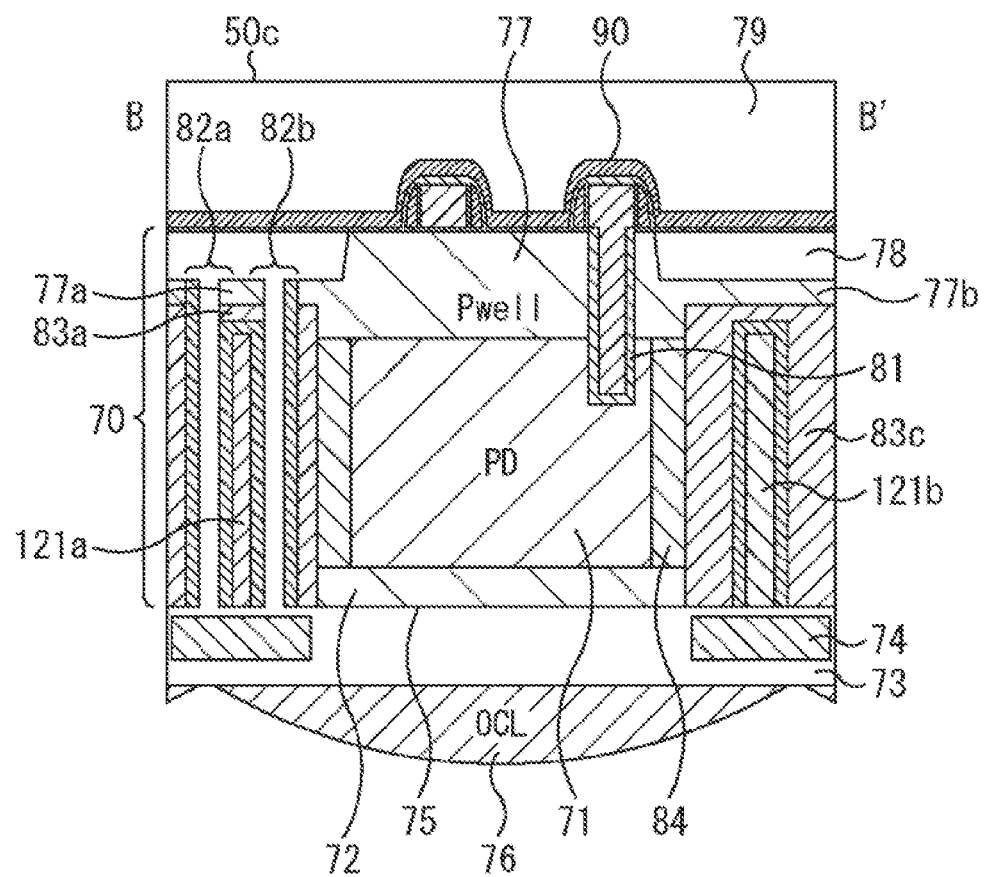
FIG. 18 is a vertical cross-sectional view of a configuration of a pixel of a third embodiment.

FIG. 18 is a vertical cross-sectional view of a pixel 50c in a third embodiment of the pixel 50 to which the present technology is applied.

The third embodiment is different from the second embodiment in that a P-type solid phase diffusion layer 83 is not formed on a shallow side (a wiring layer 79 side) of an Si substrate 70 and is similar to the second embodiment in other configurations. The similar portions are denoted by the same reference numerals and description is appropriately omitted.

Referring to the left side in FIG. 18, a P-type solid phase diffusion layer 83a is formed on a non-through DTI 121a in FIG. 18 (on a wiring layer 79 side), and an active region 77a is formed on the P-type solid phase diffusion layer 83a. In other words, the P-type solid phase diffusion layer 83a formed on the non-through DTI 121a is formed thin and is not formed on an STI 78 side.

Similarly, referring to the right side in FIG. 18, a P-type solid phase diffusion layer 83c is formed on a non-through DTI 121b in FIG. 18 (on the wiring layer 79 side), and an active region 77b is formed on the P-type solid phase diffusion layer 83c. In other words, the P-type solid phase diffusion layer 83b formed on the non-through DTI 121b is formed thin and is not formed on the STI 78 side.

As described above, the P-type solid phase diffusion layer 83 formed on the non-through DTI 121 is formed at a position separated from an interface between the active region 77 and the wiring layer 79, so that the P-type solid phase diffusion layer 83 is less likely to affect a voltage Vth and diffusion layer leakage of pixel transistors (such as a transfer transistor 90 and an amplification transistor 93), and the degree of freedom of a layout of the pixel transistors can be improved.

Configuration Example of Pixel in Fourth Embodiment

Figure 19:
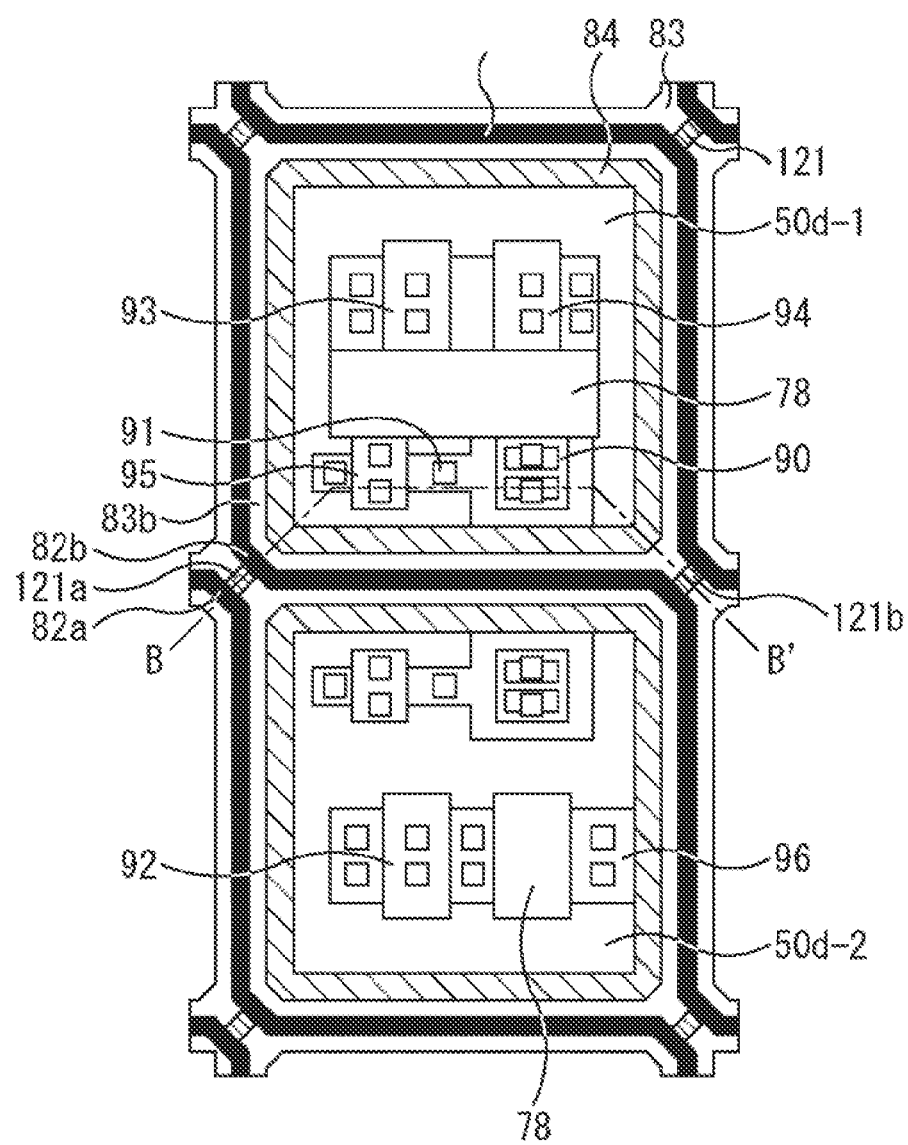
FIG. 19 is a plan view of a configuration of a pixel of a fourth embodiment.
Figure 20:
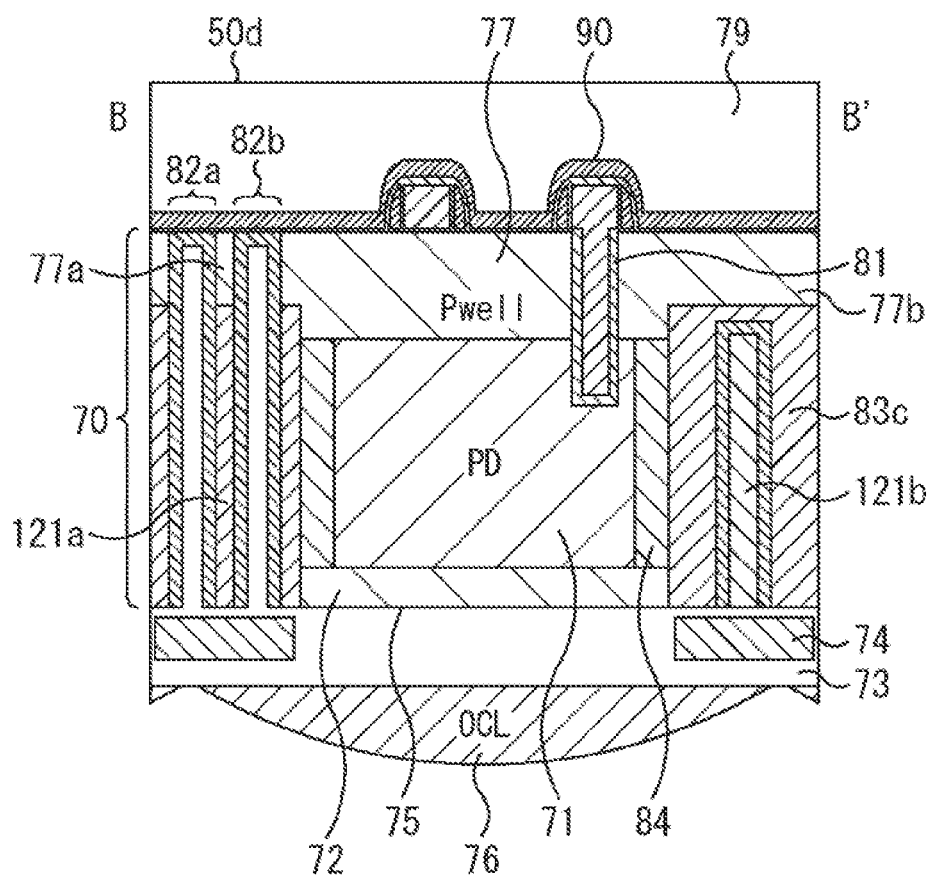
FIG. 20 is a vertical cross-sectional view of the configuration of the pixel of the fourth embodiment.

FIG. 19 is a plan view of a front side of a pixel 50d in a fourth embodiment of the pixel 50 to which the present technology is applied, and FIG. 20 is a vertical cross-sectional view of the pixel 50d. FIG. 20 corresponds to the position of line segment B-B' in FIG. 19.

The fourth embodiment is different from the second or third embodiment in that a non-through DTI 121 is formed under an active region 77, in other words, the non-through DTI 121 is formed at a position not under an STI 78 and is similar to the second or third embodiment in other configurations. The similar portions are denoted by the same reference numerals and description is appropriately omitted.

Referring to FIG. 19, in a pixel 50d-1, an amplification transistor 93 and a selection transistor 94 are provided in an upper portion, and a conversion efficiency switching transistor 95 and a transfer transistor 90 are provided in a lower portion, and the STI 78 is formed therebetween. In a pixel 50d-2, the STI 78 is formed between a reset transistor 92 and a GND contact region 96.

Referring to the left side in the cross-sectional view in FIG. 20 (on a point B side in FIG. 19), a through DTI 82a and a through DTI 82b are formed up to a lower portion of a wiring layer 79, and an active region 77a is formed on a non-through DTI 121a formed between the through DTI 82a and the through DTI 82b. In other words, a P-type solid phase diffusion layer 83a and the active region 77a are formed between the non-through DTI 121a and the wiring layer 79.

Similarly, referring to the right side in the cross sectional view in FIG. 20 (a point B' side in FIG. 19), a P-type solid phase diffusion layer 83c and an active region 77b are formed on a non-through DTI 121b. In other words, the P-type solid phase diffusion layer 83c and the active region 77b are formed between the non-through DTI 121a and the wiring layer 79.

As described above, the P-type solid phase diffusion layer 83 formed on the non-through DTI 121 is formed at a position separated from an interface between the active region 77 and the wiring layer 79, so that the P-type solid phase diffusion layer 83 is less likely to affect a voltage Vth and diffusion layer leakage of pixel transistors (such as the transfer transistor 90 and the amplification transistor 93), and the degree of freedom of a layout of the pixel transistors can be improved.

Configuration Example of Pixel in Fifth Embodiment

Figure 21:
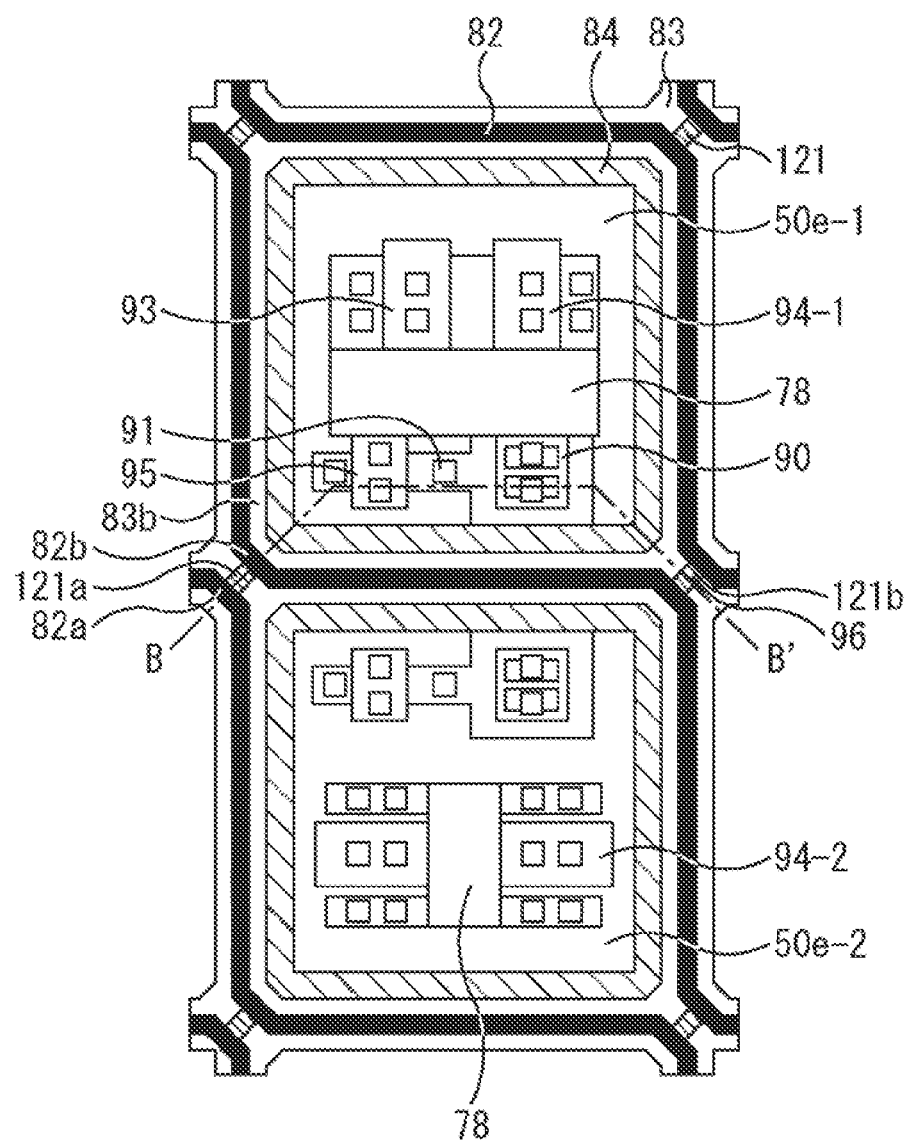
FIG. 21 is a plan view of a configuration of a pixel of a fifth embodiment.
Figure 22:
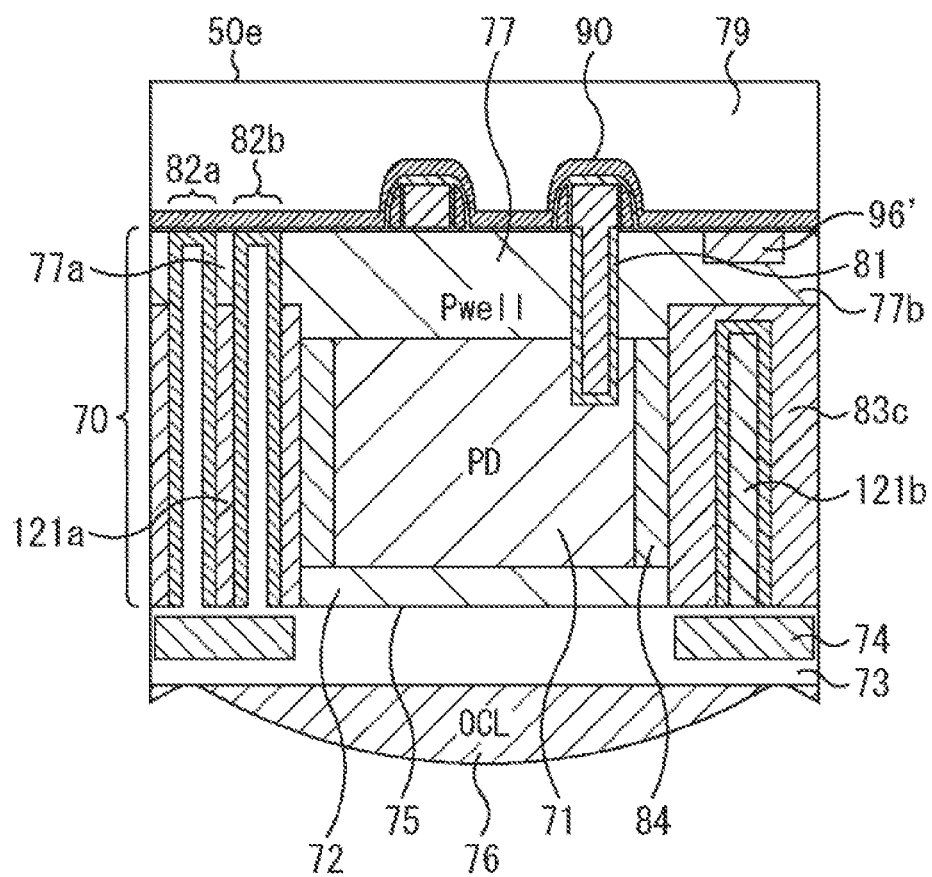
FIG. 22 is a vertical cross-sectional view of the configuration of the pixel of the fifth embodiment.

FIG. 21 is a plan view of a front side of a pixel 50e in a fifth embodiment of the pixel 50 to which the present technology is applied, and FIG. 22 is a vertical cross-sectional view of the pixel 50e. FIG. 22 corresponds to the position of line segment B-B' in FIG. 21.

The fifth embodiment is different from the fourth embodiment in that a GND contact region 96 is formed above a non-through DTI 121 and is similar to the fourth embodiment in other configurations. The similar portions are denoted by the same reference numerals and description is appropriately omitted.

Referring to a portion in the cross-sectional view of the pixel 50e illustrated in FIG. 22, the portion corresponding to a point B' side in the plan view of the pixel 50e illustrated in FIG. 21, a P-type solid phase diffusion layer 83c and an active region 77b are formed on a non-through DTI 121b, as in the pixel 50d in the fourth embodiment. Moreover, in the pixel 50e in the fifth embodiment, a P+ diffusion layer 96' is formed near an interface between the active region 77b and a wiring layer 79.

This P+ diffusion layer 96' is used as the GND contact region 96. That is, the GND contact region 96 is formed at the non-through DTI 121b. As described above, in the case where the GND contact region 96 is formed at the non-through DTI 121b, the non-through DTI 121 and the GND contact region 96 are formed at positions overlapping each other when viewed from above (below) in plan view, as illustrated in FIG. 21.

Furthermore, by forming the GND contact region 96 at the non-through DTI 121b, the GND contact region 96 needs not to be formed in a region where a PD 71 is formed. Therefore, for example, a selection transistor 94 can be arranged in the region. In the pixel 50e illustrated in FIG. 21, a selection transistor 94-1 is arranged in a pixel 50e-1 and a selection transistor 94-2 is arranged in a pixel 50e-2.

The region where the selection transistor 94-2 of the pixel 50e-2 is arranged is, for example, the region where the GND contact region 96 is arranged in the pixel 50d according to the fourth embodiment, referring to FIG. 19 again. Here, an example in which the selection transistor 94-2 is arranged is described but another transistor can be arranged.

As described above, by forming the GND contact region 96 at the non-through DTI 121b, more pixel transistors can be arranged. Furthermore, the pixel transistors can be larger although not illustrated. By configuring the pixel transistors to be large, noise can be reduced.

Configuration Example of Pixel in Sixth Embodiment

Figure 23:
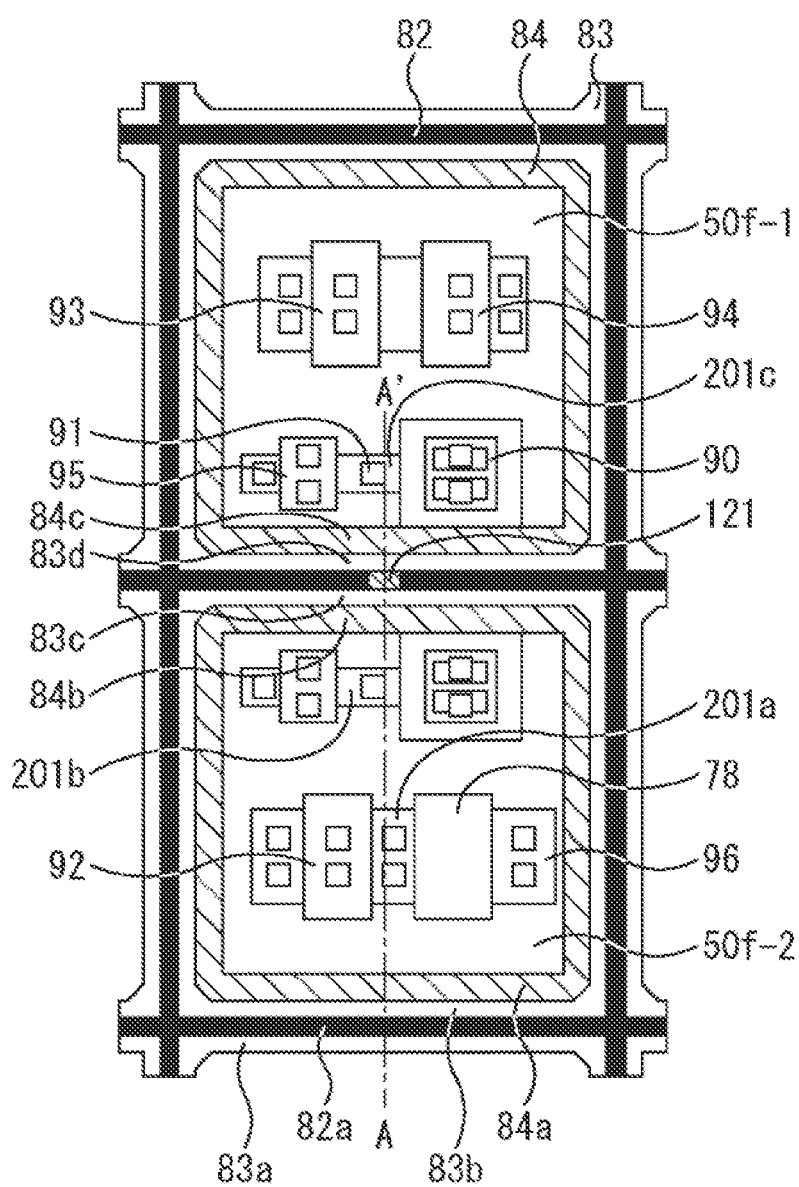
FIG. 23 is a plan view of a configuration of a pixel of a sixth embodiment.
Figure 24:
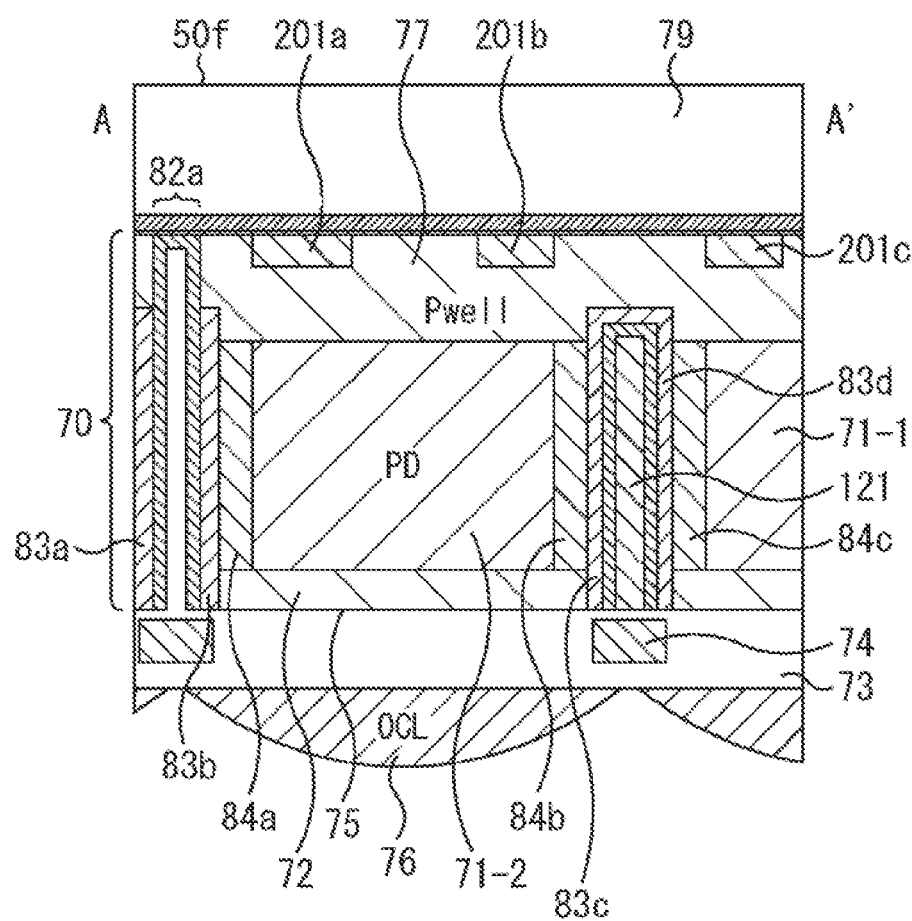
FIG. 24 is a vertical cross-sectional view of the configuration of the pixel of the sixth embodiment.

FIG. 23 is a plan view of a front side of a pixel 50f in a sixth embodiment of the pixel 50 to which the present technology is applied, and FIG. 24 is a vertical cross-sectional view of the pixel 50f. FIG. 24 corresponds to the position of line segment A-A' in FIG. 23.

The pixel 50f in the sixth embodiment is different from the first to fifth embodiments in that a non-through DTI 121 is formed in one side of the pixel 50f and is similar to the first to fifth embodiments in other configurations. The similar portions are denoted by the same reference numerals and description is appropriately omitted.

Note that, here, the description will be continued by taking an example in which the non-through DTI 121 is formed in a substantially central portion of a through DTI 82 formed in one side of the pixel 50f, but the non-through DTI 121 may be formed at a position off the center.

Referring to the plan view of the pixel 50f illustrated in FIG. 23, the through DTI 82 is formed to surround a pixel 50f-1 and a pixel 50f-2. Outer frames of the pixel 50f-1 and the pixel 50f-2 are completely surrounded by the through DTI 82. An opening portion is formed in a part of the through DTI 82 formed between the pixel 50f-1 and the pixel 50f-2, and the opening portion is formed using the non-through DTI 121.

Note that, here, the description will be continued by taking an example in which the non-through DTI 121 is formed in the opening portion of the through DTI 82 but a configuration in which the non-through DTI 121 is not formed in the opening portion of the through DTI 82 may be adopted.

In other words, the description will be continued by taking an example in which the non-through DTI 121 is formed in the opening portion of the through DTI 82, as in the pixel 50b according to the second embodiment. However, a configuration in which the non-through DTI 121 is not formed in the opening portion of the through DTI 82, and only a P-type solid phase diffusion layer 83 is formed can be adopted, as in the pixel 50a according to the first embodiment.

In the vertical cross-sectional view of the pixel 50f illustrated in FIG. 24, an N+ diffusion layer 201a, an N+ diffusion layer 201b, and N+ diffusion layer 201c are formed in an active region 77 near an interface with a wiring layer 79, and contacts are formed.

Furthermore, in the vertical cross-sectional view of the pixel 50f in FIG. 24, a P-type solid phase diffusion layer 83a, a through DTI 82a, a P-type solid phase diffusion layer 83b, and an N-type solid phase diffusion layer 84a are arranged in order on a point A side. The point A side is completely isolated from the adjacent pixel 50f by the through DTI 82.

In the vertical cross-sectional view of the pixel 50b illustrated in FIG. 24, in order from a PD 71-2 included in a pixel 50f-2, an N-type solid phase diffusion layer 84b, a P-type solid phase diffusion layer 83c, a non-through DTI 121, a P-type solid phase diffusion layer 83d, an N-type solid phase diffusion layer 84c, and a PD 71-1 included in the pixel 50f-1 are arranged on the point A' side.

The active region 77 is formed in the portion where the non-through DTI 121 is formed, and the pixel 50f-1 and pixel 50f-2 are in an electrically conductive state by the active region 77.

The pixel 50f according to the sixth embodiment has a configuration in which a GND contact region 96 is shared by the adjacent two pixels 50f. That is, as described with reference to FIG. 24, the pixel 50f-1 and the pixel 50f-2 illustrated in FIG. 23 are in the electrically conductive state in the active region 77 at the portion where the non-through DTI 121 is formed. Therefore, a Pwell potential of the active region 77 of the pixel 50f-1 and the pixel 50f-2 is fixed by the GND contact region 96 provided in the pixel 50f-2.

As described above, since a part of the through DTI 82 is formed as the non-through DTI 121, the pixel 50f and the adjacent pixel 50f are electrically conductive in the active region 77 at the portion of the non-through DTI 121. The pixel 50f is isolated from the adjacent pixel 50f by the non-through DTI 121 at the position of a side surface of the PD 71.

Therefore, even if an opening portion is formed in the through DTI 82 and a portion electrically conductive with the adjacent pixel 50b is provided, the effect of blooming can be reduced.

Configuration Example of Pixel in Seventh Embodiment

Figure 25:
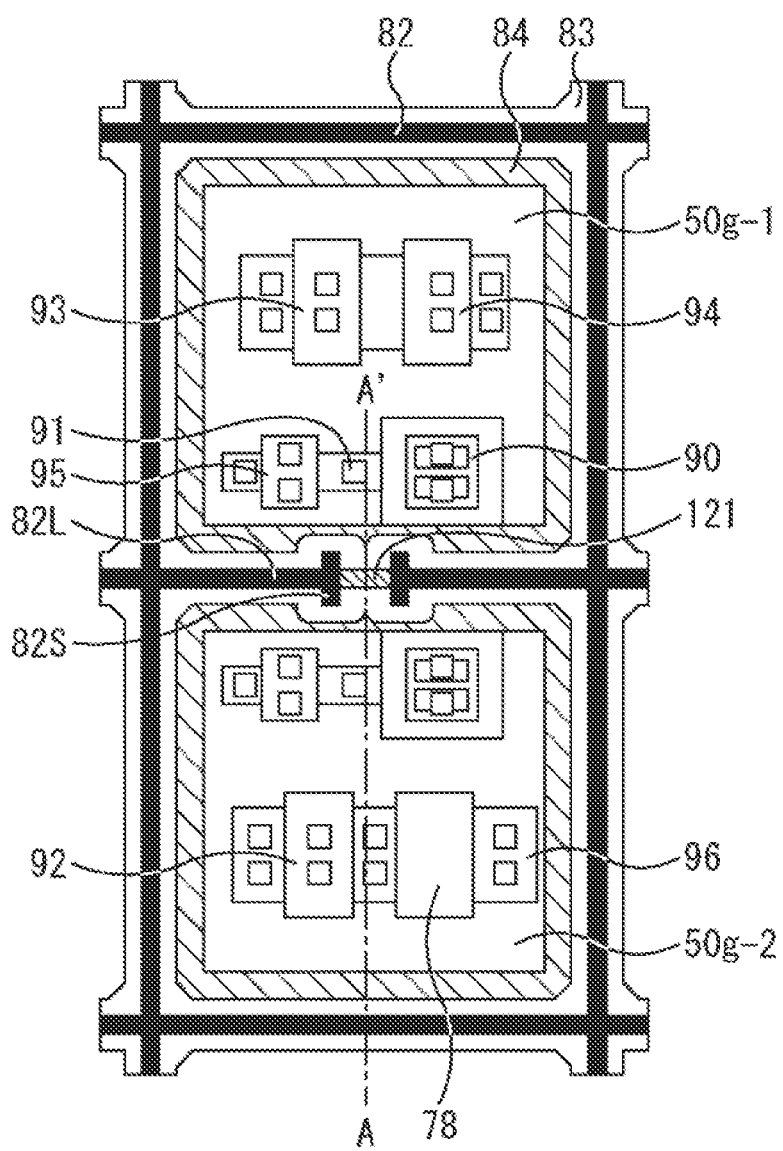
FIG. 25 is a plan view of a configuration of a pixel of a seventh embodiment.

FIG. 25 is a plan view of a front side of a pixel 50g in a seventh embodiment of the pixel 50 to which the present technology is applied.

The pixel 50g in the seventh embodiment is different from the sixth embodiment in a shape of a through DTI 82 of an opening portion of the through DTI 82 and is similar to the sixth embodiment in other configurations. The similar portions are denoted by the same reference numerals and description is appropriately omitted.

The through DTI 82 in the opening portion of the pixel 50g illustrated in FIG. 25 is formed in a T shape. The through DTI 82 in the opening portion of the through DTI 82 has a shape formed by a through DTI 82L linearly formed in a horizontal direction, and a through DTI 82S linearly formed in a vertical direction perpendicularly intersecting with the through DTI 82L.

The through DTI 82 in the opening portion of the through DTI 82 of the pixel 50f (FIG. 23) in the fifth embodiment has a shape formed only from the portion corresponding to the through DTI 82L, whereas the through DTI 82 in the opening portion of the through DTI 82 of the pixel 50g in the sixth embodiment has a shape formed from the through DTI 82L and the through DTI 82S.

By forming the through DTI 82S, solid phase diffusion is performed in the through DTI 82S when P-type solid phase diffusion is performed. Therefore, as illustrated in FIG. 25, a P-type solid phase diffusion layer 83 is formed in the region surrounding the through DTI 82S. In other words, the P-type solid phase diffusion layer 83 in the opening portion of the through DTI 82 can be formed large.

Furthermore, as illustrated in FIG. 25, the through DTI 82S and the through DTI 82S are formed to face each other. Therefore, even if the opening portion is formed large (long), the P-type solid phase diffusion layer 83 can be formed without disconnecting the region of the P-type solid phase diffusion layer 83.

As described above, in the pixel 50g according to the seventh embodiment, even in a case where the opening portion of the through DTI 82 is formed long, the opening portion can be surrounded by the P-type solid phase diffusion layer 83, and the shape in which the concentration of the P-type layer can be easily secured can be adopted. Since the opening portion of the through DTI 82 can be made long, the degree of freedom of element arrangement can be increased.

Configuration Example of Pixel in Eighth Embodiment

Figure 26:
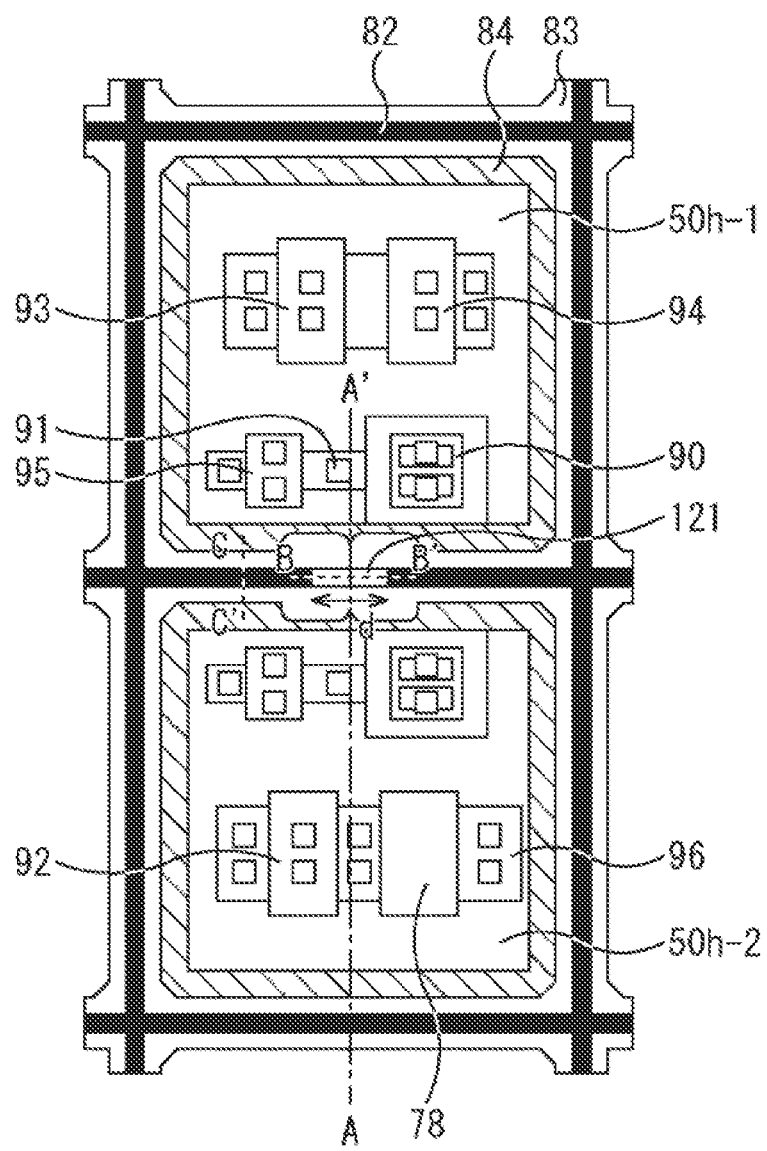
FIG. 26 is a plan view of a configuration of a pixel of an eighth embodiment.

FIG. 26 is a plan view of a front side of a pixel 50h in an eighth embodiment of the pixel 50 to which the present technology is applied.

The pixel 50h in the eighth embodiment has a shape having an opening portion in a central portion of a through DTI 82, as in the pixel 50f (FIG. 23) in the sixth embodiment, and a P-type solid phase diffusion layer 83 in the opening portion is formed large, as in the pixel 50g (FIG. 25) in the seventh embodiment.

In the pixel 50h in the eighth embodiment, the opening portion can be formed long and the P-type solid phase diffusion layer 83 can be formed large even if a through DTI 82S (FIG. 25) is not formed, by devising a step of forming the P-type solid phase diffusion layer 83.

Referring to the plan view of the pixel 50h illustrated in FIG. 26, outer frames of a pixel 50h-1 and a pixel 50h-2 have a shape completely surrounded by the through DTI 82. The opening portion is formed in a part of the through DTI 82 formed between the pixel 50h-1 and the pixel 50h-2, and the opening portion is formed using a non-through DTI 121. This opening portion is formed longer (with a wider opening) than the opening portion of the pixel 50f (FIG. 23).

The P-type solid phase diffusion layer 83 near the opening portion of the through DTI 82 of the pixel 50h is formed larger than the P-type solid phase diffusion layer 83 near the through DTI 82 in a portion other than the opening portion.

Figure 27:
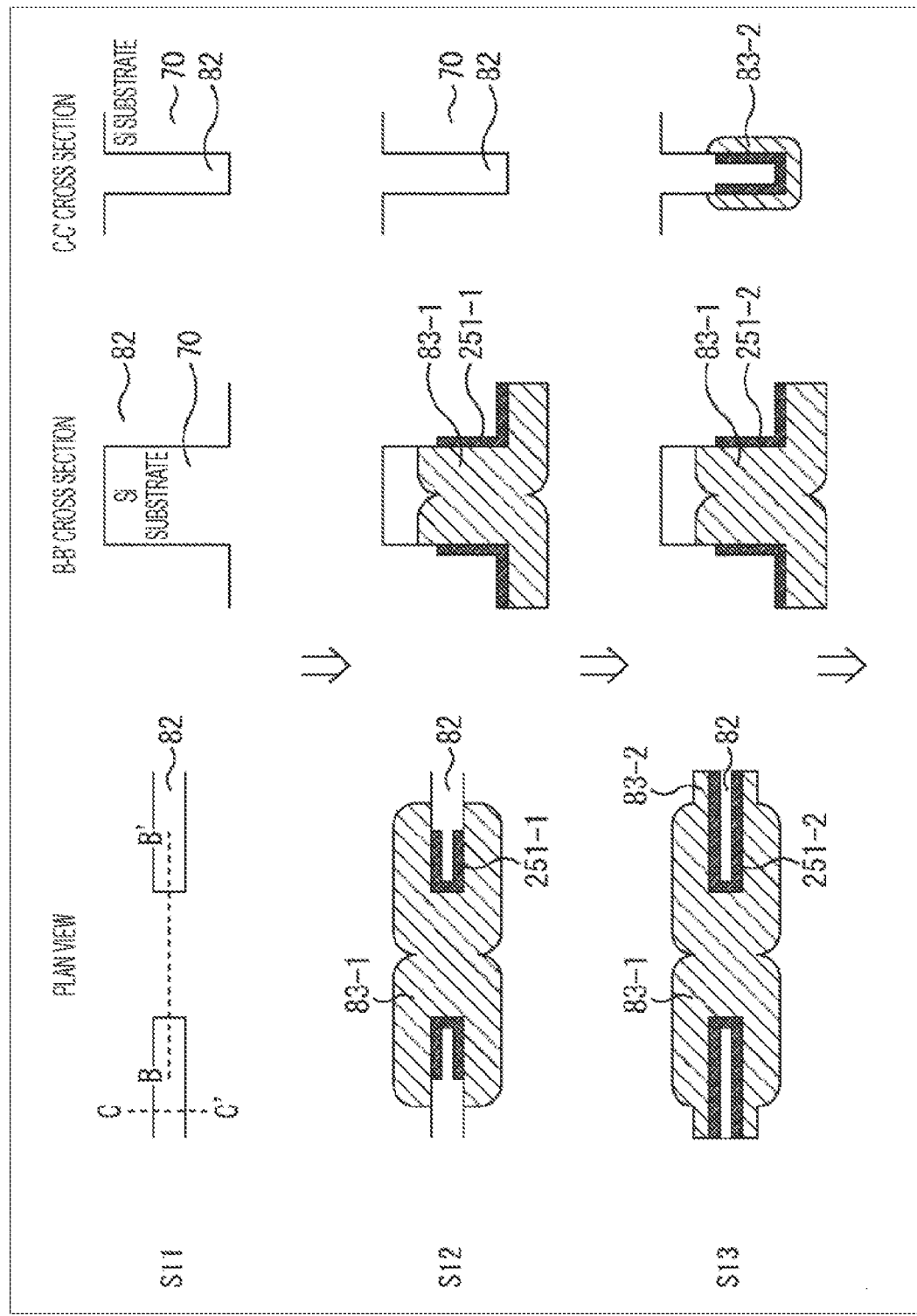
FIG. 27 is a diagram for describing formation of a P-type solid phase diffusion layer.
Figure 28:
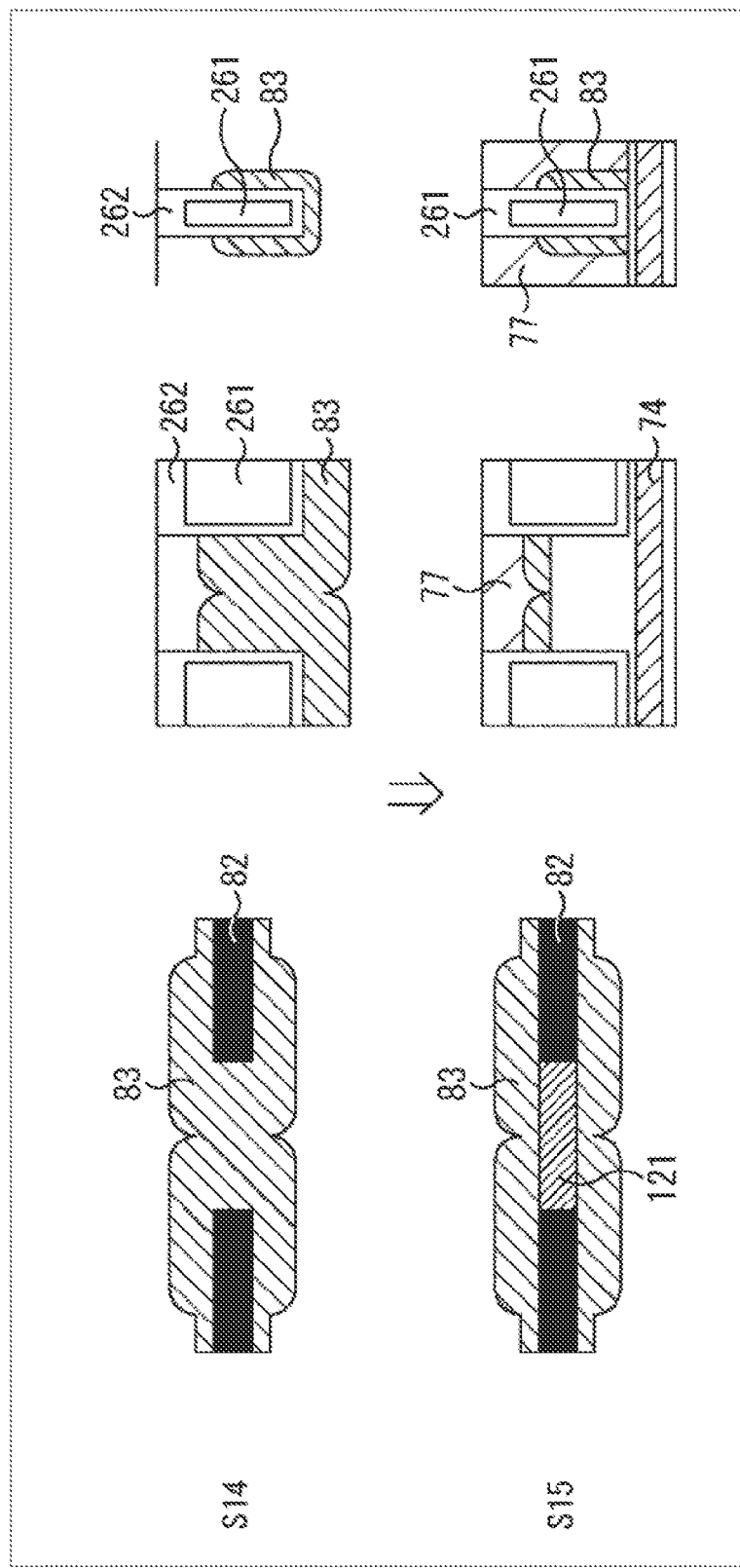
FIG. 28 is a diagram for describing formation of the P-type solid phase diffusion layer.

A manufacturing step when forming the P-type solid phase diffusion layer 83 near the opening portion of the through DTI 82 to be large will be described with reference to FIGS. 27 and 28. FIGS. 27 and 28 illustrate plan views of the opening portion in respective steps, cross-sectional views in line segment B-B', and cross-sectional views in line segment C-C'.

The step of manufacturing the P-type solid phase diffusion layer 83 near the opening portion of the through DTI 82 is basically similarly performed to the step of forming the P-type solid phase diffusion layer 83 described with reference to FIG. 11 but is different in repeating the step of forming the P-type solid phase diffusion layer 83 twice.

In step S11, a trench 82 is formed at a position where the through DTI 82 is formed by etching the Si substrate 70.

In step S12, a silicon oxide film (BSG) 251-1 containing boron (B) is deposited using an atomic layer deposition (ALD) method. Since boron (B) is used in the processing in step S12, the BSG film 251-1 is formed as a P-type film.

The BSG 251-1 is formed once on the entire side wall in the trench 82, and is then etched to leave only the BSG 251-1 at an end portion of the trench 82 (a portion where solid phase diffusion is to be performed), so that the BSG 251-1 is formed only on the end portion of the trench 82.

Note that processing of forming the N-type solid phase diffusion layer 84 is executed between step S11 and step S12, and the N-type solid phase diffusion layer 84 is formed. However, the manufacturing step and illustration are omitted.

In step S12, after the BSG film 251-1 is formed, heat diffusion processing is further executed. By annealing a wafer, boron (B) is solid-phase diffused from the BSG film 251-1 to the Si substrate 70 in a region where the BSG film 251-1 is in contact with the Si substrate 70. As a result, as illustrated in step S12 in FIG. 27, a P-type impurity region is formed. This P-type impurity region is a region to be the P-type solid phase diffusion layer 83 (in the step S12, a portion of a P-type solid phase diffusion layer 83-1).

After the heat diffusion processing is completed, the BSG film 251-1 is removed. The removal of the BSG film 251-1 can be performed by, for example, wet etching using hydrofluoric acid.

In step S13, similar processing to the processing in step S12 is executed. In step S13, a BSG film 251-2 is formed in the trench 82. The BSG film 251-2 formed in step S13 is formed on the entire side wall in the trench 82. Thereafter, as in step S12, the heat diffusion processing is performed to form a P-type impurity region. This P-type impurity region is a region to be the P-type solid phase diffusion layer 83 (in the step S13, a portion of a P-type solid phase diffusion layer 83-2).

As described above, at the opening portion of the through DTI 82, the solid phase diffusion processing for forming the P-type solid phase diffusion layer 83 is executed twice, so that the P-type solid phase diffusion layer 83 can be formed large at the opening portion, and the P-type solid phase diffusion layer 83 at a portion other than the opening portion can be formed with the same size as that in the above-described embodiments.

After the removal of the BSG film 251-1, in step S14 (FIG. 28), a polysilicon 261 and a silicon oxide film 262 are embedded in the trench 82. Note that the trench 82 may be filled with a metal such as tungsten, for example, in order to provide light shielding performance.

In step S15, unnecessary polysilicon deposited on the upper surface of the wafer is removed, and the pixel transistors, wiring, and the like are formed. Furthermore, the Si substrate 70 is thinned from the back side, and a light shielding film 74 and the like are formed after the thinning, so that the pixel 50h is manufactured.

As described above, in the pixel 50h according to the eighth embodiment, even in a case where the opening portion of the through DTI 82 is formed long, the opening portion can be surrounded by the P-type solid phase diffusion layer 83, and the shape in which the concentration of the P-type layer can be easily secured can be adopted. Since the opening portion of the through DTI 82 can be made long, the degree of freedom of element arrangement can be increased.

Configuration Example of Pixel in Ninth Embodiment

Figure 29:
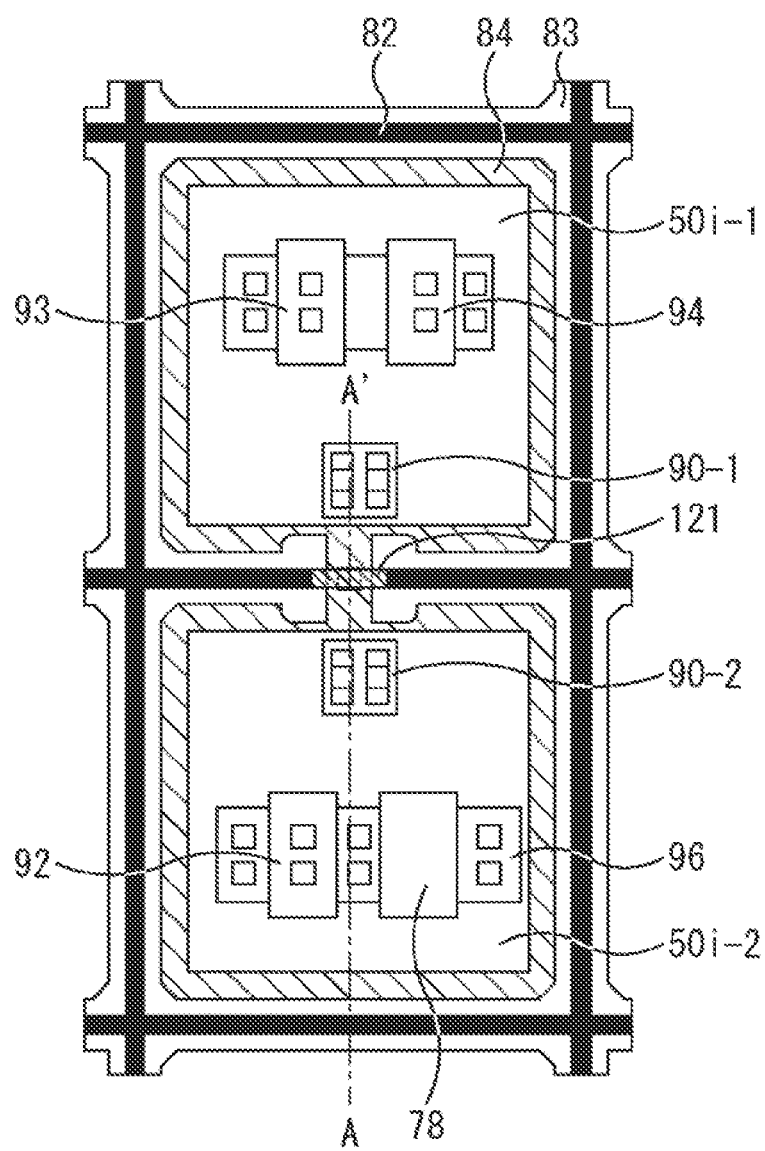
FIG. 29 is a plan view of a configuration of a pixel of a ninth embodiment.
Figure 30:
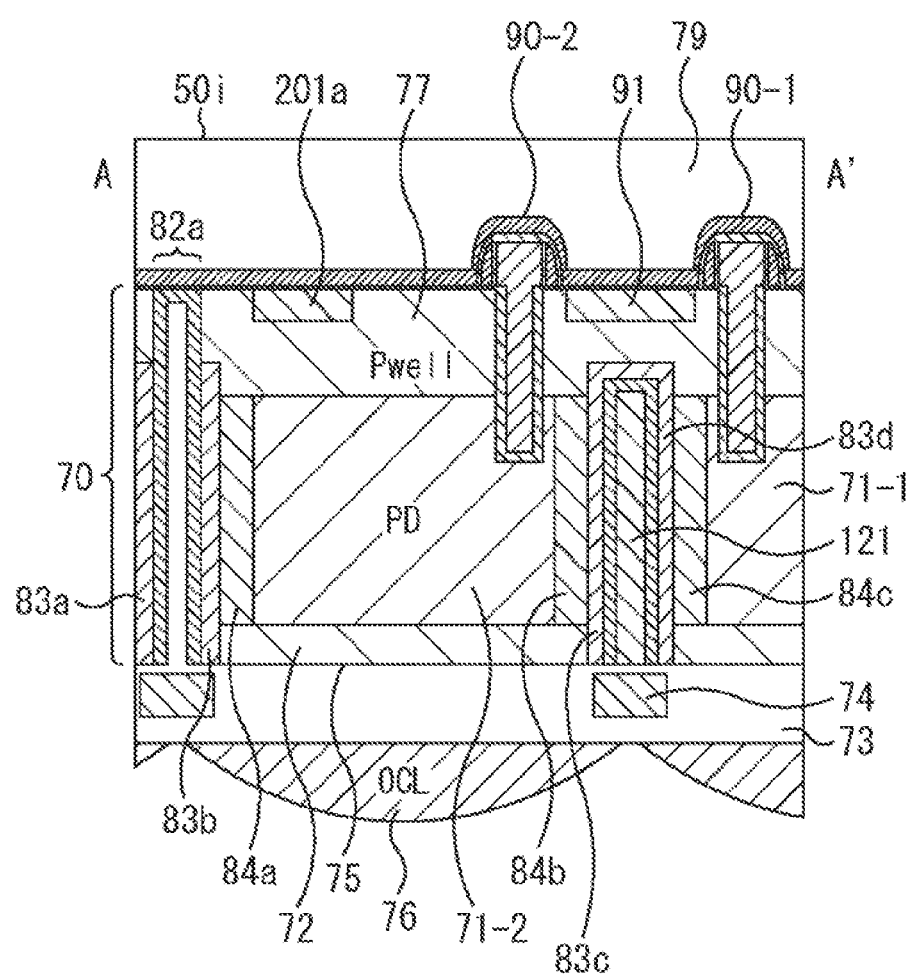
FIG. 30 is a vertical cross-sectional view of the configuration of the pixel of the ninth embodiment.

FIG. 29 is a plan view of a front side of a pixel 50i in a ninth embodiment of the pixel 50 to which the present technology is applied, and FIG. 30 is a vertical cross-sectional view of the pixel 50i. FIG. 30 corresponds to the position of line segment A-A' in FIG. 29.

The pixel 50i in the ninth embodiment has a shape having an opening portion in a central portion of a through DTI 82, as in the pixel 50h (FIG. 26) in the eighth embodiment, and the opening portion is formed long. The point that an FD 91 is arranged in the opening portion is different from the pixel 50h in the eighth embodiment, and other configurations are the same as the pixel 50h in the eighth embodiment.

Referring to the plan view of the pixel 50i in FIG. 29, the through DTI 82 formed between a pixel 50i-1 and a pixel 50i-2 has an opening portion in a central portion, and a non-through DTI 121 is formed in the opening portion. The FD diffusion layer 91 is formed in the non-through DTI 121. The FD diffusion layer 91 functions as a floating diffusion (FD).

The pixel 50i illustrated in FIG. 29 has a two-pixel sharing configuration, and the FD diffusion layer 91 is shared by the pixel 50i-1 and the pixel 50i-2. Transfer transistors 90 are arranged in both ends of the FD diffusion layer 91. A transfer transistor 90-1 is arranged in the pixel 50*i*-1, and a transfer transistor 90-2 is arranged in the pixel 50*i*-2.

Referring to FIG. 30, which is a cross-sectional view at the position of line segment A-A' in FIG. 29, the transfer transistor 90-2 having a vertical transistor trench is arranged in a PD 71-2 of the pixel 50*i*-2. Furthermore, the transfer transistor 90-1 having a vertical transistor trench is arranged in a PD 71-1 of the pixel 50*i*-1.

The FD diffusion layer 91 is formed between the transfer transistor 90-1 and the transfer transistor 90-2. Furthermore, the FD diffusion layer 91 is formed above the non-through DTI 121 (on a wiring layer 79 side).

As described above, by forming the FD diffusion layer 91 in the portion of the non-through DTI 121, a configuration in which the FD 91 is connected by wiring as in the first to eight embodiments may not be adopted. In the case of the configuration in which the FD 91 is connected by wiring, the FD capacitance tends to be large. However, as in the ninth embodiment, the FD diffusion layer 91 is formed in the portion of the non-through DTI 121 and no wiring is used, whereby the FD capacitance can be reduced and the conversion efficiency can be increased because the wiring is unnecessary. Improvement of an S/N ratio can be expected as change efficiency becomes high.

Configuration Example of Pixel in Tenth Embodiment

Figure 31:
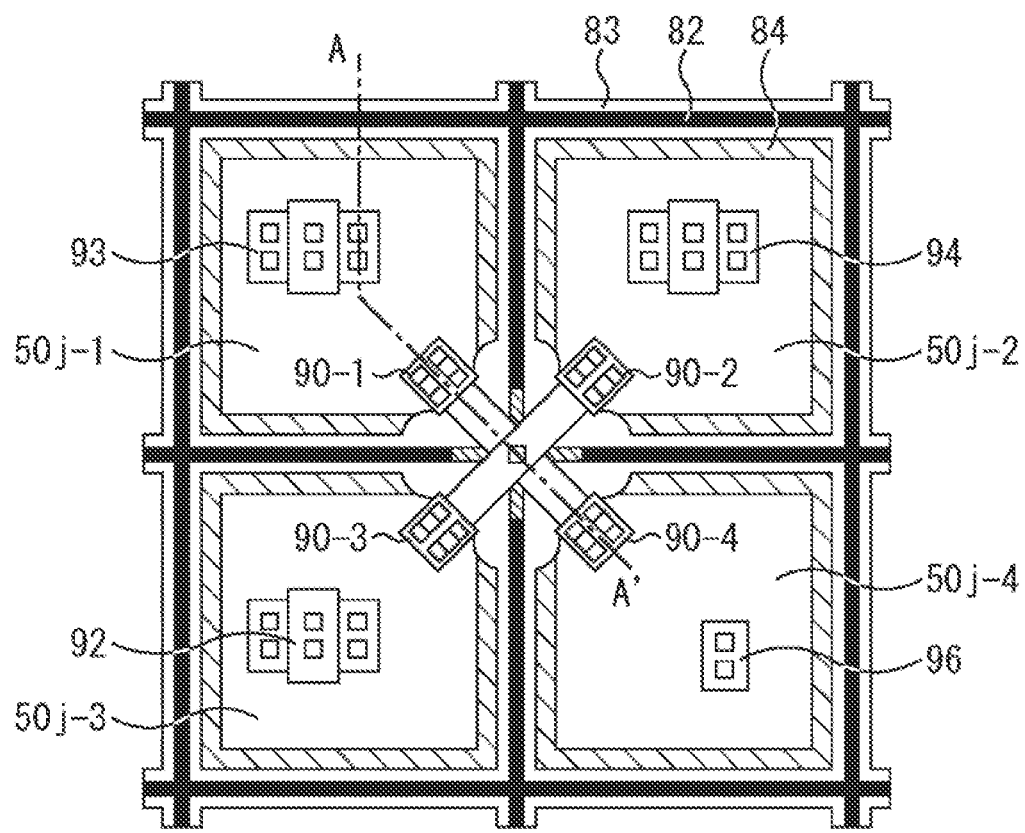
FIG. 31 is a plan view of a configuration of a pixel of a tenth embodiment.
Figure 32:
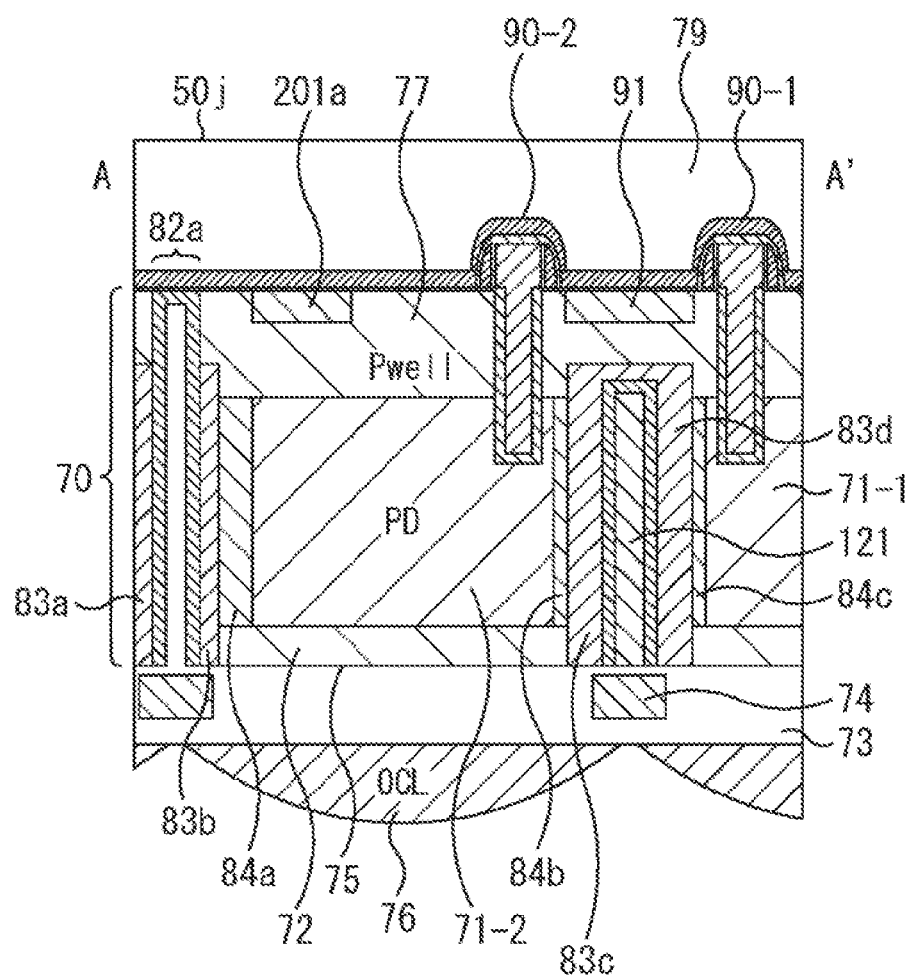
FIG. 32 is a vertical cross-sectional view of the configuration of the pixel of the tenth embodiment.

FIG. 31 is a plan view of a front side of a pixel 50*j* in a tenth embodiment of the pixel 50 to which the present technology is applied, and FIG. 32 is a vertical cross-sectional view of the pixel 50*j*. FIG. 32 corresponds to the position of line segment A-A' in FIG. 30.

The pixel 50*j* in the tenth embodiment is different from the first to ninth embodiments in having a 2×2 four-pixel sharing configuration.

Referring to FIG. 30, an amplification transistor 93 is arranged in a pixel 50*j*-1 shared by four pixels, a selection transistor 94 is arranged in a pixel 50*j*-2, and a reset transistor 92 is arranged in a pixel 50*j*-3, and a GND contact region 96 is arranged in a pixel 50*j*-4. Furthermore, transfer transistors 90-1 to 90-4 are respectively arranged in the pixels 50*j*-1 to 50*j*-4 near centers of the four pixels 50*i*.

Peripheries of the four pixels 50*j* shared by the four pixels are completely isolated by a through DTI 82. An opening portion is formed in the through DTI 82 formed among the pixels 50*j* shared by the four pixels, and a non-through DTI 121 is formed in the opening portion, as in the above-described embodiments. As illustrated in FIG. 31, a central portion of the pixels 50*j* shared by the four pixels is formed as the opening portion of the through DTI 82, and the non-through DTI 121 is formed in the opening portion.

Moreover, a P-type solid phase diffusion layer 83 is formed at the portion where the non-through DTI 121 is formed by the manufacturing step described with reference to FIGS. 27 and 28, so that a large P-type solid phase diffusion layer 83 is formed. Then, the transfer transistors 90 are connected by an FD diffusion layer 91 formed between the transfer transistors 90, as in the ninth embodiment.

In such a pixel 50*j* shared by the four pixels, the cross section at the position of line segment A-A' in FIG. 31 is as illustrated in FIG. 32. The configuration of the pixel 50*j* illustrated in FIG. 32 is similar to the configuration of the pixel 50*i* illustrated in FIG. 30. Note that, since the distance between the transfer transistor 90-1 and the transfer transistor 90-4 becomes long, the FD diffusion layer 91 is also formed long, and the width of the P-type solid phase diffusion layer 83 formed below the FD diffusion layer 91 is formed wide.

As described above, the pixel 50*j* having the four-pixel sharing configuration has the FD diffusion layer 91 formed in the portion of the non-through DTI 121, thereby reducing the FD capacitance, increasing the conversion efficiency, and improving the S/N ratio, as in the pixel 50*i* in the ninth embodiment.

Configuration Example of Pixel in Eleventh Embodiment

Figure 33:
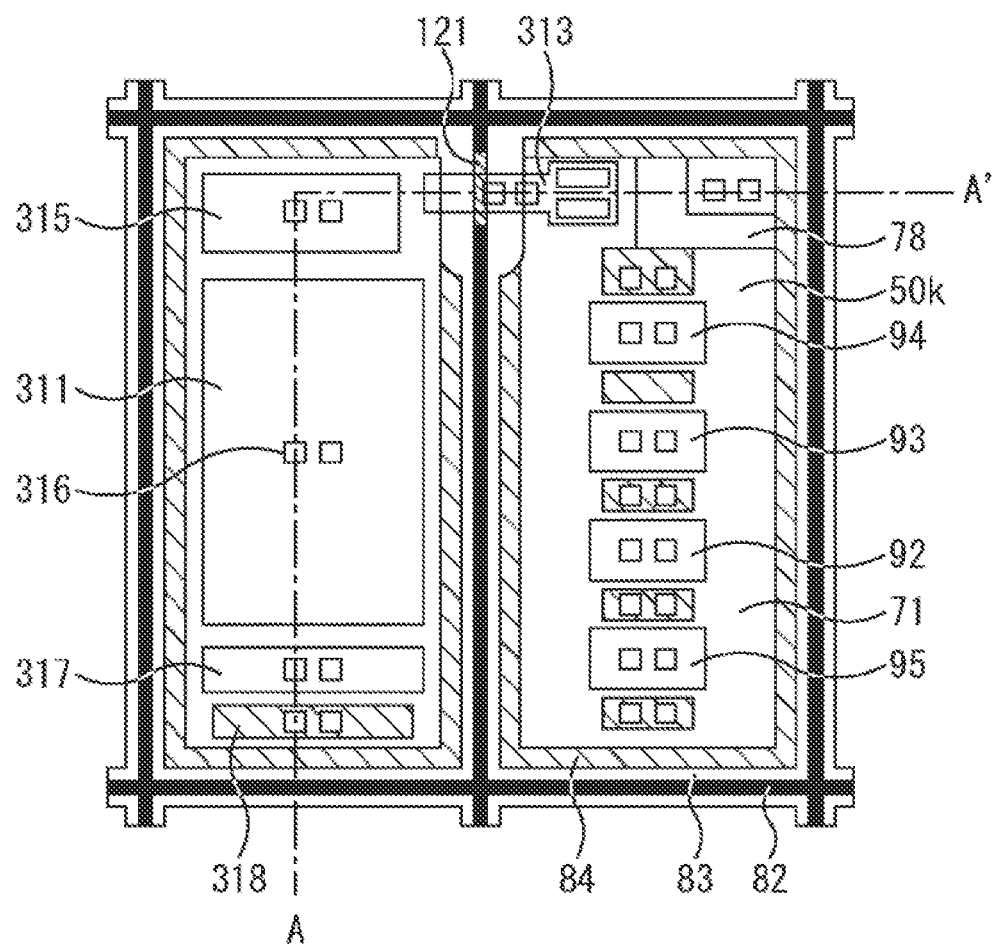
FIG. 33 is a plan view of a configuration of a pixel of an eleventh embodiment.
Figure 34:
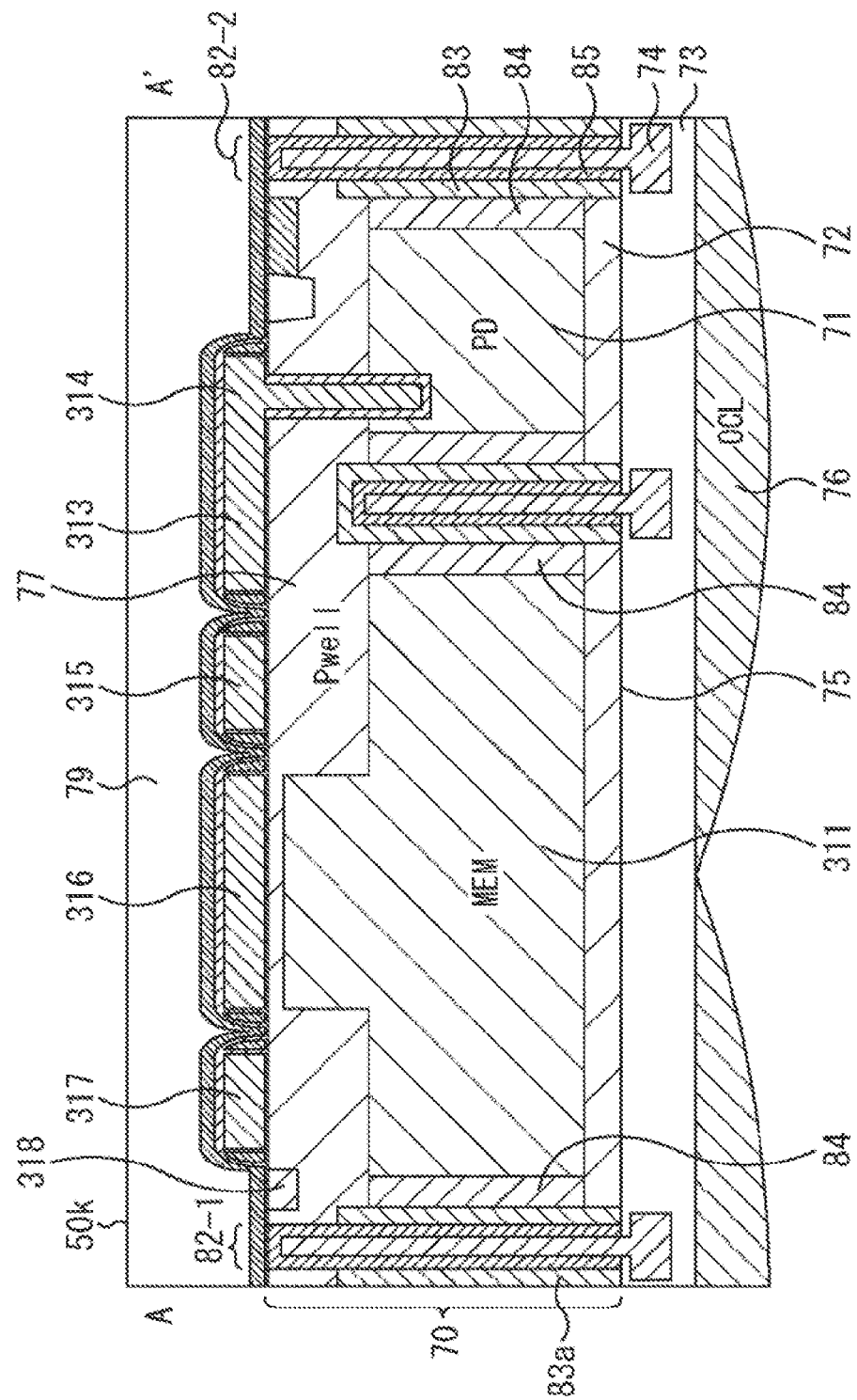
FIG. 34 is a vertical cross-sectional view of the configuration of the pixel of the eleventh embodiment.

FIG. 33 is a plan view of a front side of a pixel 50*k* in an eleventh embodiment of the pixel 50 to which the present technology is applied, and FIG. 34 is a vertical cross-sectional view of the pixel 50*k*. FIG. 34 corresponds to the position of line segment A-A' in FIG. 33.

The pixel 50*k* in the eleventh embodiment includes the above-described pixel 50 and a charge holding region (corresponding to a memory 311 to be described below). By providing the charge holding region, a global shutter can be implemented.

The pixels 50*a* to 50*j* in the first to tenth embodiments are back-illuminated sensors. In general, a CMOS image sensor adopts a rolling shutter system that sequentially reads out pixels, so that image distortion may occur due to a difference in exposure timing.

As a countermeasure against the occurrence of distortion, a global shutter method for simultaneously reading all pixels by providing a charge holding unit in a pixel has been proposed. According to the global shutter method, all the pixels become sequentially readable after the pixels are simultaneously read in the charge holding unit. Therefore, the exposure timing can be common to all the pixels and pixel distortion can be suppressed.

In the pixel 50*k*, a PD 71 and the memory 311 are formed in an Si substrate 70. The memory 311 is a region having high N-type impurity concentration like the PD 71. The memory 311 is provided as the charge holding unit that temporarily holds a charge photoelectrically converted by the PD 71.

The pixel 50*k* is surrounded by a through DTI 82 formed to penetrate the Si substrate 70 in a depth direction, as in the other embodiments, for example, the pixel 50*a* illustrated in FIG. 3. In the pixel 50*k* illustrated in FIG. 33, a through DTI 82-1 is formed on the left side and a through DTI 82-2 is formed on the right side, but as illustrated in the plan view in FIG. 33, the through DTI 82 is formed to surround the pixel 50*a* (the region including the PD 71 and the memory 311).

A P-type solid phase diffusion layer 83 and an N-type solid phase diffusion layer 84 are formed in the through DTI 82 formed to surround the pixel 50*a*, as in the other embodiments. The P-type solid phase diffusion layer 83 and the N-type solid phase diffusion layer 84 form a strong electric field region. Therefore, an effect of preventing deterioration of the Dark characteristic can be obtained, as in the above-described embodiments.

Between the PD 71 and the memory 311, the through DTI 82 and a non-through DTI 121 are provided. A part of the through DTI 82 is formed as an opening portion, and the non-through DTI 121 is formed not to penetrate the Si substrate 70 in the depth direction in the opening portion. The non-through DTI 121 is formed to be non-through, unlike the through DTI 82 formed to surround the pixel 50*k*. In other words, the non-through DTI 121 formed between the PD 71 and the memory 311 is a trench that is dug in a state where a Pwell region 77 remains on an upper part (an upper part in FIG. 34).

A readout gate 313 is formed above the non-through DTI 121 formed to be non-through. The readout gate 313 includes a vertical transistor trench 314, and the vertical transistor trench 314 is formed up to a position reaching an inside of the PD 71. That is, the readout gate 313 for reading the charge from the PD 71 is formed in vertical and horizontal directions with respect to the PD 71, and the readout gate 313 (vertical transistor trench 314) formed in the vertical direction is formed to come in contact with the PD 71.

Note that, here, the description will be continued by taking the example in which the vertical transistor trench 314 reaches the inside of the PD 71. However, the vertical transistor trench 314 and the PD 71 may be formed to be in contact with each other or may be formed not to be in contact with each other (with a small distance). This similarly applies to other vertical transistor trenches.

A transfer gate 315 is formed in a region adjacent to the readout gate 313, and a write gate 316 is further formed in a region adjacent to the transfer gate 315. As illustrated in FIG. 34, a part of the memory 311 is formed to a position close to a wiring layer 97, so that the write gate 316 has a shape not including a vertical transistor trench. The memory 311 can have a configuration not formed near the surface of the Si substrate 70, as in the PD 71. In such a configuration, the write gate 316 has a configuration including a vertical transistor trench.

The charge accumulated in the PD 71 is read by the readout gate 313, and the read charge is written in the memory 311 by the write gate 316. To enable such processing, in other words, to provide the region where the readout gate 313 and the write gate 316 are formed, the non-through DTI 121 has the shape not penetrating the Si substrate 70. Furthermore, the P-type solid phase diffusion layer 83 is formed in the non-through DTI 121.

The transfer gate 315 is formed in the region adjacent to the write gate 316. The charge written (stored) in the memory 311 is read out by the transfer gate 315 and transferred to an FD diffusion layer 318.

By providing the non-through DTI 121 between the PD 71 and the memory 311 in this manner, flowing of the charge from the PD 71 into the memory 311 can be prevented. Furthermore, the readout gate 313 can be formed in the portion of the non-through DTI 121, and the charge can be transferred from the PD 71 to the memory 311.

Furthermore, since the P-type solid phase diffusion layer 83 and the N-type solid phase diffusion layer 84 are formed in the through DTI 82 and the non-through DTI 121, respectively, and the strong electric field region by PN junction of the P-type solid phase diffusion layer 83 and the N-type solid phase diffusion layer 84 is formed, an electric field can be secured and a saturation signal amount Qs can be improved. Since the portion where the non-through DTI 121 is formed has the P-type solid phase diffusion layer 83 from the through DTI 82, the ping can be prevented from coming off at a sidewall interface of the non-through DTI 121, and deterioration of dark current and white point due to electrons generated at the interface can be suppressed.

Therefore, the pixel 50k according to the eleventh embodiment improves the saturation signal amount Qs and can implement a global shutter in which the dark current and white point do not deteriorate.

Configuration Example of Pixel in Twelfth Embodiment

Figure 35:
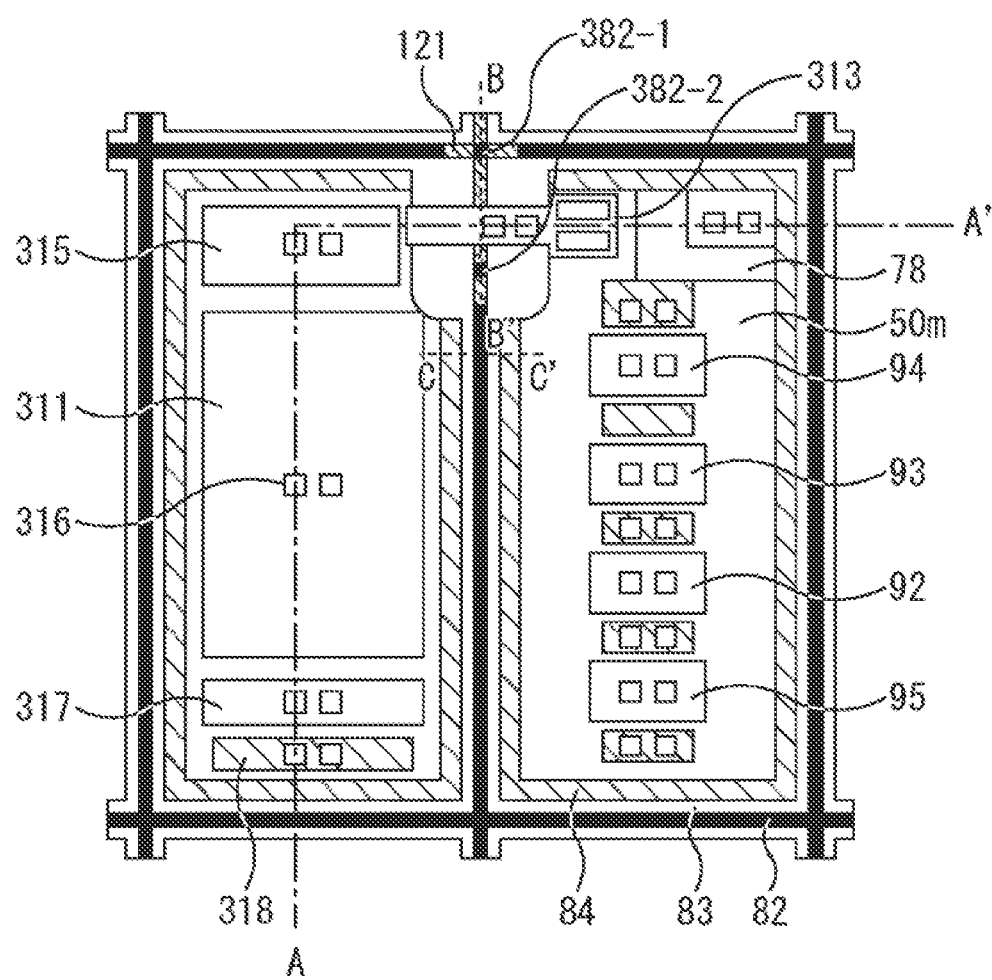
FIG. 35 is a plan view of a configuration of a pixel of a twelfth embodiment.

FIG. 35 is a vertical cross-sectional view of a pixel 50m in a twelfth embodiment of the pixel 50 to which the present technology is applied.

The pixel 50m in the twelfth embodiment has a similar configuration to the pixel 50k in the eleventh embodiment, except that an opening portion of a through DTI 82 is formed wide, a P-type solid phase diffusion layer 83 that covers such a wide opening portion is formed, and a through DTI for forming such a large P-type solid phase diffusion layer 83 is added.

Referring to the pixel 50m illustrated in FIG. 35, a through DTI 382-1 and a through DTI 382-2 are formed in an opening portion of a through DTI 82. The through DTI 382-1 and the through DTI 382-2 are rectangular through DTIs. Note that, here, the rectangular through DTIs 382 are illustrated and the description will be continued. However, the shape of the through DT 3821 may be a shape other than the rectangular, such as a circular shape, for example.

A configuration in which a non-through DTI 121 may be formed between the through DTI 382-1 and the through DTI 382-2 or in a portion in contact with the through DTI 382-1 and the through DTI 382-2, as in the second embodiment, or a configuration in which the non-through DTI 121 is not formed, as in the first embodiment, may be adopted.

By performing solid phase diffusion at the through DTI 382, the P-type solid phase diffusion layer 83 at the opening portion can be formed large, as illustrated in FIG. 35. This will be described with reference to FIGS. 36 and 37.

Figure 36:
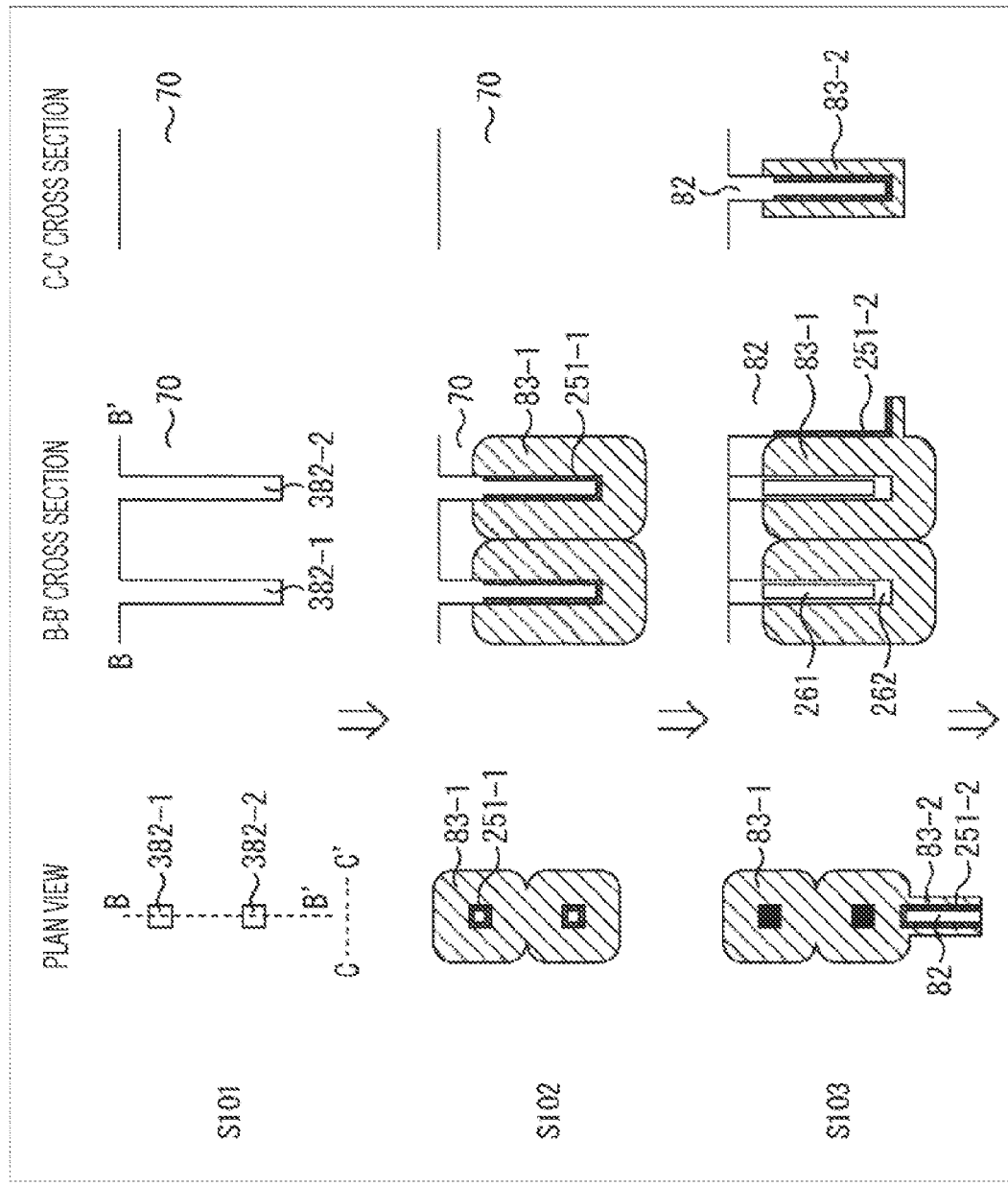
FIG. 36 is a diagram for describing formation of a P-type solid phase diffusion layer.
Figure 37:
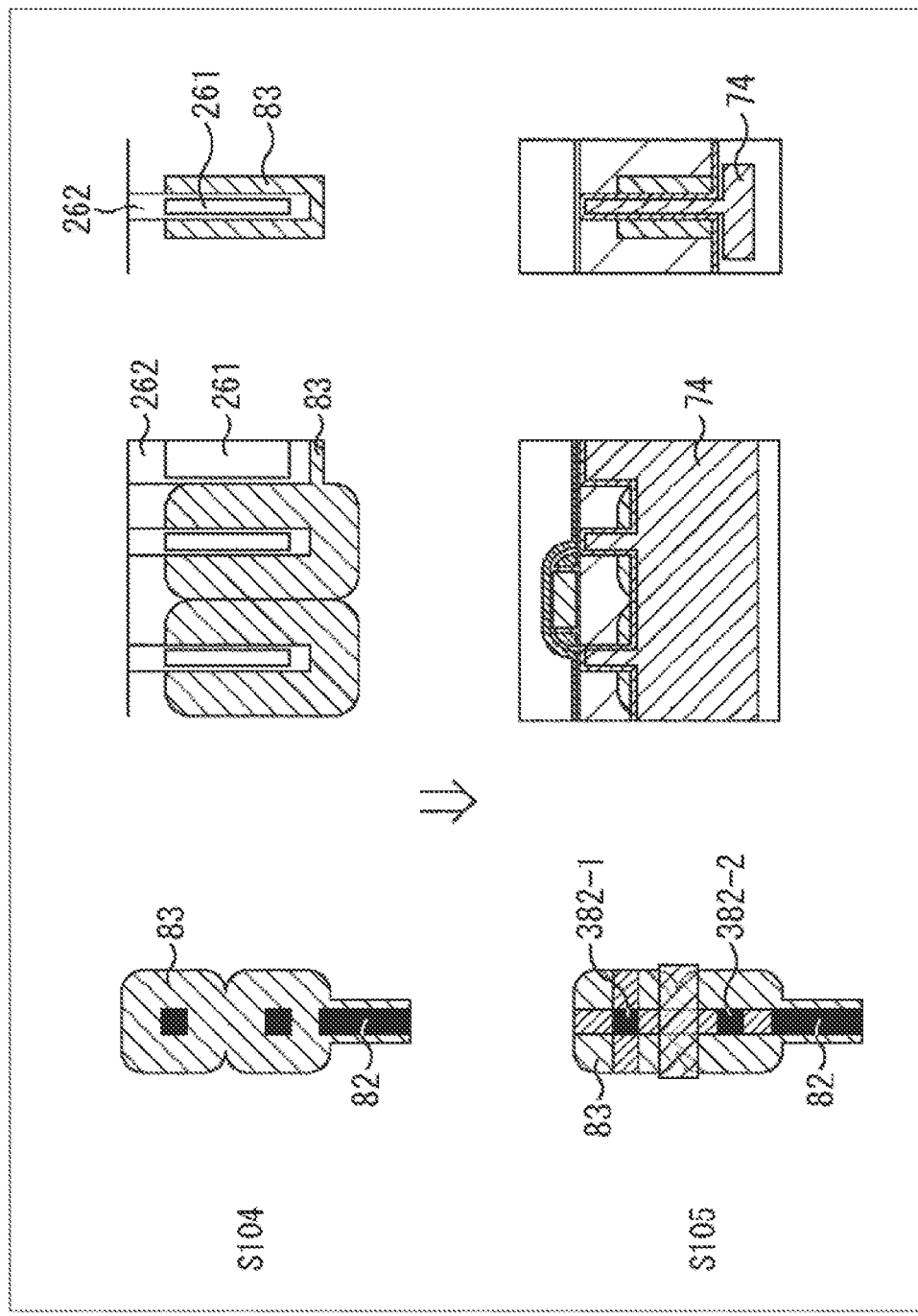
FIG. 37 is a diagram for describing formation of the P-type solid phase diffusion layer.

FIGS. 36 and 37 illustrate plan views of the opening portion in respective steps, cross-sectional views in line segment B-B', and cross-sectional views in line segment C-C'. The step of manufacturing the P-type solid phase diffusion layer 83 near the opening portion of the through DTI 382 is basically similarly performed to the step of forming the P-type solid phase diffusion layer 83 described with reference to FIG. 11.

In step S101, a trench 382-1 and a trench 382-2 are formed at positions where the through DTI 382-1 and the through DTI 382-2 are formed by etching the Si substrate 70.

In step S102, a silicon oxide film (BSG) 251-1 containing boron (B) is deposited on side walls in the trench 382-1 and the trench 382-2, using an atomic layer deposition (ALD) method. Since boron (B) is used in the processing in step S102, the BSG film 251-1 is formed as a P-type film.

After the BSG film 251-1 is formed, heat diffusion processing is executed, so that, boron (B) is solid-phase diffused from the BSG film 251-1 to the Si substrate 70 in a region where the BSG film 251-1 is in contact with the Si substrate 70. As a result, as illustrated in step S102 in FIG. 36, a P-type impurity region is formed. This P-type impurity region is a region to be the P-type solid phase diffusion layer 83 (in the step S102, a portion of a P-type solid phase diffusion layer 83-1).

Through the steps so far, the P-type solid phase diffusion layer 83 is formed in a region surrounding the trenches corresponding to the through DTI 381-1 and the through DTI 382-2.

After the heat diffusion processing is completed, the BSG film 251-1 is removed. The removal of the BSG film 251-1 can be performed by, for example, wet etching using hydrofluoric acid.

After the removal of the BSG film 251-1, in step S103, a polysilicon 261 and a silicon oxide film 262 are embedded in the trench 382. Note that the trench 382 may be filled with a metal such as tungsten, for example, in order to provide light shielding performance.

Furthermore, in step S103, a trench 82 corresponding to the through DTI 82 is formed. In step S103, the trench 82 is formed at a position where the through DTI 82 is formed by etching the Si substrate 70.

In step S103, processing similar to step S102 is executed, so that the BSG 251-2 is deposited on the side wall in the trench 82, and heat diffusion processing is executed, so that a P-type impurity region is formed in the region where the BSG film 251-2 and the Si substrate 70 are in contact with each other. This P-type impurity region is a region to be the P-type solid phase diffusion layer 83 (in the step S103, a portion of a P-type solid phase diffusion layer 83-2).

In step S103, the P-type solid phase diffusion layer 83 is formed in a region surrounding the trench corresponding to the through DTI 82.

Note that, in a case of forming the trench 82 (through DTI 82) in a state of being in contact with the through DTI 382-1 or the through DTI 382-2, silicon of the Si substrate 70 may remain between the trench 82 (through DTI 82) and the through DTI 382-1 or the through DTI 382-2 in a poor controllability state. Therefore, here, the description has been made taking the case where the trench 82 (through DTI 82) is isolated from the through DTI 382-1 or the through DTI 382-2, and the non-through DTI 121 is provided, as an example.

Note that, in the configuration of the pixel 50*m* illustrated in FIG. 35, a configuration in which the non-through DTI 121 is not provided between the pixels 50*m*, and the pixels 50*m* are surrounded by the through DTI 82 may be adopted, as in the pixel 50*k* illustrated in FIG. 33, As described above, formation of the P-type solid phase diffusion layer 83 at the opening portion of the through DTI 82 and formation of the P-type solid phase diffusion layer 83 in the portion other than the opening portion of the through DTI 82 are performed by separate steps, so that the P-type solid phase diffusion layer 83 is formed.

After the removal of the BSG film 251-2, in step S104, the polysilicon 261 and the silicon oxide film 262 are embedded in the trench 82. Note that the trench 82 may be filled with a metal such as tungsten, for example, in order to provide light shielding performance.

In step S105, unnecessary polysilicon deposited on the upper surface of the wafer is removed, and the pixel transistors, wiring, and the like are formed. Furthermore, the Si substrate 70 is thinned from the back side, and a light shielding film 74 and the like are formed after the thinning, so that the pixel 50*m* is manufactured.

As described above, in the pixel 50*m* according to the twelfth embodiment, even in a case where the opening portion of the through DTI 82 is formed long, the opening portion can be surrounded by the P-type solid phase diffusion layer 83, and the shape in which the concentration of the P-type layer can be easily secured can be adopted. Since the opening portion of the through DTI 82 can be made long, the degree of freedom of element arrangement can be increased.

Figure 38:
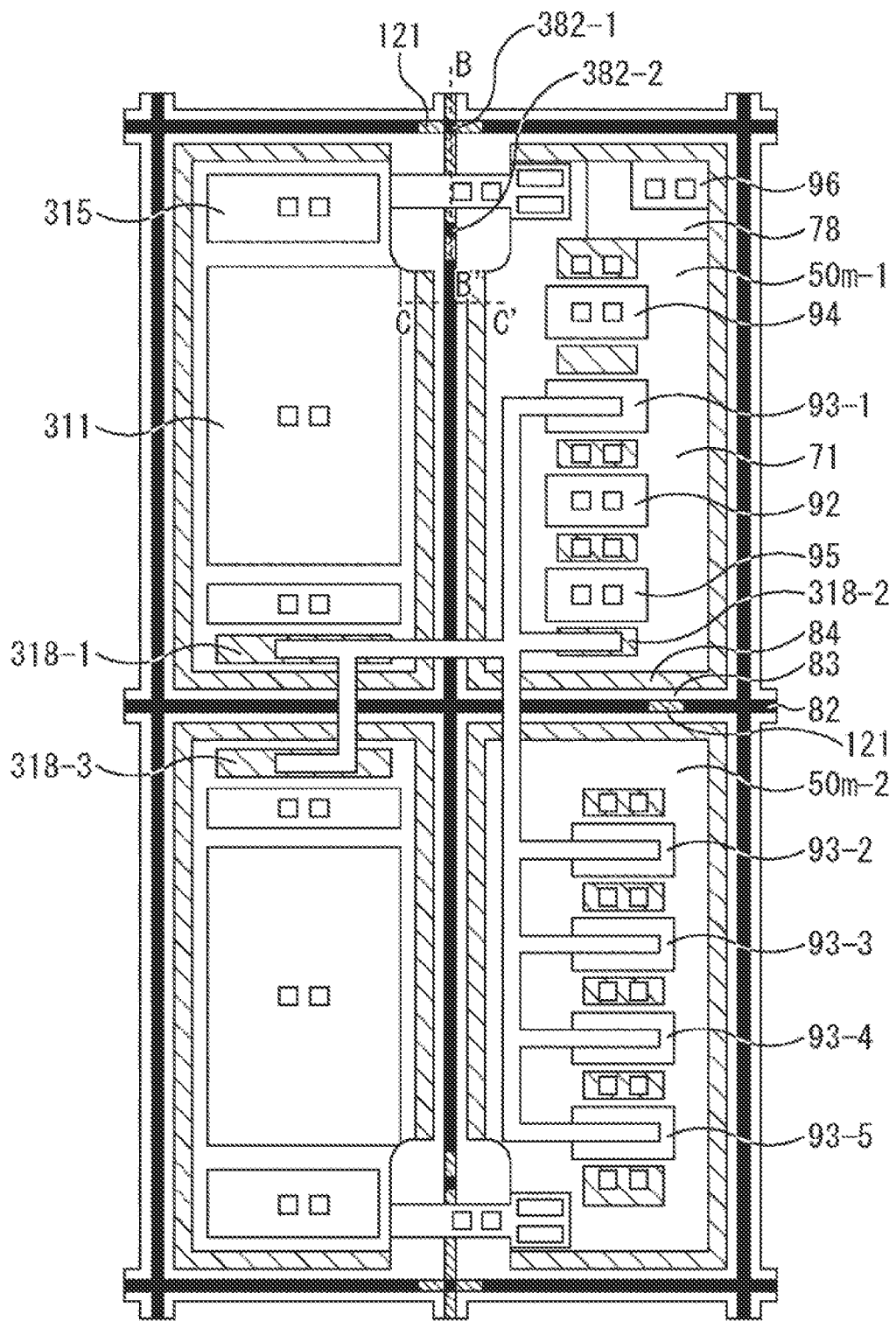
FIG. 38 is a diagram for describing sharing of transistors.

A two-pixel sharing configuration in which the pixels 50*m* according to the twelfth embodiment are vertically arranged, and vertically arranged two pixels 50*m* share transistors can be adopted. FIG. 38 is a diagram illustrating a configuration example of the pixels 50*m* having the two-pixel sharing configuration.

A reset transistor 92, a selection transistor 94, and a conversion efficiency switching transistor 95 are arranged on a PD 71 side of a pixel 50*m*-1 illustrated in FIG. 38, and these transistors are shared with a pixel 50*m*-2.

Furthermore, an amplification transistor 93-1 is arranged in the pixel 50*m*-1, and the amplification transistor 93-1 is connected to amplification transistors 93-2 to 93-5 arranged in the pixel 50-2 by wiring to function as one amplification transistor 93. Since the amplification transistor 93 can be formed large, a gate area becomes large, and random noise can be reduced.

Furthermore, an FD diffusion layer 318-1 and an FD diffusion layer 318-2 are arranged in the pixel 50*m*-1, and an FD diffusion layer 318-3 is arranged in the pixel 50*m*-2. These FD diffusion layers 318-1 to 318-3 are also connected by wiring to function as one FD diffusion layer 318 (FD 91).

Furthermore, a GND contact region 96 is arranged in the pixel 50*m*-1 but is not arranged in the pixel 50*m*-2. Furthermore, an opening portion is formed in a part of the through DTI 82 formed between the pixel 50*m*-1 and the pixel 50*m*-2, and the non-through DTI 121 is formed in the opening portion. By forming the opening portion of the through DTI 82 in this manner, the pixel 50*m*-1 and the pixel 50*m*-2 can be brought into an electrically conductive state, as in the above-described embodiments.

Therefore, the pixel 50*m*-1 and the pixel 50*m*-2 share the GND contact region 96, and a Pwell potential of the pixel 50*m*-2 can be fixed by the GND contact region 96 in the pixel 50*m*-2.

Note that, here, the description has been made taking the case where the two pixels 50*m*-1 and 50*m*-2 are in the electrically conductive state as an example. However, two or more pixels may be made in an electrically conductive state, and the GND contact region 96 can be formed in one of the plurality of pixels.

Note that, in the configuration example illustrated in FIG. 38, the configuration in which the non-through DTI 121 is formed between the two pixels 50*m*-1 and 50*m*-2, and the pixels 50*m*-1 and 50*m*-2 are electrically connected has been described. However, a configuration in which the non-through DTI 121 is not formed can be adopted.

For example, in the configuration illustrated in FIG. 38, for example, consider the pixel 50*m*-1 and a pixel 50*m*-0 (not illustrated) located above the pixel 50*m*-1. In the pixel 50*m*-1, an opening portion is formed in a central portion of information in FIG. 38, and the non-through DTI 121 is formed.

At this opening portion, the pixel 50*m*-1 and the pixel 50*m*-0 can be brought into an electrically conductive state. In the case of the configuration in which the pixels are electrically conductive at the opening portion, a configuration in which the non-through DTI 121 formed between the two pixels 50*m*-1 and 50*m*-2 is not formed can also be adopted.

Even the pixel sharing configuration can improve the saturation signal amount Qs and implement a global shutter in which the dark current and white point do not deteriorate.

According to the present technology, pixels can be isolated by isolating the pixels by the through DTI. Furthermore, a region where the through DTI is not provided is partially formed, so that a well between pixels can be shared, and a structure in which a GND contact is not arranged in each pixel can be adopted.

Furthermore, the region where the through DTI is not provided is partially formed, so that elements can be arranged in the region, and the degree of freedom regarding arrangement of the elements can be increased.

With the structure in which the GND contact is not arranged in each pixel, another element can be arranged in the region where the GND contact is arranged, and the degree of freedom regarding arrangement of elements can be increased.

Furthermore, according to the present technology, the region where no through DTI is formed is filled with the P-type doping layer (P-type solid phase diffusion layer) from the through DTI, so that adjacent pixels are isolated, and occurrence of an influence on the adjacent pixel, for example, an influence of color mixture and the like, can be prevented.

Moreover, according to the present technology, the non-through DTI is placed in the region, so that the pinning is secured by the P-type doping layer. Therefore, blooming and color mixture between adjacent pixels can be suppressed.

Note that the above-described embodiments can be individually implemented. However, a plurality of the embodiments can be implemented in combination.

Application Example to Endoscopic Surgery System

Furthermore, for example, the technology (present technology) according to the present disclosure may be applied to an endoscopic surgery system.

Figure 39:
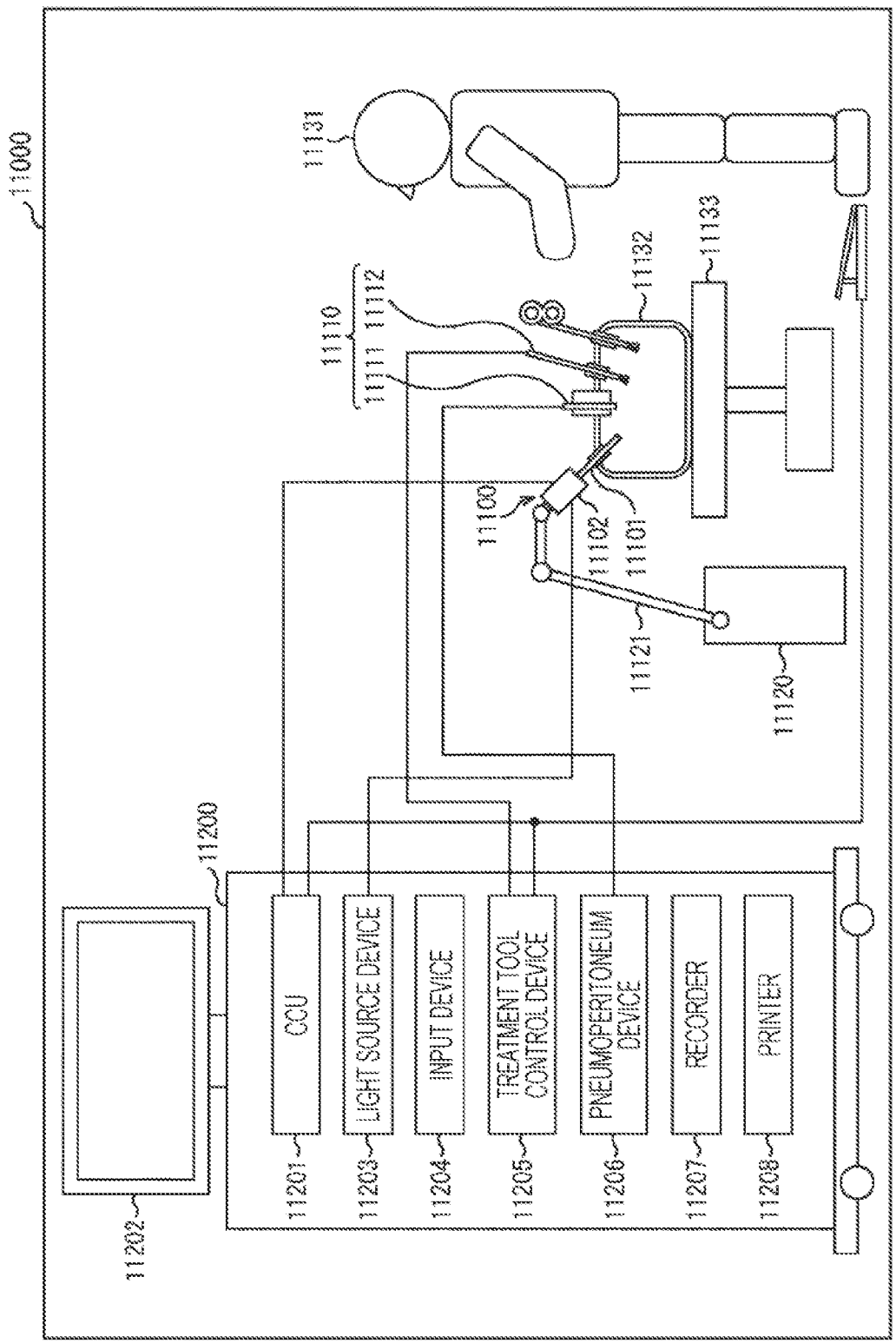
FIG. 39 is a diagram illustrating an example of a schematic configuration of an endoscopic surgery system.

FIG. 39 is a diagram illustrating an example of a schematic configuration of an endoscopic surgery system to which the technology according to the present disclosure (present technology) is applicable.

FIG. 39 illustrates a state in which an operator (surgeon) 11131 is performing surgery for a patient 11132 on a patient bed 11133, using the endoscopic surgery system 11000. As illustrated in FIG. 39, the endoscopic surgery system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 39 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel and an observation target in the body cavity of the patient 11132 is irradiated with the light through the object lens. Note that the endoscope 11100 may be a forward-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, in other words, an image signal corresponding to an observed image is generated. The image signal is transmitted to a camera control unit (CCU) 11201 as raw data.

The CCU 11201 includes a central processing unit (CPU), a graphics processing unit (GPU), and the like, and generally controls an operation of the endoscope 11100 and a display device 11202. Moreover, the CCU 11201 receives the image signal from the camera head 11102, and applies various types of image processing for displaying an image based on the image signal, such as developing processing (demosaicing processing) or the like, to the image signal.

The display device 11202 displays the image based on the image signal to which the image processing has been applied by the CCU 11201, by control of the CCU 11201.

The light source device 11203 includes a light source such as a light emitting diode (LED) for example, and supplies irradiation light to the endoscope 11100 in capturing an operation portion or the like.

An input device 11204 is an input interface for the endoscopic surgery system 11000. A user can input various types of information and instructions to the endoscopic surgery system 11000 through the input device 11204. For example, the user inputs an instruction to change imaging conditions (a type of irradiation light, a magnification, a focal length, and the like) by the endoscope 11100, and the like.

A treatment tool control device 11205 controls drive of the energy treatment tool 11112, for cauterizing or incising a tissue, sealing a blood vessel, and the like. A pneumoperitoneum device 11206 sends a gas into the body cavity of the patient 11132 through the pneumoperitoneum tube 11111 to expand the body cavity for the purpose of securing a field of vision by the endoscope 11100 and a work space for the operator. A recorder 11207 is a device that can record various types of information regarding the surgery. A printer 11208 is a device that can print the various types of information regarding the surgery in various formats such as a text, an image, and a graph.

Note that the light source device 11203 that supplies the irradiation light in capturing the operation portion to the endoscope 11100 can be configured from a white light source configured from an LED, a laser light source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the drive of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, drive of the light source device 11203 may be controlled to change intensity of light to be output every predetermined time. The drive of the imaging element of the camera head 11102 is controlled in synchronization with change timing of the intensity of light and images are acquired in a time division manner, and the images are synthesized, so that a high-dynamic range image without clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (in other words, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to obtain fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image, for example, can be performed. The light source device 11203 can be configured to be able to supply narrow-band light and/or exciting light corresponding to such special light observation.

Figure 40:
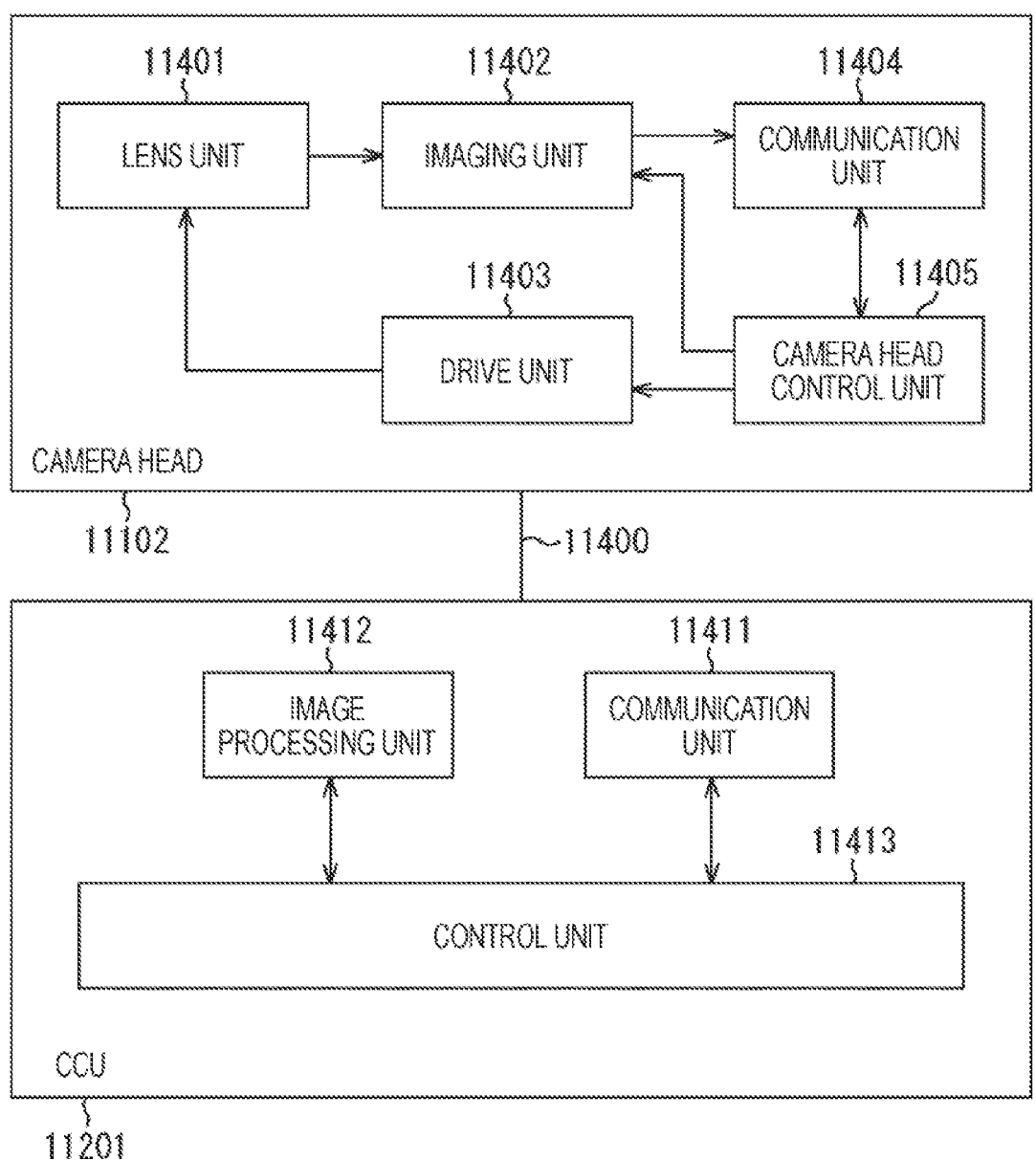
FIG. 40 is a block diagram illustrating an example of functional configurations of a camera head and a CCU.

FIG. 40 is a block diagram illustrating an example of functional configurations of the camera head 11102 and the CCU 11201 illustrated in FIG. 39.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured by a combination of a plurality of lenses including a zoom lens and a focus lens.

The imaging element that configures the imaging unit 11402 may be one imaging element (so-called single imaging element) or may be a plurality of imaging elements (so-called multiple imaging elements). In a case where the imaging unit 11402 is configured by multiple imaging elements, for example, a color image may be obtained by generating image signals respectively corresponding to RGB by the imaging elements and synthesizing the image signals. Alternatively, the imaging unit 11402 may be configured by a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured by the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured by an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured by a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling drive of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls drive of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling drive of the camera head 11102 to the camera head 11102. The image signal and the control signal can be transmitted through telecommunication, optical communication, or the like.

The image processing unit 11412 applies various types of image processing to the image signal as a raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling drive of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color, or the like of an object included in the captured image. The control unit 11413 may superimpose and display various types of surgery support information on the image of the operation portion using a result of the recognition, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

An example of an endoscopic surgery system to which the technology according to the present disclosure is applicable has been described. The technology according to the present disclosure is applicable to the camera head 11102 or the imaging unit 11402 of the camera head 11102, for example, of the above-described configurations. Specifically, for example, the imaging element 12 in FIG. 1 can be applied to the imaging unit 11402. By applying the technology according to the present disclosure to the imaging unit 11402, a more detailed and highly accurate operative image can be obtained, so that the operator can surely confirm the operative part.

Note that, here, the endoscopic surgery system has been described as an example. However, the technology according to the present disclosure may be applied to microsurgery or the like, for example.

Application Example to Moving Bodies

Furthermore, for example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 41:
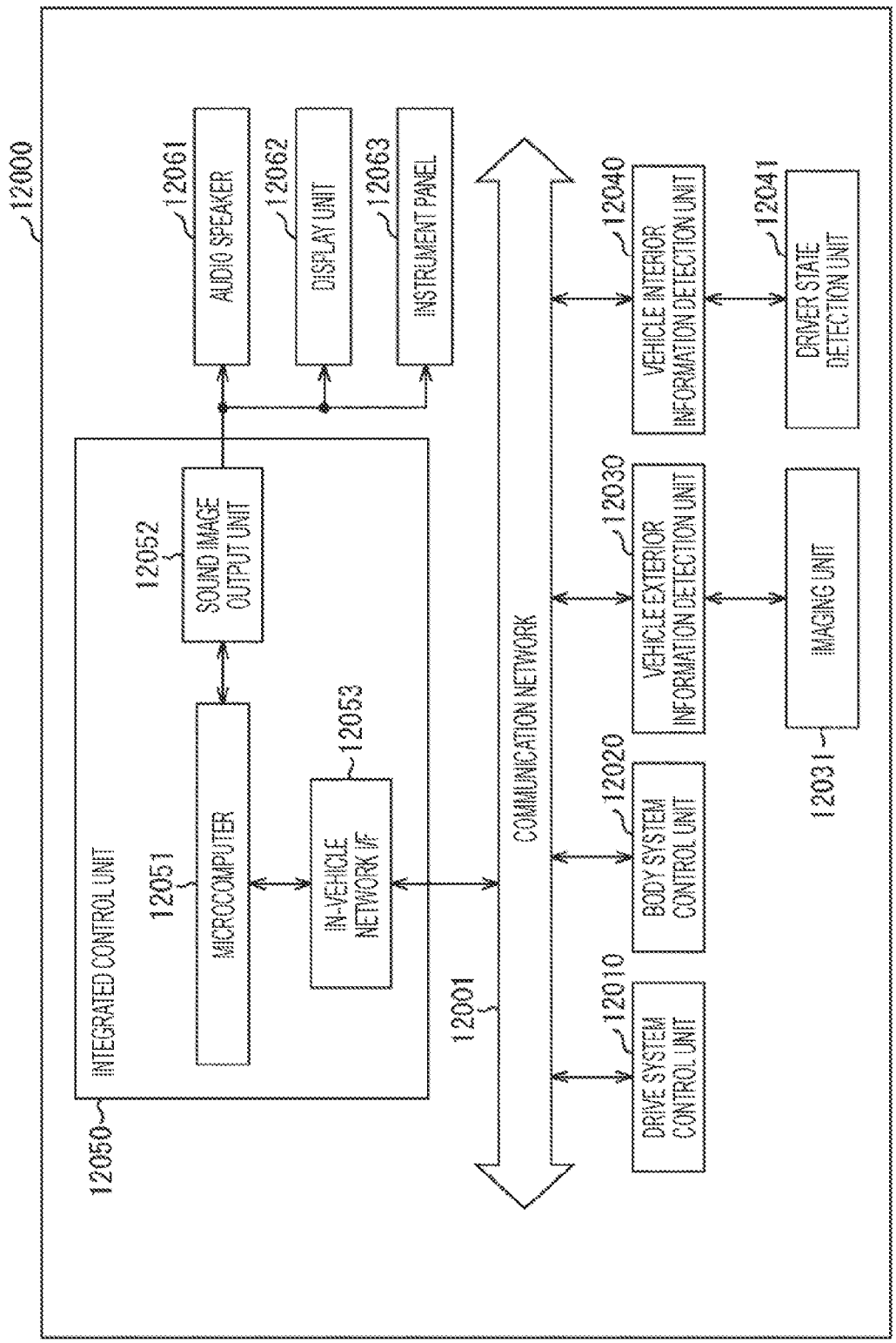
FIG. 41 is a block diagram illustrating an example of a schematic configuration of a vehicle control system.

FIG. 41 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 41, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to a light reception amount of the light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep at the wheel on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information around the vehicle acquired in the vehicle exterior information detection unit 12030 or the vehicle interior information detection unit 12040 to perform cooperative control for the purpose of automatic driving of autonomous travel without depending on an operation of the driver, and the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare by controlling the head lamps according to the position of a leading vehicle or an oncoming vehicle detected in the vehicle exterior information detection unit 12030, switching high beam light to low beam light, and the like.

The sound image output unit 12052 transmits an output signal of at least one of a sound or an image to an output device that can visually and aurally notify a passenger of the vehicle or an outside of the vehicle of information. In the example in FIG. 41, as the output device, an audio speaker 12061, a display unit 12062, and an instrument panel 12063 are exemplarily illustrated. The display unit 12062 may include, for example, at least one of an on-board display or a head-up display.

Figure 42:
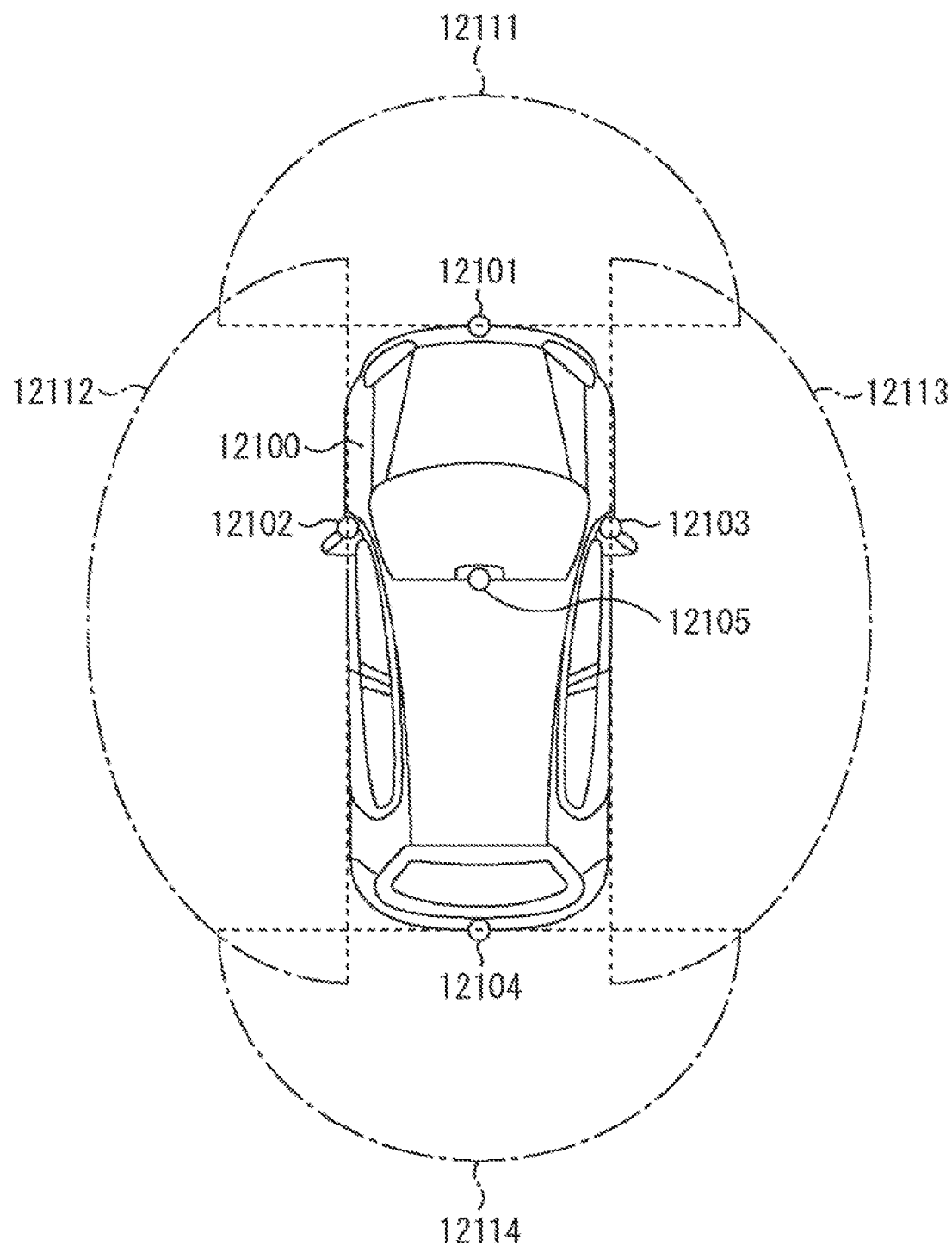
FIG. 42 is an explanatory diagram illustrating an example of installation positions of a vehicle exterior information detection unit and an imaging unit.

FIG. 42 is a diagram illustrating an example of an installation position of the imaging unit 12031.

In FIG. 42, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 42 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured in the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract a three-dimensional object closest to the vehicle 12100 on a traveling road and traveling at a predetermined speed (for example, 0 km/h or more) in approximately the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 extracts and classifies three-dimensional object data regarding three-dimensional objects into two-wheeled vehicles, ordinary cars, large vehicles, pedestrians, and other three-dimensional objects such as electric poles, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon representing the pedestrian or the like at a desired position.

An example of a vehicle control system to which the technology according to the present disclosure is applicable has been described. The technology according to the present disclosure is applicable to the imaging unit 12031, of the above-described configurations, for example. Specifically, for example, the imaging device 10 in FIG. 1 can be applied to the imaging unit 12031. By applying the technology according to the present disclosure to the imaging unit 12031, the information outside the vehicle can be obtained in a more detail and precise manner, and improvement of safety of automatic drive and the like can be implemented, for example.

In the present specification, the system refers to an entire device configured by a plurality of devices.

Note that the effects described in the present specification are merely examples and are not limited, and other effects may be exhibited.

Note that embodiments of the present technology are not limited to the above-described embodiments, and various modifications can be made without departing from the gist of the present technology.

Note that the present technology can also have the following configurations.

(1)

An imaging element including:

a photoelectric conversion unit configured to perform photoelectric conversion;

a through trench penetrating a semiconductor substrate in a depth direction and formed between pixels each including the photoelectric conversion unit; and a PN junction region configured by a P-type region and an N-type region in a side wall of the through trench, in which the through trench partially has an opening portion, and the P-type region is formed in the opening portion.

(2)

The imaging element according to (1), in which the opening portion is formed at at least one corner of four corners of the pixel.

(3)

The imaging element according to (1) or (2), in which a contact region for fixing a potential is formed in at least one pixel of a plurality of pixels that is electrically conductive by the opening portion.

(4)

The imaging element according to (3), in which
the electrically conductive pixels are pixels having a green color filter.

(5)

The imaging element according to any one of (1) to (4), in which
a light shielding film for covering the opening portion is formed on a light incident surface side of the opening portion.

(6)

The imaging element according to any one of (1) to (5), in which
a non-through trench is formed in the opening portion.

(7)

The imaging element according to any one of (1) to (6), in which
the P-type region of the opening portion is formed in a region sandwiched by non-through trenches.

(8)

The imaging element according to any one of (1) to (7), in which
the through trench is formed in an element isolation region.

(9)

The imaging element according to any one of (1) to (8), in which
the P-type region and an active region are formed in the opening portion.

(10)

The imaging element according to (9), in which
a contact region for fixing a potential is formed in the opening portion.

(11)

The imaging element according to (1), in which
the opening portion is formed in a side of the pixel.

(12)

The imaging element according to (11), in which
the through trench formed in the opening portion is formed in a T shape.

(13)

The imaging element according to (11) or (12), in which
the P-type region formed in the opening portion is formed larger than the P-type region formed in a portion other than the opening portion.

(14)

The imaging element according to any one of (11) to (13), in which
a floating diffusion (FD) region is formed in the opening portion.

(15)

An imaging element including:
a photoelectric conversion unit configured to perform photoelectric conversion;
a holding unit configured to hold a charge transferred from the photoelectric conversion unit;
a through trench penetrating a semiconductor substrate in a depth direction and formed between the photoelectric conversion unit and the holding unit; and
a PN junction region configured by a P-type region and an N-type region in a side wall of the through trench, in which
the through trench partially has an opening portion, and a readout gate for reading the charge from the photoelectric conversion unit is formed in the opening portion.

(16)

The imaging element according to (15), in which
the readout gate is formed in a vertical direction and a horizontal direction with respect to the photoelectric conversion unit.

(17)

The imaging element according to (15) or (16), in which
the P-type region is formed in the opening portion.

(18)

The imaging element according to any one of (15) to (17), in which
a through trench is also formed in the opening portion.

(19)

The imaging element according to any one of (15) to (18), in which
the P-type region formed in the opening portion is formed larger than the P-type region formed in a portion other than the opening portion.

(20)

The imaging element according to any one of (15) to (19), in which
a contact region for fixing a potential is formed in at least one pixel of a plurality of pixels that is electrically conductive by the opening portion.

REFERENCE SIGNS LIST

10 Imaging device
11 Lens group
12 Imaging element
13 DSP circuit
14 Frame memory
15 Display unit
16 Recording unit
17 Operation system
18 Power supply system
19 Bus line
20 CPU
31 Pixel
33 Vertical signal line
41 Pixel array unit
42 Vertical drive unit
43 Column processing unit
44 Horizontal drive unit
45 System control unit
46 Pixel drive line
47 Vertical signal line
48 Signal processing unit
49 Data storage unit
50 Pixel
70 Si substrate
72 P-type region
73 Flattened film
74 Light shielding film
74' Light shielding film
75 Back surface Si interface
77 Active region
79 Wiring layer
81 Vertical transistor trench
82 Through DTI
83 P-type solid phase diffusion layer
84 N-type solid phase diffusion layer
85 Side wall film
86 Filler
90 Transfer transistor
91 FD diffusion layer
92 Reset transistor 93 Amplification transistor
94 Selection transistor
95 Conversion efficiency switching transistor
96 GND contact region
121 Non-through DTI
311 Memory
313 Readout gate
314 Vertical transistor trench
315 Transfer gate
316 Write gate
318 FD diffusion layer
382 Trench

What is claimed is:

1. A light detecting device, comprising:
a semiconductor substrate including a plurality of pixels;
a pixel sharing unit including:
  first to fourth pixels of the plurality of pixels;
  a floating diffusion (FD) layer shared by the first to fourth pixels; and
  a single ground (GND) contact region located in the fourth pixel and shared by the first to fourth pixels, wherein the first, second, and third pixels do not include a GND contact region located therein; and
a through deep trench isolation (DTI) surrounding the pixel sharing unit in a plan view,
wherein the first pixel includes a first transistor and a first transfer transistor,
wherein the second pixel includes a second transistor and a second transfer transistor,
wherein the third pixel includes a third transistor and a third transfer transistor,
wherein the fourth pixel includes a fourth transfer transistor, and
wherein the through DTI penetrates the semiconductor substrate.

2. A light detecting device, comprising:
a semiconductor substrate including a plurality of pixels;
a pixel sharing unit including:
  first to fourth pixels of the plurality of pixels; and
  a floating diffusion (FD) layer shared by the first to fourth pixels
a through deep trench isolation (DTI) surrounding the pixel sharing unit in a plan view;
a ground (GND) contact region shared by the first to fourth pixels; and
a non-through DTI that overlaps with the FD layer in the plan view,
wherein, in a cross-sectional view, the FD layer is spaced apart from the non-through DTI by part of the semiconductor substrate,
wherein the first pixel includes a first transistor and a first transfer transistor,
wherein the second pixel includes a second transistor and a second transfer transistor,
wherein the third pixel includes a third transistor and a third transfer transistor,
wherein the fourth pixel includes a fourth transfer transistor, and
wherein the through DTI penetrates the semiconductor substrate.

3. The light detecting device according to claim 1, wherein the first to fourth pixels are arranged in a 2×2 four pixel sharing configuration in the plan view.

4. The light detecting device according to claim 1, wherein the first to fourth transfer transistor are arranged symmetrically in the plan view.

5. The light detecting device according to claim 1, wherein the first transistor is an amplification transistor.

6. The light detecting device according to claim 1, wherein the second transistor is a selection transistor.

7. The light detecting device according to claim 1, wherein the third transistor is a reset transistor.

8. The light detecting device according to claim 1, wherein the first to third transistors are shared by the first to fourth pixels.

9. The light detecting device according to claim 1, wherein the first to fourth transfer transistors are arranged in a portion of the semiconductor substrate where each of the first to fourth pixels meets.

10. The light detecting device according to claim 9, wherein the portion of the semiconductor substrate where each of the first to fourth pixels meets is formed as an opening portion of the through DTI.

11. An electronic apparatus, comprising:
a light detecting device configured to detect light; and
a signal processor configured to process a signal output from the light detecting device,
wherein the light detecting device includes:
  a semiconductor substrate including a plurality of pixels;
  a pixel sharing unit including:
    first to fourth pixels of the plurality of pixels; and
    a floating diffusion (FD) layer shared by the first to fourth pixels; and
    a single ground (GND) contact region located in the fourth pixel and shared by the first to fourth pixels, wherein the first, second, and third pixels do not include a GND contact region located therein; and
  a through deep trench isolation (DTI) surrounding the pixel sharing unit in a plan view,
wherein the first pixel includes a first transistor and a first transfer transistor,
wherein the second pixel includes a second transistor and a second transfer transistor,
wherein the third pixel includes a third transistor and a third transfer transistor,
wherein the fourth pixel includes a fourth transfer transistor, and
wherein the through DTI penetrates the semiconductor substrate.

12. The electronic apparatus according to claim 11, wherein the through DTI is not disposed above the FD layer in the plan view.

13. The electronic apparatus according to claim 11, wherein the first to fourth pixels are arranged in a 2×2 four pixel sharing configuration in the plan view.

14. The electronic apparatus according to claim 11, wherein the first to fourth transfer transistor are arranged symmetrically in the plan view.

15. The electronic apparatus according to claim 11, wherein the first transistor is an amplification transistor.

16. The electronic apparatus according to claim 11, wherein the second transistor is a selection transistor.

17. The electronic apparatus according to claim 11, wherein the third transistor is a reset transistor.

18. The electronic apparatus according to claim 11, wherein the first to third transistors are shared by the first to fourth pixels.

19. The electronic apparatus according to claim 11, wherein the first to fourth transfer transistors are arranged in a portion of the semiconductor substrate where each of the first to fourth pixels meets.

20. The electronic apparatus according to claim 19, wherein the portion of the semiconductor substrate where each of the first to fourth pixels meets is formed as an opening portion of the through DTI.

\* \* \* \* \*